(12) United States Patent
Uchida et al.

(10) Patent No.: US 8,129,758 B2
(45) Date of Patent: Mar. 6, 2012

(54) SEMICONDUCTOR ELEMENT AND MANUFACTURING METHOD THEREFOR

(75) Inventors: Masao Uchida, Hyogo (JP); Masashi Hayashi, Osaka (JP); Koichi Hashimoto, Osaka (JP)

(73) Assignee: Panasonic Corporation, Osaka (JP)

(*) Notice: Subject to any disclaimer, the term of this patent is extended or adjusted under 35 U.S.C. 154(b) by 241 days.

(21) Appl. No.: 12/676,212

(22) PCT Filed: Jul. 3, 2009

(86) PCT No.: PCT/JP2009/003111
§ 371 (c)(1),
(2), (4) Date: Mar. 3, 2010

(87) PCT Pub. No.: WO2010/004715
PCT Pub. Date: Jan. 14, 2010

(65) Prior Publication Data
US 2010/0295062 A1 Nov. 25, 2010

(30) Foreign Application Priority Data

Jul. 9, 2008 (JP) .................................. 2008-178810
Dec. 19, 2008 (JP) .................................. 2008-323682

(51) Int. Cl.
*H01L 27/10* (2006.01)
(52) U.S. Cl. .................... 257/206; 257/213; 257/618
(58) Field of Classification Search .................. 257/206, 257/213, 618
See application file for complete search history.

(56) References Cited

U.S. PATENT DOCUMENTS
6,573,534 B1  6/2003 Kumar et al.

2004/0119091 A1  6/2004 Suzuki et al.
2006/0226475 A1 10/2006 Yamamoto et al.
2008/0149972 A1  6/2008 Ishizaka et al.
2009/0101918 A1  4/2009 Uchida et al.

FOREIGN PATENT DOCUMENTS
EP    0 543 313 A1    5/1993
JP    05-206470       8/1993
(Continued)

OTHER PUBLICATIONS

International Search Report for corresponding application No. PCT/JP2009/003111 dated Oct. 6, 2009.

(Continued)

*Primary Examiner* — Samuel Gebremariam
(74) *Attorney, Agent, or Firm* — Renner, Otto, Boisselle & Sklar, LLP

(57) ABSTRACT

A semiconductor device includes: a semiconductor layer including silicon carbide, which has been formed on a substrate; a semiconductor region 15 of a first conductivity type defined on the surface of the semiconductor layer 10; a semiconductor region 14 of a second conductivity type, which is defined on the surface 10s of the semiconductor layer so as to surround the semiconductor region 15 of the first conductivity type; and a conductor 19 with a conductive surface 19s that contacts with the semiconductor regions 15 and 14 of the first and second conductivity types. On the surface 10s of the semiconductor layer, the semiconductor region 15 of the first conductivity type has at least one first strip portion 60 that runs along a first axis i. The width C1 of the semiconductor region 15 of the first conductivity type as measured along the first axis i is greater than the width A1 of the conductive surface 19s as measured along the first axis i. And the periphery of the conductive surface 19s crosses the at least one first strip portion 60, 61.

13 Claims, 32 Drawing Sheets

FOREIGN PATENT DOCUMENTS

| | | |
|---|---|---|
| JP | 05-335584 | 12/1993 |
| JP | 07-066392 | 3/1995 |
| JP | 11-266017 | 9/1999 |
| JP | 11-274484 | 10/1999 |
| JP | 11-330469 | 11/1999 |
| JP | 2000-106434 | 4/2000 |
| JP | 2002-343969 | 11/2002 |
| JP | 2004-104003 | 4/2004 |
| JP | 2004-111772 | 4/2004 |
| JP | 2004-288890 | 10/2004 |
| JP | 2006-294853 | 10/2006 |
| JP | 2008-288482 | 11/2008 |
| WO | 2007/135940 A1 | 11/2007 |

OTHER PUBLICATIONS

PCT/ISA/237 and partial English translation.
S.H. Ryu et al., "4H-SiC DMOSFETs for High Speed Switching Applications", Materials Science Forum, vols. 483-485 (2005), pp. 797-800.

(a)

(b)

(a)

(b)

(c)

(a)

(b)

(a)

Δx=0

(b)

Δx=0.45

(c)

Δx=0.7

(a)

Δx=0, z=0

(b)

Δx=0.45, z=2.1

(c)

Δx=0.7, z=2.1

(a)

(b)

(a)

(b)

(c)

(d)

(e)

(f)

(g)

(a)

(b)

(a)

(b)

(a)

Δx=0

(b)

Δx=0.2

(c)

Δx=0.5

(a)

(b)

(a)

(b)

(c)

(d)

(e)

(f)

(g)

(a)

(b)

(a)

(b)

(a)

(b)

(a)

(b)

(a)

(b)

(a)

(b)

(a)

(b)

SEMICONDUCTOR ELEMENT AND MANUFACTURING METHOD THEREFOR

TECHNICAL FIELD

The present invention relates to a semiconductor device and a method for fabricating the same. More particularly, the present invention relates to a power semiconductor device of silicon carbide, which can be used in applications that require a high breakdown voltage and a large amount of current.

BACKGROUND ART

Silicon carbide (SiC) is a high-hardness semiconductor material with a greater bandgap than silicon (Si), and has been used extensively in various types of semiconductor devices including power elements, hostile-environment elements, high temperature operating elements, and radio frequency elements. Among other things, the application of SiC to power elements such as switching elements and rectifiers has attracted a lot of attention. This is because a power element that uses SiC can significantly reduce the power loss compared to a Si power element.

Among various power elements that use SiC, a MOSFET is known as a typical switching element. Such a switching element can switch between ON state in which drain current of several amperes (A) or more flows and OFF state in which the drain current becomes zero by changing the voltages applied to its gate electrode. Also, in the OFF state, SiC will achieve as high a breakdown voltage as several hundred volt or more.

The structures of such a switching element that uses SiC are proposed in Patent Document No. 1 and Non-Patent Document No. 1, for example. Hereinafter, the structure of vertical MOSFETs proposed in those documents will be described with reference to the accompanying drawings.

FIG. 38 is a schematic cross-sectional view illustrating a unit cell 1000 of a vertical MOSFET that uses SiC. It should be noted that a vertical MOSFET typically has a plurality of unit cells. It should be noted that in FIG. 38, the sizes of the respective members are not to scale in the thickness direction. For example, the substrate 101 and the semiconductor layer 102 are reduced in the thickness direction using waves.

The unit cell 1000 of the vertical MOSFET includes a silicon carbide epitaxial layer 120 that has been formed on the principal surface of an n-type SiC substrate 101 with low resistivity, a channel layer 106 that has been formed on the silicon carbide epitaxial layer 120, a gate electrode 108 that is arranged over the channel layer 106 with a gate insulating film 107 interposed between them, a source electrode 109 that contacts with the surface 120s of the silicon carbide epitaxial layer, and drain electrode 110 arranged on the back surface of the SiC substrate 101.

The silicon carbide epitaxial layer 120 has a well region 103, of which the conductivity type (i.e., p-type in this example) is different from that of the SiC substrate 101, and a drift region 102, which is the rest of the silicon carbide epitaxial layer 120 other than the well region 103. More specifically, the drift region 102 is an n⁻-type silicon carbide layer including an n-type dopant, of which the concentration is lower than in the SiC substrate 101.

Inside the well region 103, defined are an n-type heavily doped source region 104 including an n-type dopant and a p⁺-type contact region 105 that includes a p-type dopant at a higher concentration than the well region 103. The well region 103, the source region 104 and the contact region 105 are defined by performing the process step of implanting dopants into the silicon carbide epitaxial layer 120 and a high-temperature heat treatment process step (i.e., activating annealing process step) that activates the dopants that have been introduced into the silicon carbide epitaxial layer 120.

The source region 104 and the drift region 102 are electrically connected together through the channel layer 106, which may be a 4H—SiC layer that has been formed on the silicon carbide epitaxial layer 102 by epitaxy process, for example. Also, the contact region 105 and the source region 104 make ohmic contact with the source electrode 109. Consequently, the well region 103 is electrically connected to the source electrode 109 via the contact region 105.

The source electrode 109 can be formed by depositing a conductive material such as Ni on the source region 104 and the contact region 105 of the silicon carbide epitaxial layer 120 and then annealing the material at a high temperature.

The gate insulating film 107 may be a thermal oxide film (i.e., $SiO_2$ film) that has been formed by heating and oxidizing the surface of the channel layer 106, for example. The gate electrode 108 may be made of electrically conductive polysilicon, for example.

The gate electrode 108 is covered with an interlevel dielectric film 111 with a hole 113. Through this hole 113, the source electrode 109 of each unit cell is connected in parallel to an upper interconnect electrode (e.g., an Al electrode) 112.

In a MOSFET including the unit cell 1000 with the structure shown in FIG. 38, the source electrode 109 should make ohmic contact with the source region 104, which is an n-type semiconductor region, and with the contact region 105, which is a p-type semiconductor region, as described above. The reason will be described below.

In this MOSFET, current can be produced in the channel layer 106 that is located under the gate electrode 108 by applying a voltage to the gate electrode 108. Thus, current originating from the drain electrode 110 (i.e., drain current) flows through the SiC substrate 101, the drift region 102, the channel layer 106 and the source region 104 into the source electrode 109 (in ON state).

In this case, if the contact resistance between the source region 104 and the source electrode 109 were too high, then the resistance in the ON state (i.e., ON-state resistance) would increase too much to make a sufficient amount of drain current flow. That is why the source region 104 and the source electrode 109 should have a sufficient contact area between them and should also make ohmic contact to have reduced contact resistance between them.

Such a MOSFET is often built in an electric circuit such as an inverter or a converter. An electric circuit with such a coil, however, will produce induced current during switching. For that reason, when the MOSFET is switched, that induced current may sometimes flow from the drain electrode 110 into the source electrode 110 by way of the contact region 105.

In that case, if the contact resistance between the source electrode 109 and the contact region 105 were high, a parasitic bipolar transistor, consisting of the source region 104, the well region 103 and the drift region 102, would be turned ON. Then, part of the induced current would flow instantaneously around the channel layer 106, thus possibly damaging the channel or gate portion of the MOSFET. That induced current could also delay switching of the MOSFET. For that reason, the source electrode 109 should have a sufficient area of contact with not only the source region 104 but also the contact region 105 and should make good ohmic contact with them.

To ensure a sufficient area of contact between the source electrode 109 and the source region 104 and between the source electrode 109 and the contact region 105, the source electrode 109, the source region 104 and the contact region 105 may be designed in the following manner.

Portion (a) of FIG. 39 is a schematic cross-sectional view illustrating the source electrode 109, the contact region 105 and the source region 104 of the unit cell 1000 shown in FIG. 38. Portion (b) of FIG. 39 is a plan view illustrating the surface 120s of the silicon carbide epitaxial layer, on which the surface 105s of the contact region 105, the surface 104s of the source region 104 and the lower surface (conductive surface) 109s of the source electrode 109 arranged on the surface 120s of the silicon carbide epitaxial layer are shown.

In the following description, the surface 105s of the contact region 105, the surface 104s of the source region 104 and the conductive surface 109s of the source electrode 109 will be simply referred to herein as "contact region's surface 105s", "source region's surface 104s" and "conductive surface 109s", respectively.

As shown in FIG. 18, on the surface 120s of the silicon carbide epitaxial layer, the contact region 105 is surrounded with the source region 104. The profiles of the source region's surface 104s and the contact region's surface 105s are both quadrangular. The conductive surface 109s of the source electrode 109 has a quadrangular shape, which is analogous in shape to, and bigger in size than, the contact region's surface 105s.

The conductive surface 109s is arranged so as to cover the contact region's surface 105s. That is why the center portion of the conductive surface 109s is in contact with the contact region's surface 105s and the peripheral portion thereof is in contact with the source region's surface 104s.

With such an arrangement, the conductive surface 109s and the source region 104 can have a sufficient area of contact between them. As a result, when the MOSFET is turned ON, electrons can flow from the conductive surface 109s of the source electrode 109 toward the entire surrounding surface 104s of the source region as indicated by the arrows 119. In addition, since the conductive surface 109s can also have a sufficient area of contact with the contact region 105, it is possible to prevent induced current from damaging the channel or gate portion.

In such a MOSFET, the source electrode 109 may be formed in the following manner.

First, a conductive material film of Ni, for example, is deposited on the silicon carbide epitaxial layer 120 in which the source region 104 and the contact region 105 have been defined. Next, the conductive material film is patterned by photolithographic process, thereby forming a conductive material layer.

In this process step, the alignment is done such that the lower surface of the conductive material layer to be the conductive surface 109s contacts with the source region's surface 104s and the contact region's surface 105s as already described with reference to portion (b) of FIG. 39.

Thereafter, a post-deposition annealing process is carried out normally at a high temperature of about 1,000° C., thereby obtaining a source electrode 109. According to this method, a reaction layer is formed in the interface between the conductive material layer and the source region 104 and between the conductive material layer and the contact region 105 as a result of the high-temperature annealing process. For that reason, the source electrode 109 thus obtained will have good ohmic property with respect to these regions 104 and 105.

As used herein, the "source electrode" may refer herein to either a conductive layer including the reaction layer that has been formed in that interface or only the reaction layer.

In the MOSFET shown in FIG. 38, the source electrode 109 is aligned with respect to the contact region 105 and the source region 104 in the silicon carbide epitaxial layer 102 by performing a photolithographic process as described above. Generally speaking, however, a size shift or a misalignment could occur in a photolithographic process.

Among these types of errors, the "size shift" refers to the deviation of the planar sizes of the source electrode 109 from its designed values and can be reduced by optimizing the sizes of a photomask for use in the photolithographic process or the exposure conditions thereof.

On the other hand, the "misalignment" refers to the deviation of the actual location of the source electrode 109 from the expected one due to the misalignment of the photomask with respect to the ideal location of a resist film. As long as a known exposure system is used, it is very difficult to avoid the misalignment perfectly. Specifically, a misalignment of about 1 to 2 µm is inevitable when a contact aligner is used and a misalignment of approximately 0.1 to 0.2 µm will be caused by the use of a stepper. To get the mask alignment done, an alignment key needs to be left on the upper surface of the semiconductor layer 120 or somewhere else. However, that alignment key could be deformed during a heat treatment or etching process while the device is being fabricated. In that case, the degree of misalignment could be significantly greater than the initially expected one. Specifically, even if a stepper is used, a misalignment of 0.5 µm or more could be caused.

If such a misalignment occurred in the photolithographic process to form the source electrode 109, then the conductive surface 109s of the source electrode 109 could not be arranged at the location shown in portion (b) of FIG. 39.

To overcome such a problem, Patent Document No. 2, which was filed by the applicant of the present application, proposed that such an increase in ON-state resistance due to the misalignment be reduced by controlling the shape of the surface of the conductor that contacts with the source and contact regions (i.e., the conductive surface) and the shapes of the source and contact regions at the surface of the semiconductor layer.

CITATION LIST

Patent Literature
Patent Document No. 1: Japanese Patent Application Laid-Open Publication No. 11-266017
Patent Document No. 2: Pamphlet of PCT International Application Publication No. 2007/135940
Non-Patent Literature
Non-Patent Document No. 1: S. H. Ryu et al., Materials Science Forum, Vols. 483-485 (2005), pp. 797-800

SUMMARY OF INVENTION

Technical Problem

The present inventors carried out researches on how the characteristics of a MOSFET varied with such a misalignment of the source electrode 109. The results are as follows.

Portions (a) and (b) of FIG. 40 are respectively a schematic cross-sectional view of the source electrode 109, contact region 105 and source region 104 and a plan view of the surface 120s of the silicon carbide epitaxial layer in a situation where a misalignment has occurred in the source electrode 109 of a MOSFET that was designed as shown in portions (a) and (b) of FIG. 39.

If the conductive surface 109s of the source electrode 109 has shifted to the right (in the x direction) by Δx to have one end thereof located over the contact region's surface 105s as shown in FIG. 40, then a portion of the source region's surface 104s that is located on the left-hand side of the contact region's surface 105s will no longer be in contact with the conductive surface 109s.

As a result, the source region's surface 104s comes to have a zone X in which electrons coming from the source electrode 109 barely flow as shown in portion (b) of FIG. 40. It should be noted that the "zone X in which electrons barely flow" means a zone in which electrons flow less smoothly than any other zone of the source region's surface 104s. That is to say, a smaller number of electrons may flow through that zone X than the rest of the source region's surface 104s.

Since the source region 104 has low electrical resistance, some of the electrons coming from the source electrode 109 will go around the source region 104 as indicated by the arrows 122 to reach the leftmost portion of the source region's surface 104s. However, electrons will barely flow around the center Xa of the leftmost portion of the source region's surface 104s.

Generally speaking, the length of a peripheral edge of the source region's surface 104s corresponds to the "gate width", which is one of the parameters that define the transistor characteristics of a MOSFET unit cell. Even if that length remains the same but if there is such a portion Xa where no electrons flow at one end of the source region's surface 104s, then the outcome will be the same as a situation where the effective gate width has decreased. Consequently, the ON-state current decreases.

In this case, the area of the zone X at the source region's surface 104s in which no electrons flow depends on the length Z of a portion of the conductive surface 109s that crosses the $p^+$-type contact region 105s. That is to say, the greater the length Z, the larger area of the zone X at the source region's surface 104s in which electrons barely flow. As a result, no electrons will flow through a part of the end portion of the source region's surface 104s (i.e., Xa>0), thus causing a lot of influence on the effective gate width.

In this example, the conductive surface 109s is supposed to shift in the x direction. However, the same statement applies to even a situation where the conductive surface 109s shifts in the −x direction or in the y or −y direction that intersects with the x direction at right angles.

As described above, in the MOSFET shown in FIG. 38, the greater the degree of misalignment, the higher the ON-state resistance and the lower the performance of the MOSFET. On top of that, a variation in ON-state resistance will be caused between MOSFET products due to the misalignment, and a high yield will not be achieved.

In order to overcome such a problem, the applicant of the present application proposed that such an increase in ON-state resistance due to the misalignment be reduced by controlling the shape of the surface of the conductor that contacts with the source and contact regions (i.e., the conductive surface) and the shapes of the source and contact regions at the surface of the semiconductor layer.

FIG. 41 illustrates the arrangement of the semiconductor device proposed in Patent Document No. 2. And FIG. 42 illustrates the arrangement of a semiconductor device in which misalignment has occurred. Portions (a) of FIGS. 41 and 42 are schematic cross-sectional views illustrating the source electrode 109, the contact region 105 and the source region 104. On the other hand, portions (b) of FIGS. 41 and 42 are plan views illustrating the surface 120s of the silicon carbide epitaxial layer.

As shown in portion (b) of FIG. 41, at the surface 120s of the silicon carbide epitaxial layer, a $p^+$-type contact region's surface 105s is located inside a square n-type source region's surface 104s that has sides extending in x and y directions. The $p^+$-type contact region's surface 105s has a square (or diamond) shape, which has sides that define an angle of 45 degrees, for example, with respect to the x or y direction. In such an arrangement, even if some degree of misalignment (Δx) has been caused as shown in portions (a) and (b) of FIG. 42, the variation in the length Z of a portion of the periphery of the conductive surface 109s that crosses the $p^+$-type contact region 105s can be reduced compared to the conventional arrangement shown in portion (b) of FIG. 40, for example. As a result, the increase in the area of the zone Y at the source region's surface 104s in which electrons barely flow can be minimized. Consequently, that zone Y in which electrons flow just barely will hardly reach the leftmost end portion of the source region's surface 104s and electrons will flow through the entire leftmost end portion of the source region's surface 104s. That is to say, since the gate width does not decrease substantially, the deterioration of the device performance (i.e., MOSFET characteristic) that has already been described with reference to FIG. 40(b) can be avoided.

In order to overcome the problems described above, the present invention has an object of avoiding, by a different means from that of Patent Document No. 2, such deterioration in the performance of a semiconductor device, including n- and p-type semiconductor regions on the surface of a semiconductor layer and a conductor with a conductive surface that contacts with those semiconductor regions, even in a situation where the conductive surface is misaligned with the semiconductor regions.

Solution to Problem

A semiconductor device according to the present invention includes: a substrate; a semiconductor layer, which has been formed on the substrate; a semiconductor region of a first conductivity type, which is defined on the surface of the semiconductor layer; a semiconductor region of a second conductivity type, which is defined on the surface of the semiconductor layer so as to surround the semiconductor region of the first conductivity type; and a conductor with a conductive surface that contacts with the semiconductor regions of the first and second conductivity types. The semiconductor layer includes silicon carbide. On the surface of the semiconductor layer, the semiconductor region of the first conductivity type has at least one first-directed strip portion that runs along a first axis. The width of the semiconductor region of the first conductivity type as measured along the first axis is greater than that of the conductive surface as measured along the first axis. And the periphery of the conductive surface crosses the at least one first-directed strip portion.

In one preferred embodiment, on the surface of the semiconductor layer, the semiconductor region of the first conductivity type further includes at least one second-directed strip portion that runs along a second axis that is not parallel to the first axis. The width of the semiconductor region of the first conductivity type as measured along the second axis is greater than that of the conductive surface as measured along the second axis. And the periphery of the conductive surface crosses the at least one second-directed strip portion.

In this particular preferred embodiment, on the surface of the semiconductor layer, the at least one first-directed strip portion of the semiconductor region of the first conductivity type includes a pair of strip portions running in mutually opposite directions along the first axis and the at least one second-directed strip portion thereof includes another pair of strip portions running in mutually opposite directions along the second axis.

The conductive surface may have a polygonal shape, of which some sides are parallel to the first axis and other sides are parallel to the second axis. The vertices of the polygon may be rounded to a certain degree as long as those vertices can still be regarded substantially as such.

The conductive surface may have a polygonal shape, of which one diagonal is parallel to the first axis and another diagonal is parallel to the second axis.

In still another preferred embodiment, on the surface of the semiconductor layer, the semiconductor region of the second conductivity type has a polygonal shape and each of the first and second axes is parallel to at least one of the lines that connect together the barycenter and at least one vertex of the polygonal semiconductor region of the second conductivity type.

The polygonal shape may be a square shape.

On the surface of the semiconductor layer, the semiconductor region of the first conductivity type may further have a base portion that is connected to the at least one first-directed and the at least one second-directed strip portions.

On the surface of the semiconductor layer, the semiconductor region of the first conductivity type preferably has a shape that is symmetrical with respect to a point.

The width of the at least one first-directed strip portion as measured perpendicularly to the first axis is preferably substantially constant along the first axis.

In a specific preferred embodiment, the at least one first-directed strip portion has a length of 1 µm or more as measured along the first axis.

The substrate may be an off-cut substrate and the first axis may be parallel to the off-cut direction of the substrate.

The semiconductor device may further include: a well region of the first conductivity type, which is electrically connected to the semiconductor region of the first conductivity type and which surrounds the semiconductor region of the second conductivity type on the surface of the semiconductor layer; a gate insulating film, which partially covers the semiconductor layer; a gate electrode, which is insulated from the semiconductor layer by the gate insulating film; and a drain electrode, which has been formed on the back surface of the substrate.

A method for fabricating a semiconductor device according to the present invention includes the steps of: (a) introducing a dopant of a first conductivity type into a semiconductor layer including silicon carbide using a first implant mask, thereby defining a semiconductor region of the first conductivity type on the surface of the semiconductor layer; (b) introducing a dopant of a second conductivity type into the semiconductor layer using a second implant mask, thereby defining a semiconductor region of the second conductivity type on the surface of the semiconductor layer; and (c) providing a conductor that has a conductive surface. In the steps (a) and (b), the semiconductor region of the second conductivity type is defined so as to surround the semiconductor region of the first conductivity type on the surface of the semiconductor layer. The step (c) includes the step of aligning the conductive surface with respect to the semiconductor region of the first conductivity type so that the conductive surface contacts with the semiconductor regions of the first and second conductivity types. On the surface of the semiconductor layer, the semiconductor region of the first conductivity type has at least one first-directed strip portion that runs along a first axis. The width of the semiconductor region of the first conductivity type as measured along the first axis is greater than that of the conductive surface as measured along the first axis. And the periphery of the conductive surface crosses the first-directed strip portion.

Advantageous Effects of Invention

In a semiconductor device according to the present invention, including n- and p-type semiconductor regions on the surface of a semiconductor layer and a conductor with a conductive surface that contacts with those semiconductor regions, even if the conductive surface is misaligned with the semiconductor regions, the deterioration in performance due to the misalignment can be minimized. As a result, the present invention always ensures device performance at an acceptable level.

Particularly when the present invention is applied to a vertical MOSFET, even if a source electrode being formed on a semiconductor layer by photolithographic process is misaligned with a contact region that has been defined on the surface of the semiconductor layer, a sufficient area of contact can still be ensured between the source electrode and the contact region and their contact resistance can be kept low. Consequently, switching delay that could be caused by the operation of a parasitic bipolar transistor inside a vertical MOSFET can be minimized. On top of that, even if the degree of misalignment has increased, the variation in the length Z of the periphery of the conductive surface that crosses the contact region can be reduced to a low level. As a result, a sufficient effective gate width, and therefore, a sufficient amount of ON-state current, can be ensured just as designed. In addition, the variation in ON-state resistance between products can also be reduced so much as to increase the yield significantly.

Furthermore, according to the present invention, such a semiconductor device can be fabricated without complicating the manufacturing process.

Figure 3:
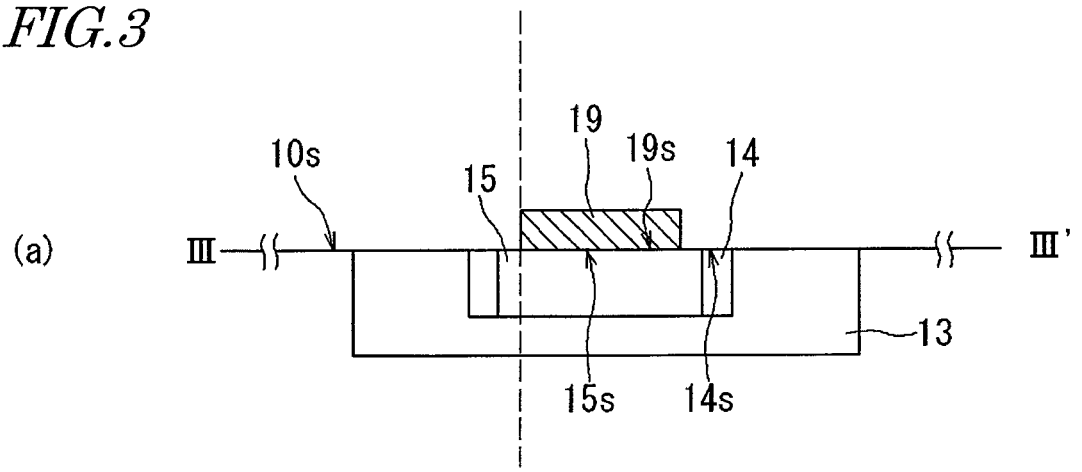
Figure 3:
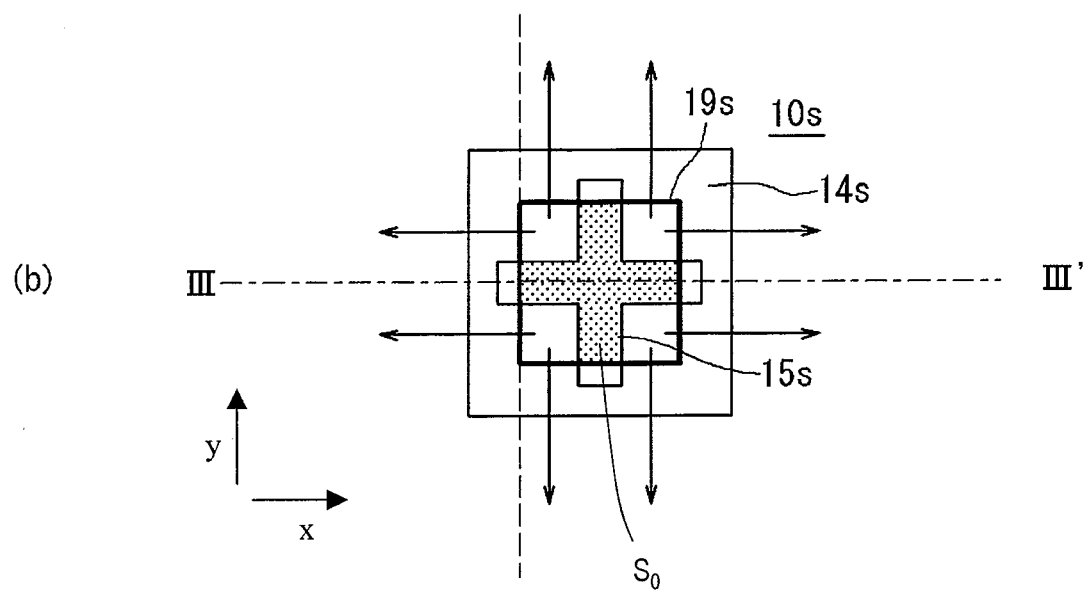

Portions (a) and (b) of FIG. 3 illustrate an ideal situation where the conductive surface 19s of the source electrode 19 has been arranged just as designed over the p$^+$-type contact region's surface 15s and the source region's surface 14s, wherein portion (a) of FIG. 3 is schematic cross-sectional view illustrating a portion of the unit cell 100 and portion (b) of FIG. 3 is a plan view illustrating the surface 10s of the semiconductor layer.

Figure 4:
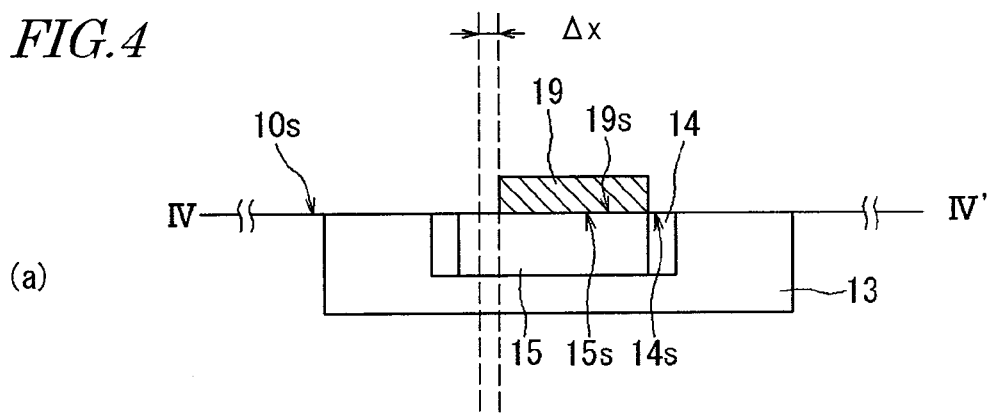
Figure 4:
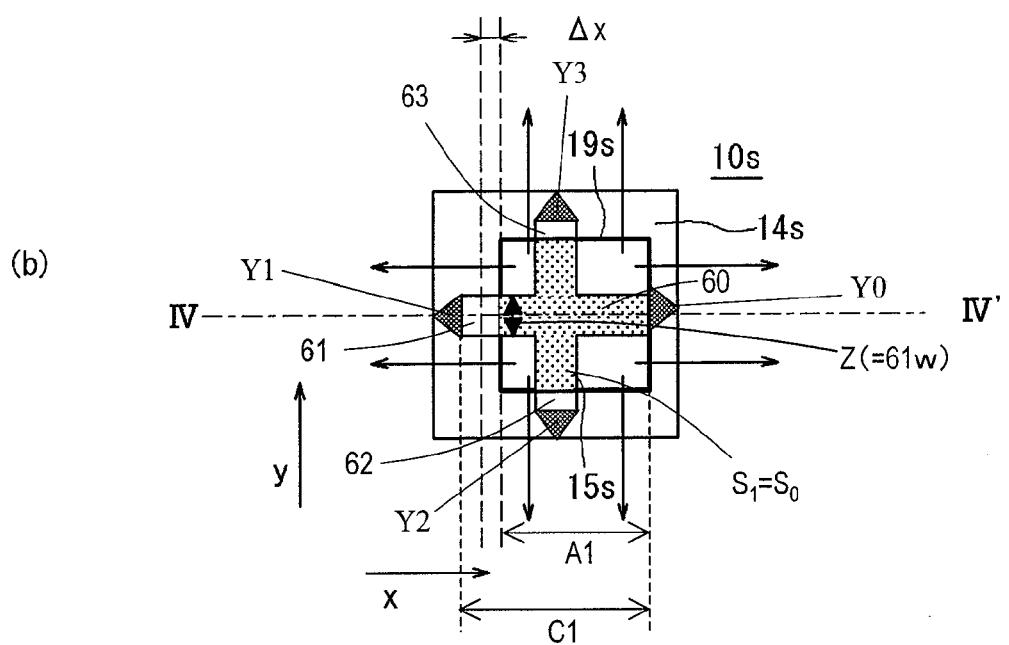
Figure 4:
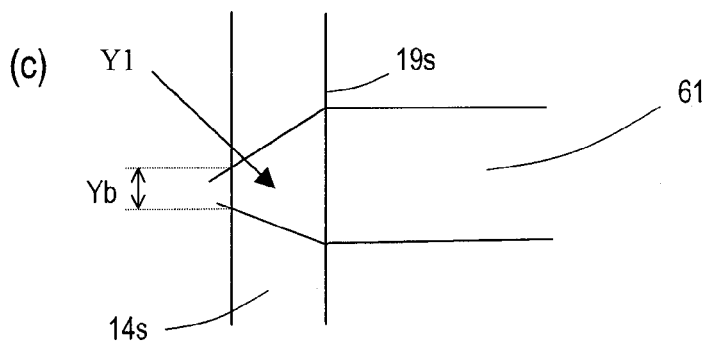

Portions (a) to (c) of FIG. 4 illustrate a situation where the conductive surface 19s of the source electrode 19 has shifted from its designed location to the right by Δx, wherein portion (a) of FIG. 4 is schematic cross-sectional view illustrating a portion of the unit cell 100, portion (b) of FIG. 4 is a plan view illustrating the surface 10s of the semiconductor layer, and portion (c) of FIG. 4 is an enlarged plan view illustrating an electron barely flowable zone.

Figure 5:
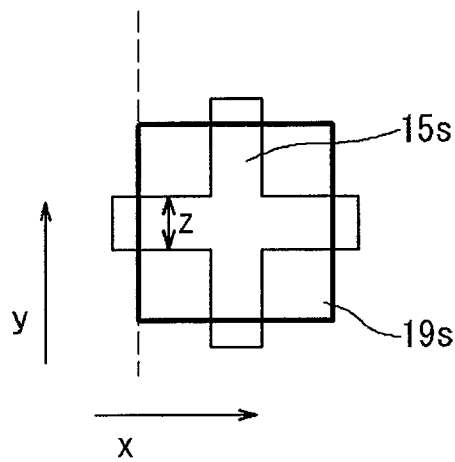
Figure 5:
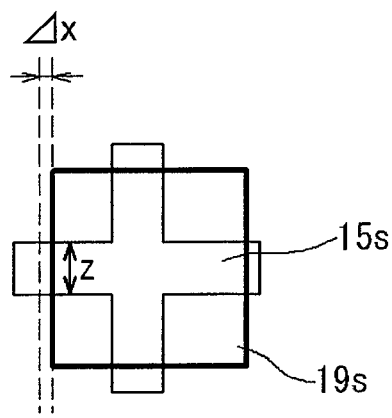
Figure 5:
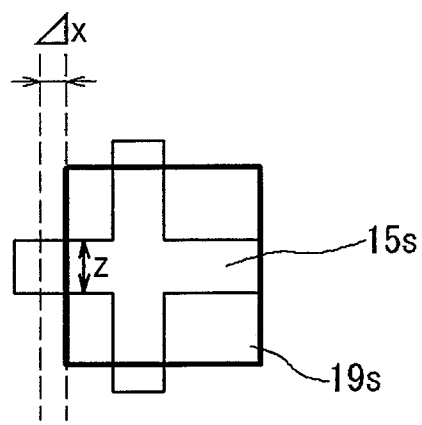

Portions (a) to (c) of FIG. 5 are plan views illustrating how the relative arrangement of the conductive surface 19s with respect to the p$^+$-type contact region's surface 15s changes according to the degree of misalignment Δx in the semiconductor device of the first preferred embodiment of the present invention.

Figure 6:
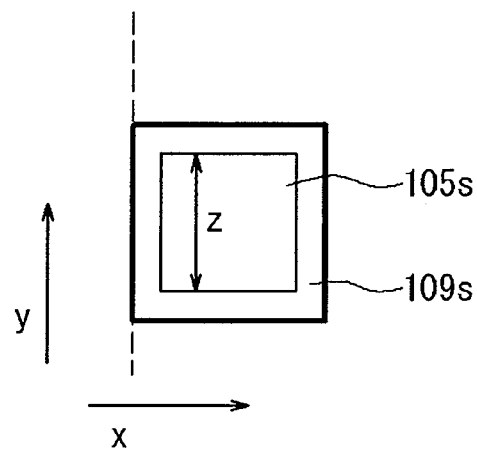
Figure 6:
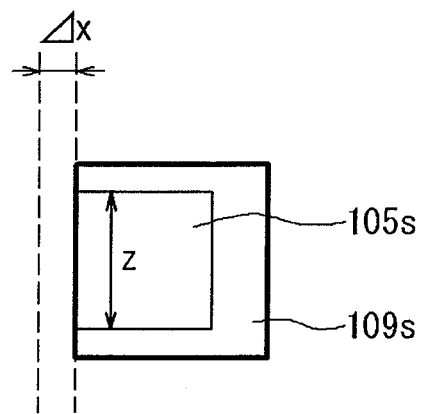
Figure 6:
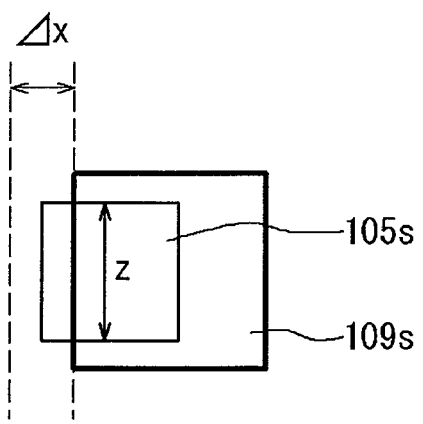

Portions (a) to (c) of FIG. 6 are plan views illustrating how the relative arrangement of the conductive surface 109s with respect to the contact region's surface 105s changes according to the degree of misalignment Δx in a conventional semiconductor device.

Figure 7:
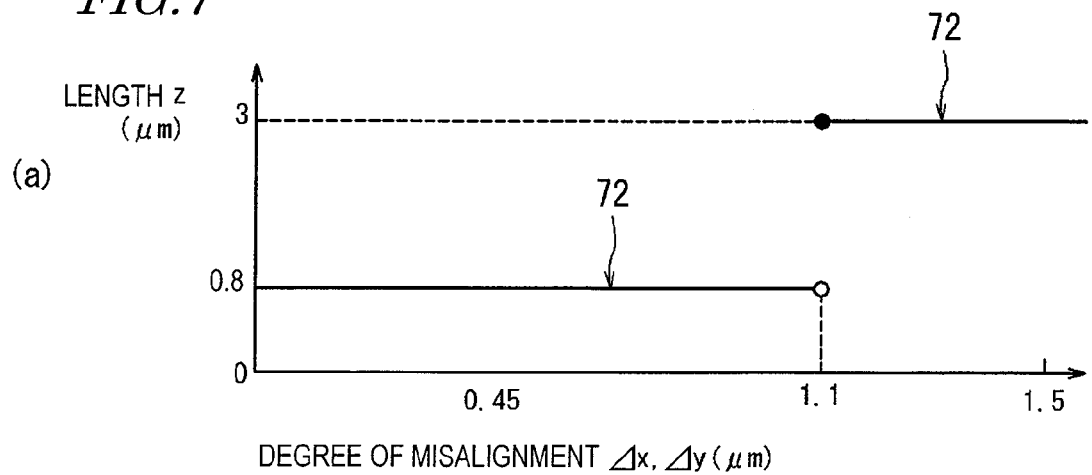
Figure 7:
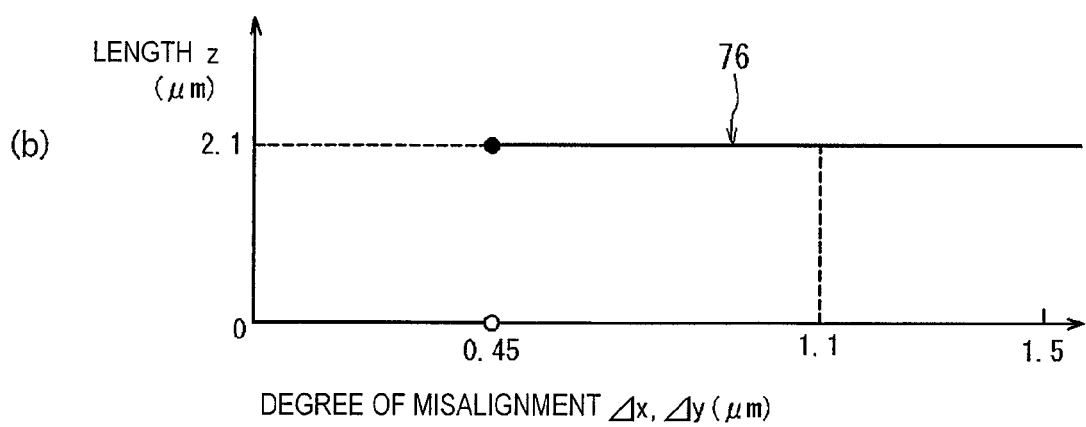

FIGS. 7(a) and 7(b) are graphs showing how the length Z of a portion of the periphery of the conductive surface 19s or 109s that crosses the p$^+$-type contact region's surface 15s or 105s changes with the degrees of misalignment Δx and Δy in the semiconductor device of the first preferred embodiment of the present invention and in the conventional semiconductor device, respectively.

Figure 8:
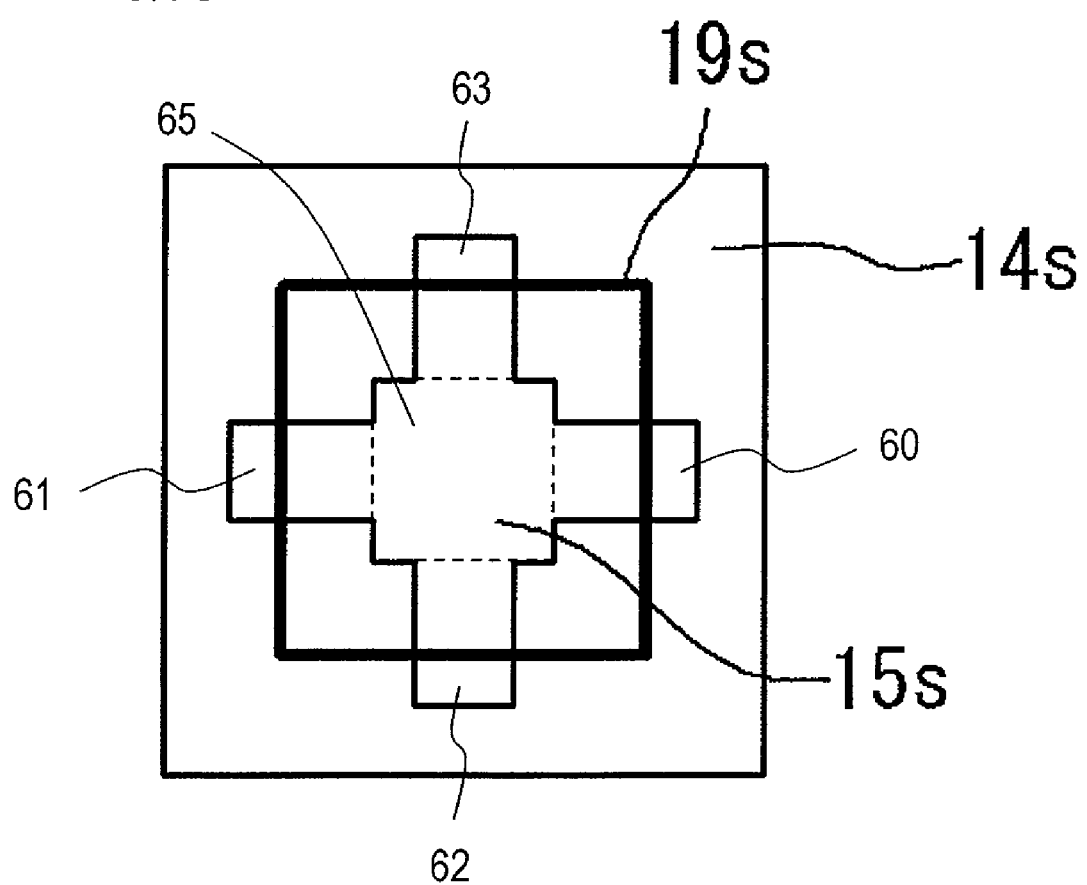

FIG. 8 is a plan view illustrating an alternative arrangement for the conductive surface 19s, the p$^+$-type contact region's surface 15s and the source region's surface 14s according to the first preferred embodiment of the present invention.

FIGS. 9(a) through 9(g) are cross-sectional views illustrating respective manufacturing processing steps to fabricate a semiconductor device according to the first preferred embodiment of the present invention.

Figure 10:
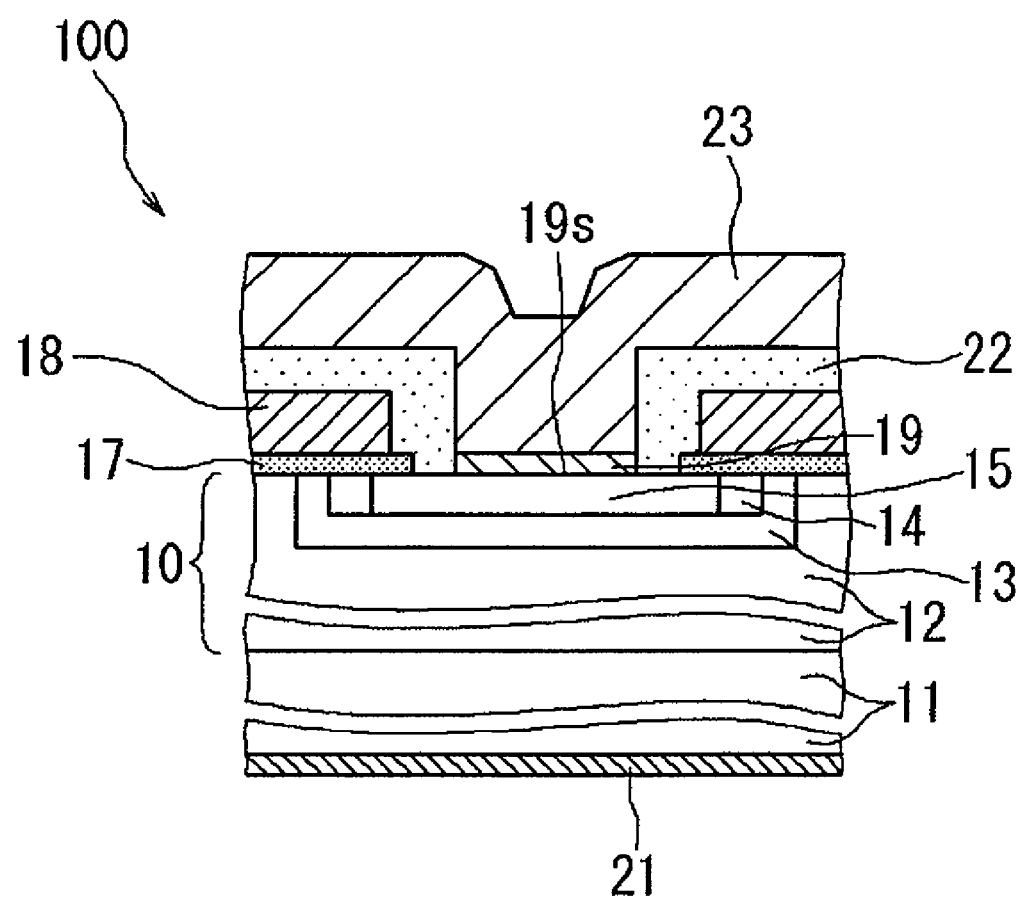

FIG. 10 is a schematic cross-sectional view illustrating another semiconductor device according to the first preferred embodiment of the present invention.

FIGS. 11(a) and 11(b) are respectively a schematic cross-sectional view illustrating a unit cell as a second specific preferred embodiment of the present invention and a plan view illustrating an arrangement of the unit cells.

FIG. 12(a) is a schematic cross-sectional view illustrating the arrangement of a source electrode 19, a p$^+$-type contact region 15 and an n-type source region 14 according to the second preferred embodiment. FIG. 12(b) is a plan view illustrating the conductive surface 19s of the source electrode 19, the p$^+$-type contact region's surface 15s and the n-type source region's surface 14s. And FIG. 12(c) is a plan view illustrating the p$^+$-type contact region's surface 15s and the n-type source region's surface 14s.

Figure 13:
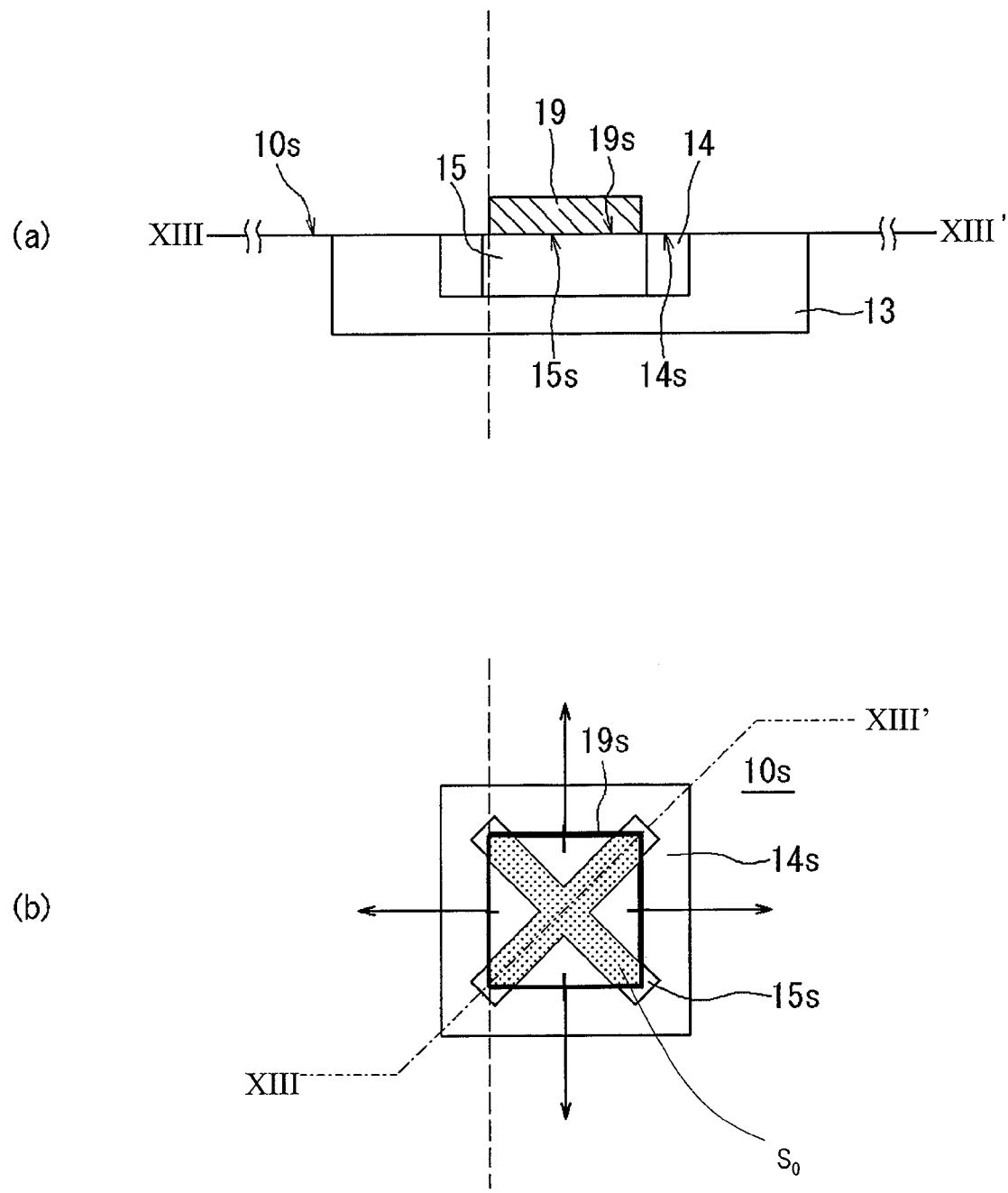

Portions (a) and (b) of FIG. 13 illustrate an ideal situation where the conductive surface 19s of the source electrode 19 has been arranged just as designed over the p$^+$-type contact region's surface 15s and the source region's surface 14s, wherein portion (a) of FIG. 13 is schematic cross-sectional view illustrating a portion of the unit cell 100 and portion (b) of FIG. 13 is a plan view illustrating the surface 10s of the semiconductor layer.

Figure 14:
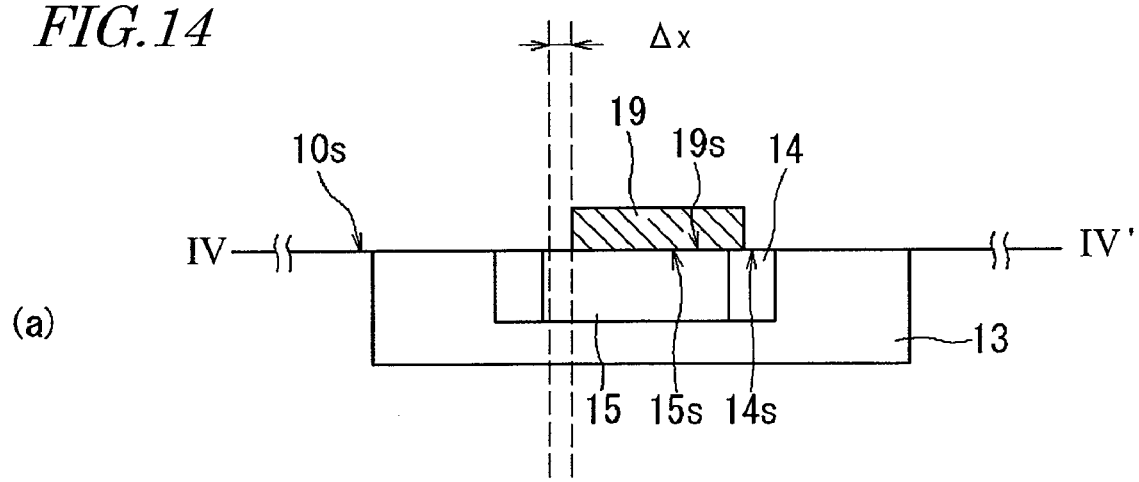
Figure 14:
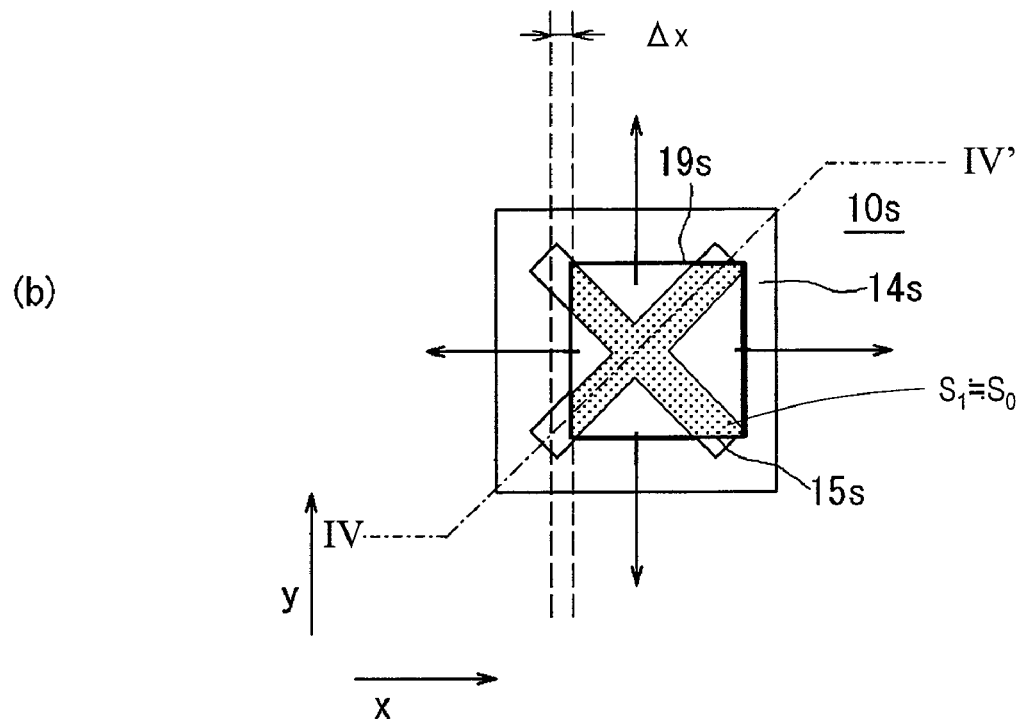

Portions (a) and (b) of FIG. 14 illustrate a situation where the conductive surface 19s of the source electrode 19 has shifted from its designed location to the right by Δx, wherein portion (a) of FIG. 14 is schematic cross-sectional view illustrating a portion of the unit cell 100, and portion (b) of FIG. 14 is a plan view illustrating the surface 10s of the semiconductor layer.

Figure 15:
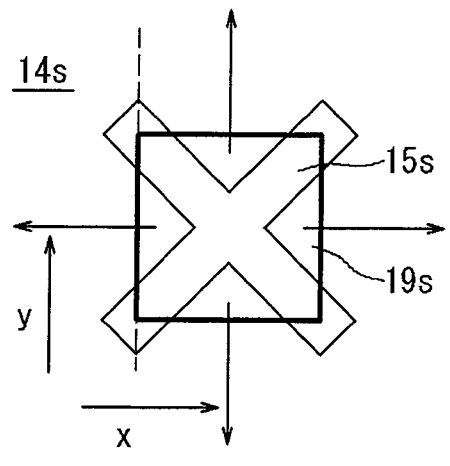
Figure 15:
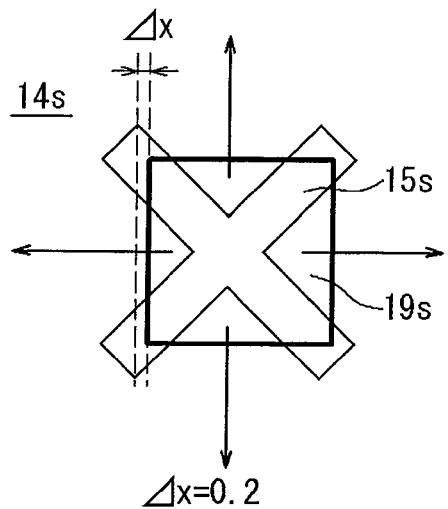
Figure 15:
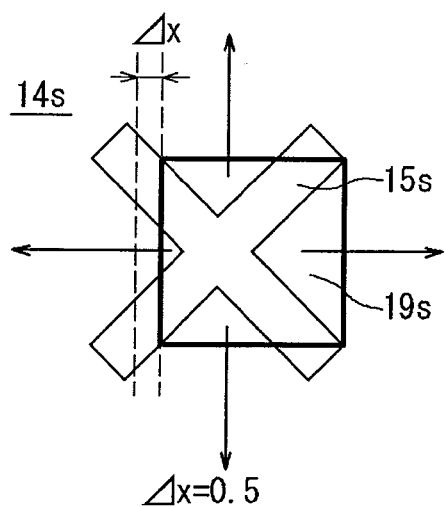

Portions (a) to (c) of FIG. 15 are plan views illustrating how the relative arrangement of the conductive surface 19s with respect to the p$^+$-type contact region's surface 15s changes according to the degree of misalignment Δx in the semiconductor device of the second preferred embodiment of the present invention.

Figure 16:
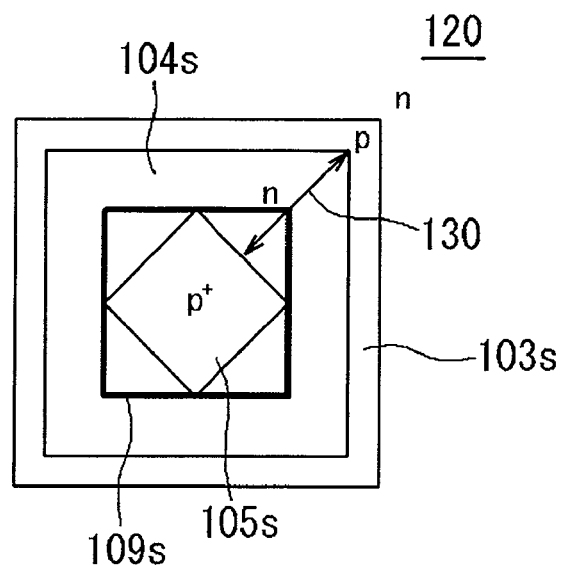
Figure 16:
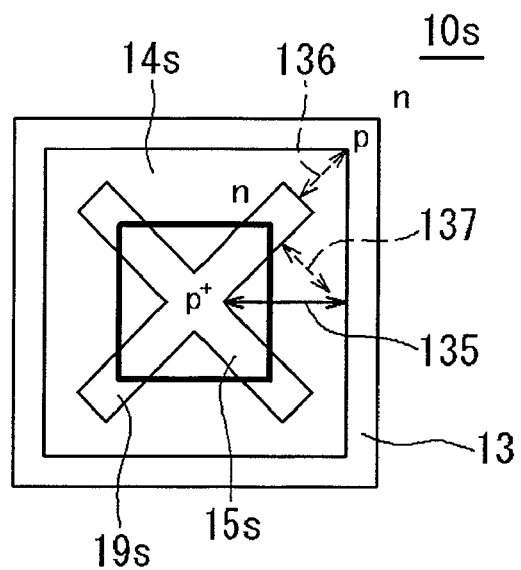

FIGS. 16(a) and 16(b) are plan views illustrating a semiconductor device as a comparative example and a semiconductor device according to the second preferred embodiment of the present invention, respectively.

Figure 17:
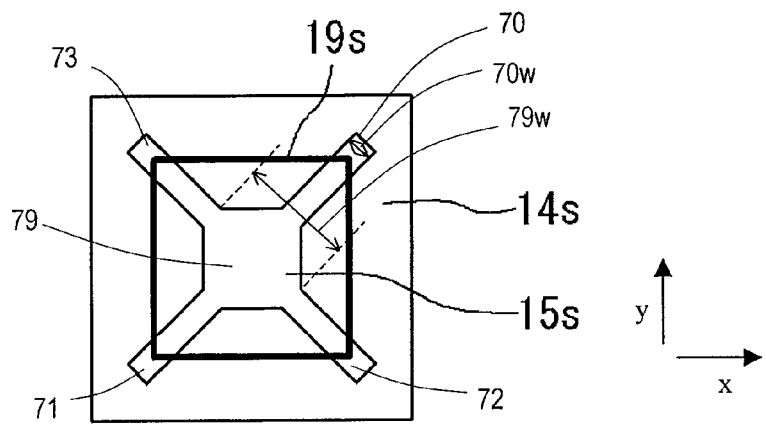

FIG. 17 is a plan view illustrating an alternative arrangement for the conductive surface 19s, the p$^+$-type contact region's surface 15s and source region's surface 14s according to the second preferred embodiment of the present invention.

Figure 18:
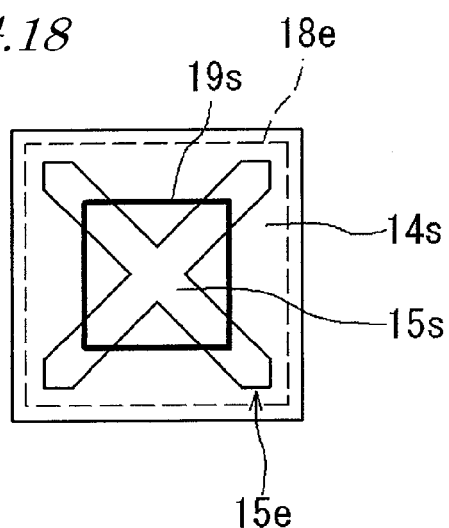

FIG. 18 is a plan view illustrating another alternative arrangement for the conductive surface 19s, the p$^+$-type contact region's surface 15s and source region's surface 14s according to the second preferred embodiment of the present invention.

Figure 19:
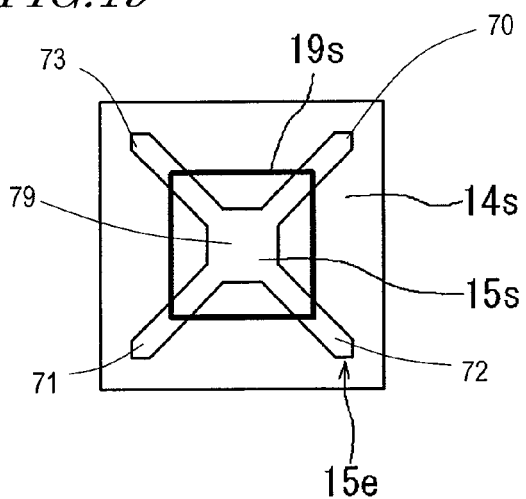

FIG. 19 is a plan view illustrating still another alternative arrangement for the conductive surface 19s, the p$^+$-type contact region's surface 15s and source region's surface 14s according to the second preferred embodiment of the present invention.

Figure 20:
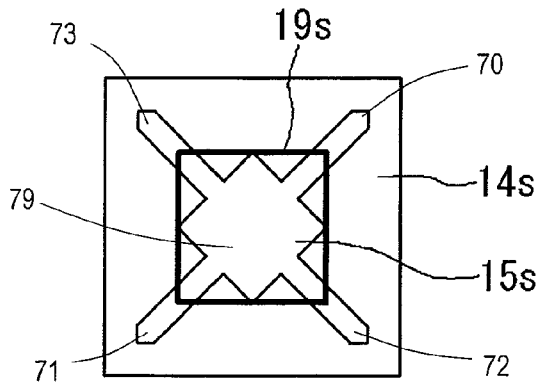

FIG. 20 is a plan view illustrating yet another alternative arrangement for the conductive surface 19s, the p$^+$-type contact region's surface 15s and source region's surface 14s according to the second preferred embodiment of the present invention.

Figure 21:
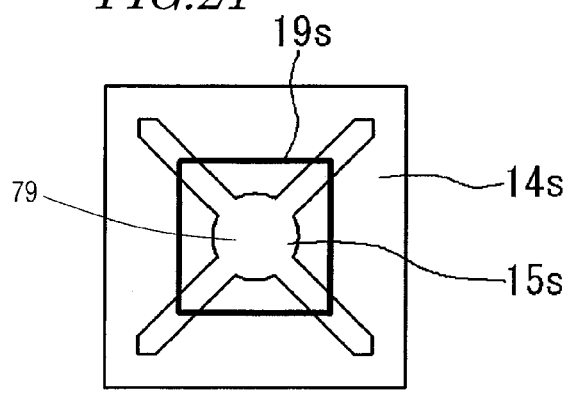

FIG. 21 is a plan view illustrating yet another alternative arrangement for the conductive surface 19s, the p$^+$-type contact region's surface 15s and source region's surface 14s according to the second preferred embodiment of the present invention.

Figure 22:
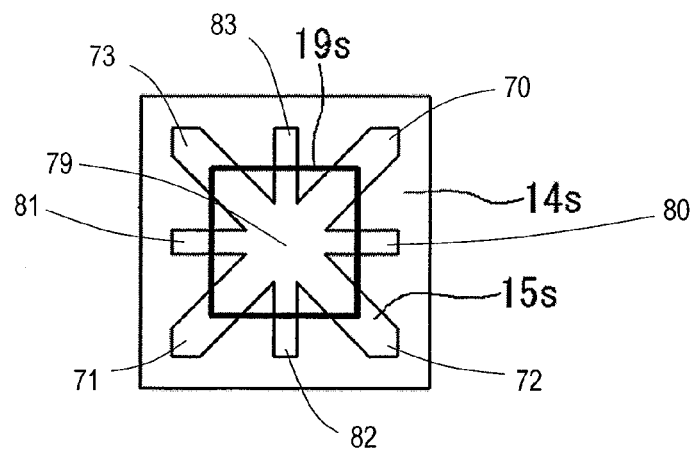

FIG. 22 is a plan view illustrating yet another alternative arrangement for the conductive surface 19s, the p$^+$-type contact region's surface 15s and source region's surface 14s according to the second preferred embodiment of the present invention.

Figure 23:
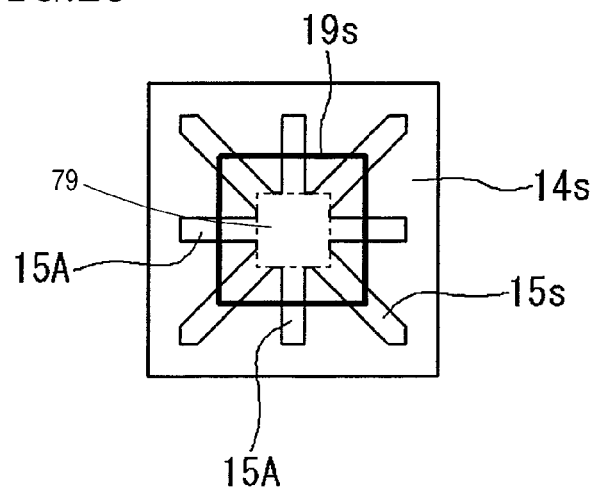

FIG. 23 is a plan view illustrating yet another alternative arrangement for the conductive surface 19s, the p$^+$-type contact region's surface 15s and source region's surface 14s according to the second preferred embodiment of the present invention.

Figure 24:
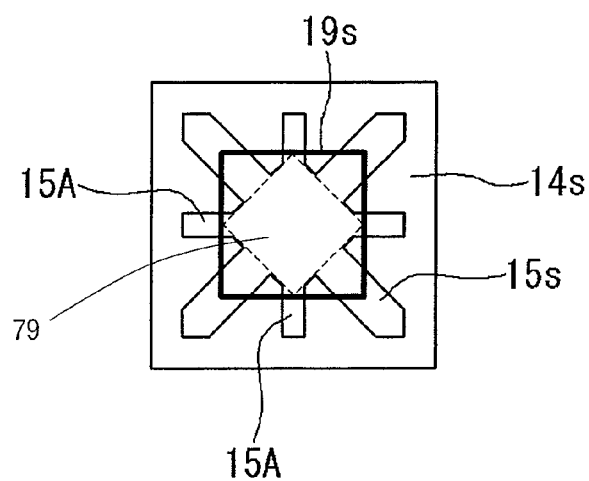

FIG. 24 is a plan view illustrating yet another alternative arrangement for the conductive surface 19s, the p$^+$-type contact region's surface 15s and source region's surface 14s according to the second preferred embodiment of the present invention.

Figure 25:
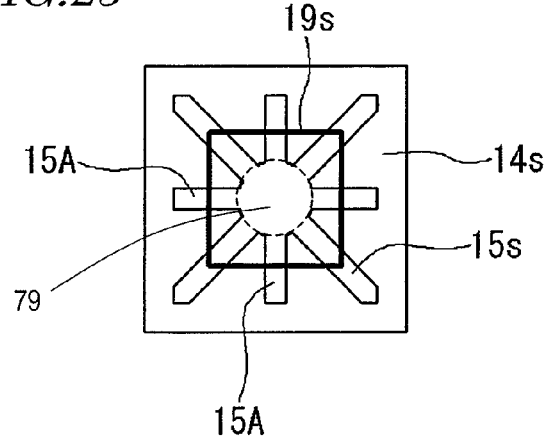

FIG. 25 is a plan view illustrating yet another alternative arrangement for the conductive surface 19s, the p$^+$-type contact region's surface 15s and source region's surface 14s according to the second preferred embodiment of the present invention.

Figure 26:
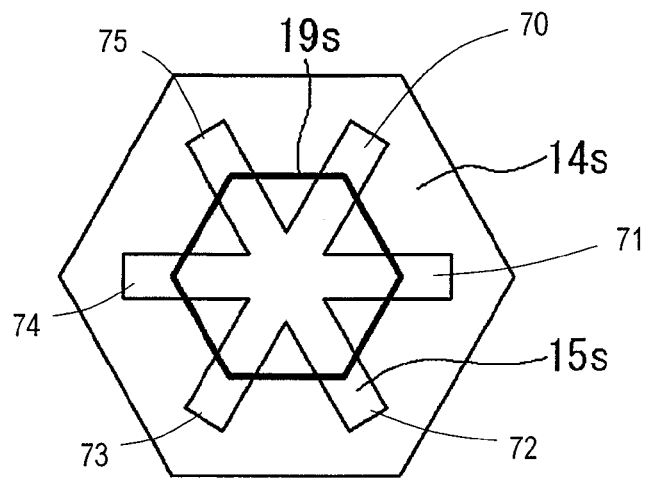

FIG. 26 is a plan view illustrating yet another alternative arrangement for the conductive surface 19s, the p$^+$-type contact region's surface 15s and source region's surface 14s according to the second preferred embodiment of the present invention.

Figure 27:
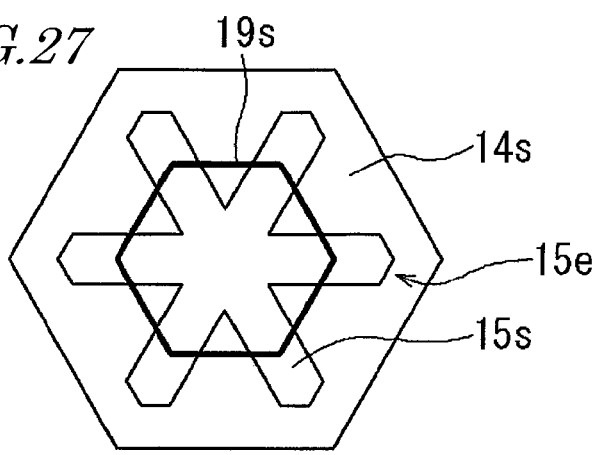

FIG. 27 is a plan view illustrating yet another alternative arrangement for the conductive surface 19s, the p$^+$-type contact region's surface 15s and source region's surface 14s according to the second preferred embodiment of the present invention.

Figure 28:
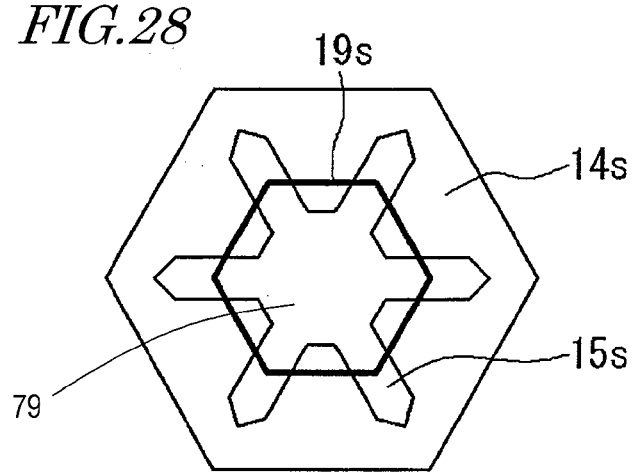

FIG. 28 is a plan view illustrating yet another alternative arrangement for the conductive surface 19s, the p$^+$-type contact region's surface 15s and source region's surface 14s according to the second preferred embodiment of the present invention.

Figure 29:
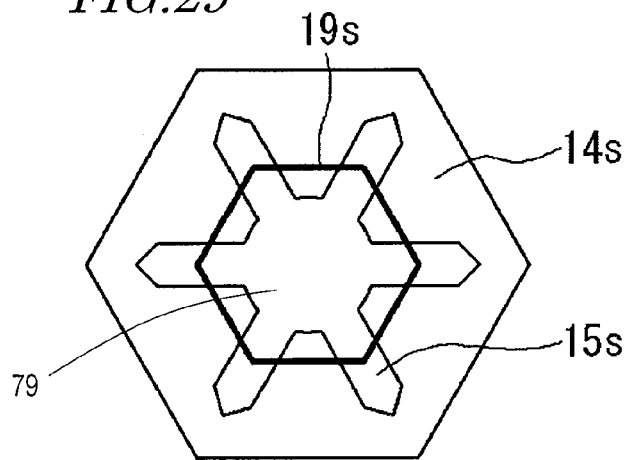

FIG. 29 is a plan view illustrating yet another alternative arrangement for the conductive surface 19s, the p$^+$-type contact region's surface 15s and source region's surface 14s according to the second preferred embodiment of the present invention.

Figure 30:
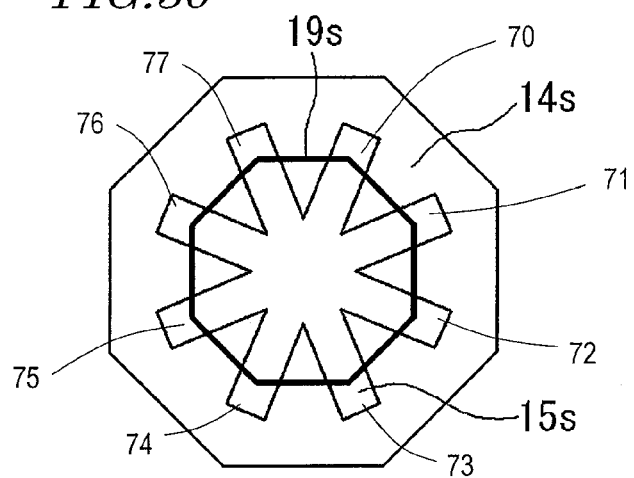

FIG. 30 is a plan view illustrating yet another alternative arrangement for the conductive surface 19s, the p⁺-type contact region's surface 15s and source region's surface 14s according to the second preferred embodiment of the present invention.

Figure 31:
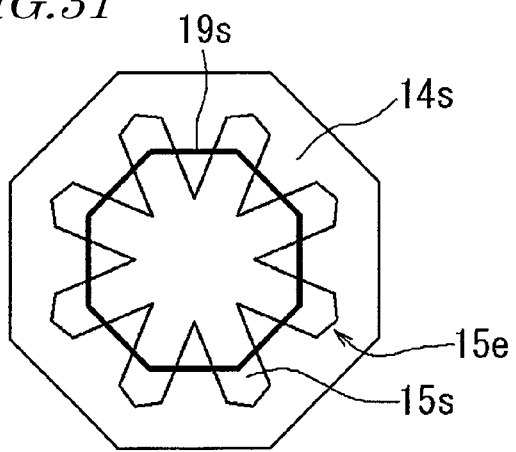

FIG. 31 is a plan view illustrating yet another alternative arrangement for the conductive surface 19s, the p⁺-type contact region's surface 15s and source region's surface 14s according to the second preferred embodiment of the present invention.

Figure 32:
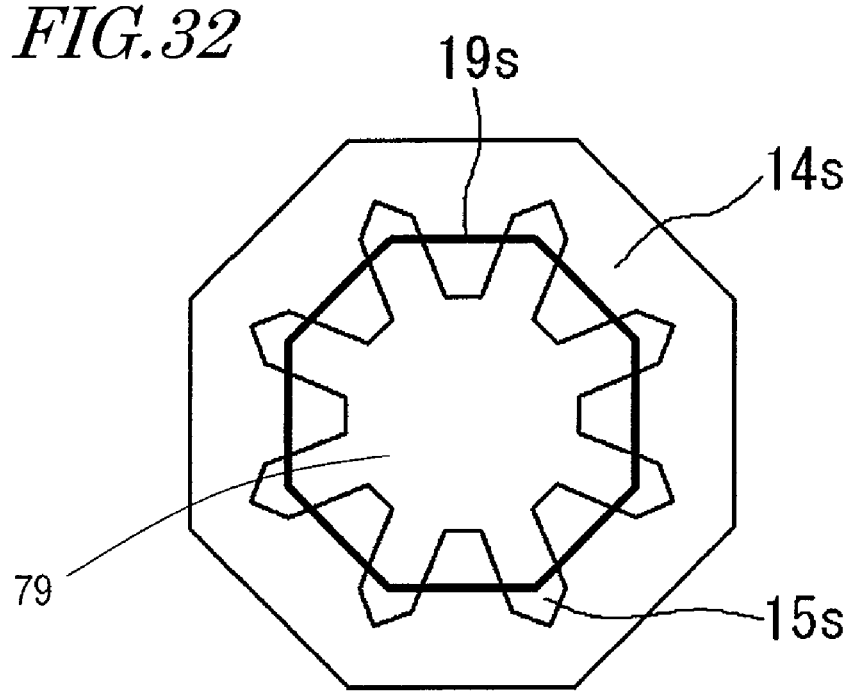

FIG. 32 is a plan view illustrating yet another alternative arrangement for the conductive surface 19s, the p⁺-type contact region's surface 15s and source region's surface 14s according to the second preferred embodiment of the present invention.

Figure 33:
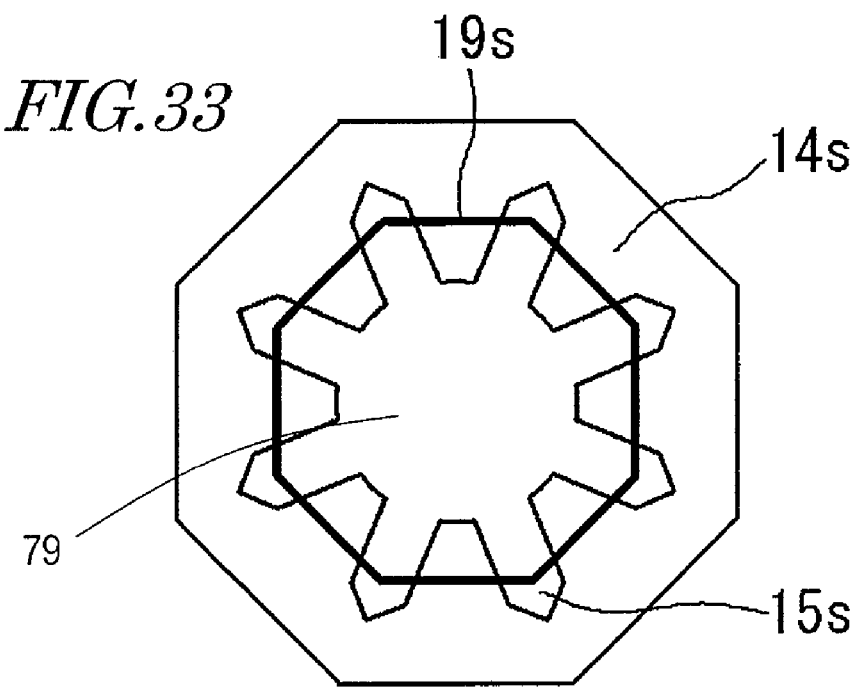
Figure 34:
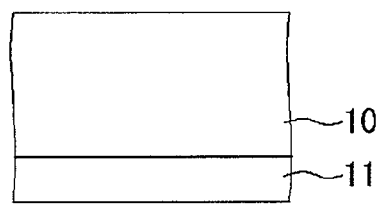
Figure 34:
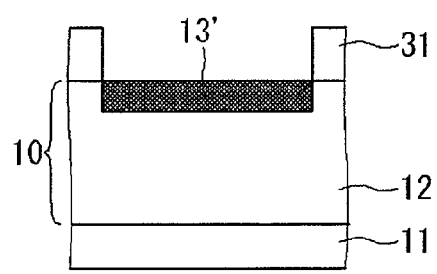
Figure 34:
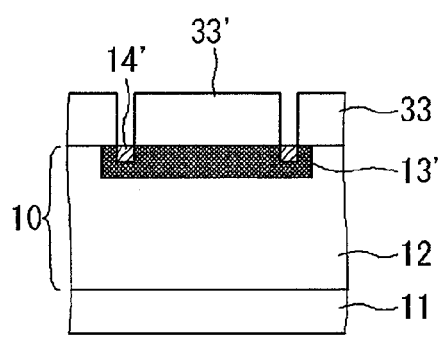
Figure 34:
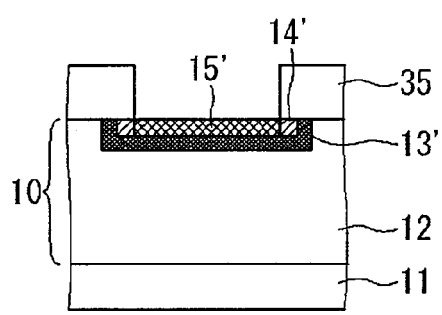
Figure 34:
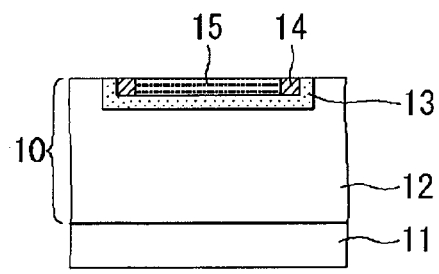
Figure 34:
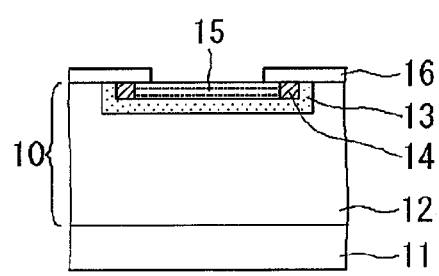
Figure 34:
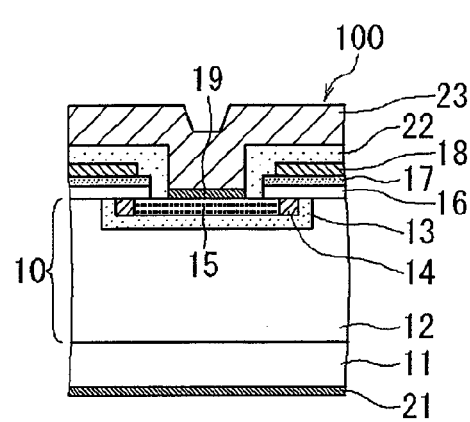

FIG. 33 is a plan view illustrating yet another alternative arrangement for the conductive surface 19s, the p⁺-type contact region's surface 15s and source region's surface 14s according to the second preferred embodiment of the present invention.

FIGS. 34(a) through 34(g) are cross-sectional views illustrating respective manufacturing processing steps to fabricate a semiconductor device according to the second preferred embodiment of the present invention.

Figure 35:
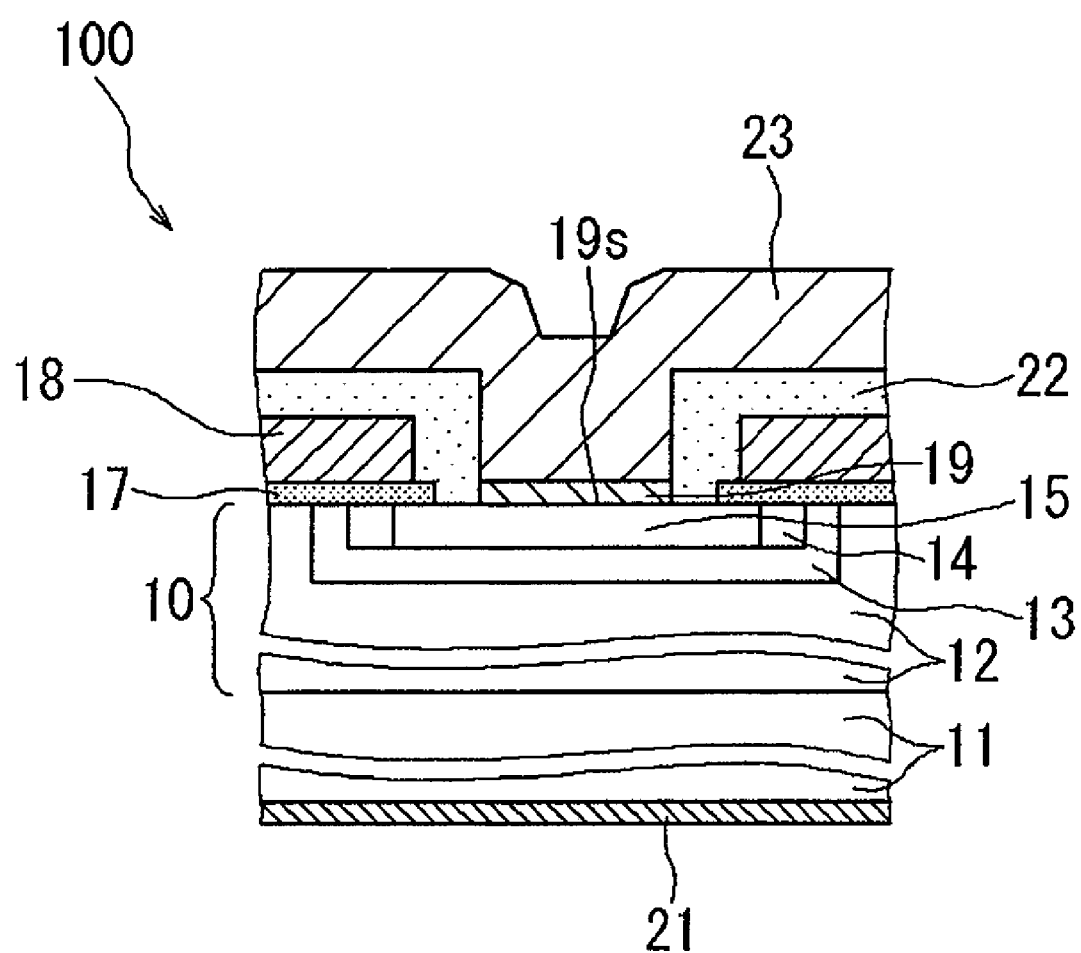

FIG. 35 is a schematic cross-sectional view illustrating another semiconductor device according to the second preferred embodiment of the present invention.

Figure 36:
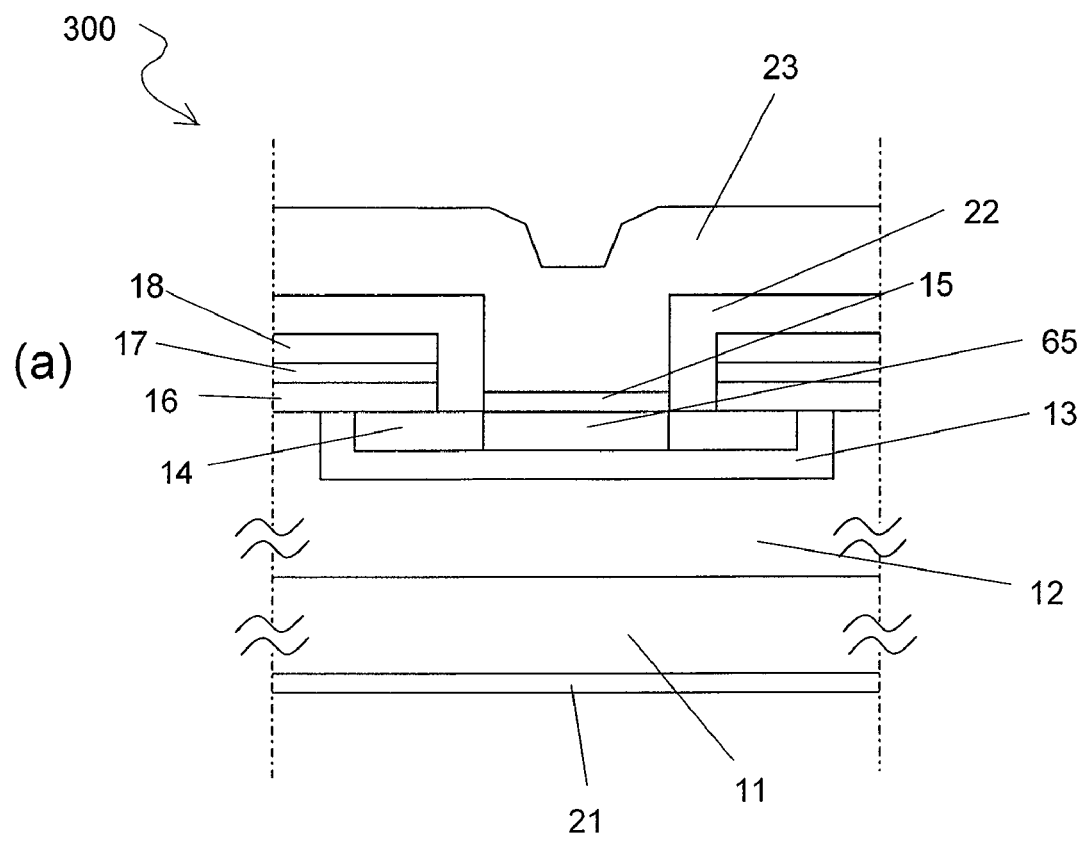
Figure 36:
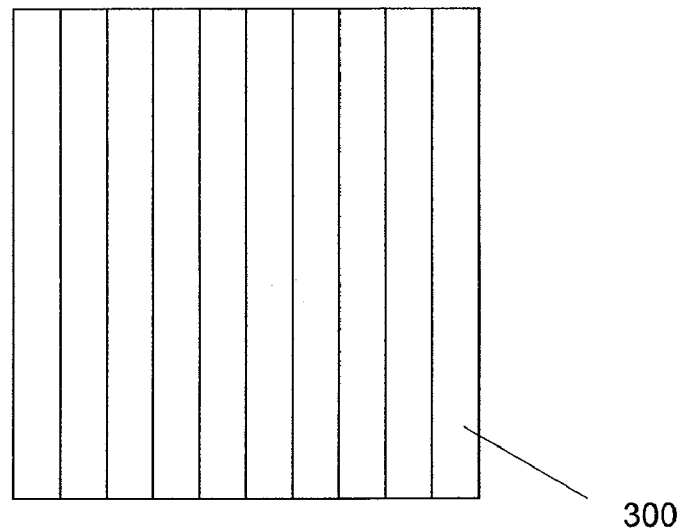

FIGS. 36(a) and 36(b) are respectively a schematic cross-sectional view illustrating a unit cell as a third specific preferred embodiment of the present invention and a plan view illustrating an arrangement of the unit cells.

Figure 37:
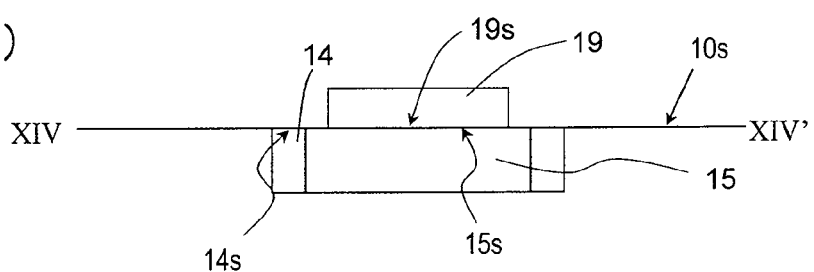
Figure 37:
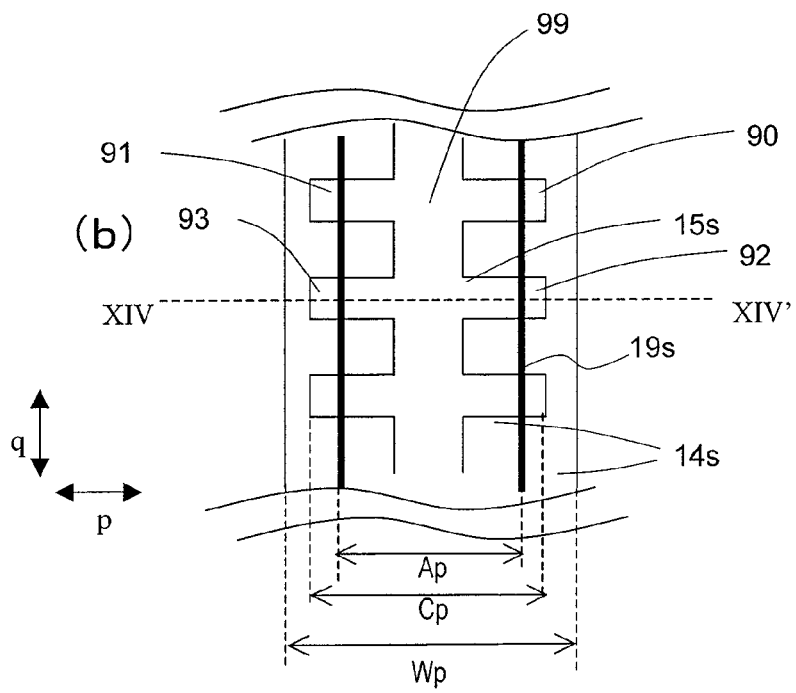

FIG. 37(a) is a schematic cross-sectional view illustrating the arrangement of a source electrode 19, a p⁺-type contact region 15 and an n-type source region 14 according to the third preferred embodiment of the present invention. And FIG. 37(b) is a plan view illustrating the conductive surface 19s of the source electrode 19, the p⁺-type contact region's surface 15s and the n-type source region's surface 14s.

Figure 38:
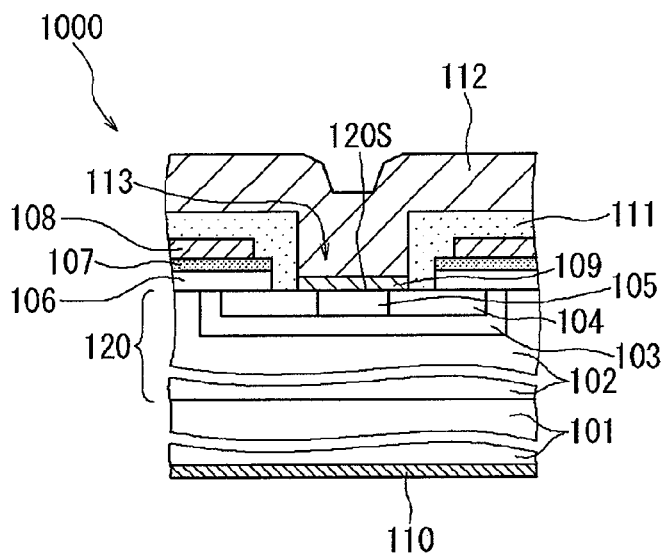

FIG. 38 is a schematic cross-sectional view illustrating a conventional unit cell 1000 of a vertical MOSFET that uses SiC.

Figure 39:
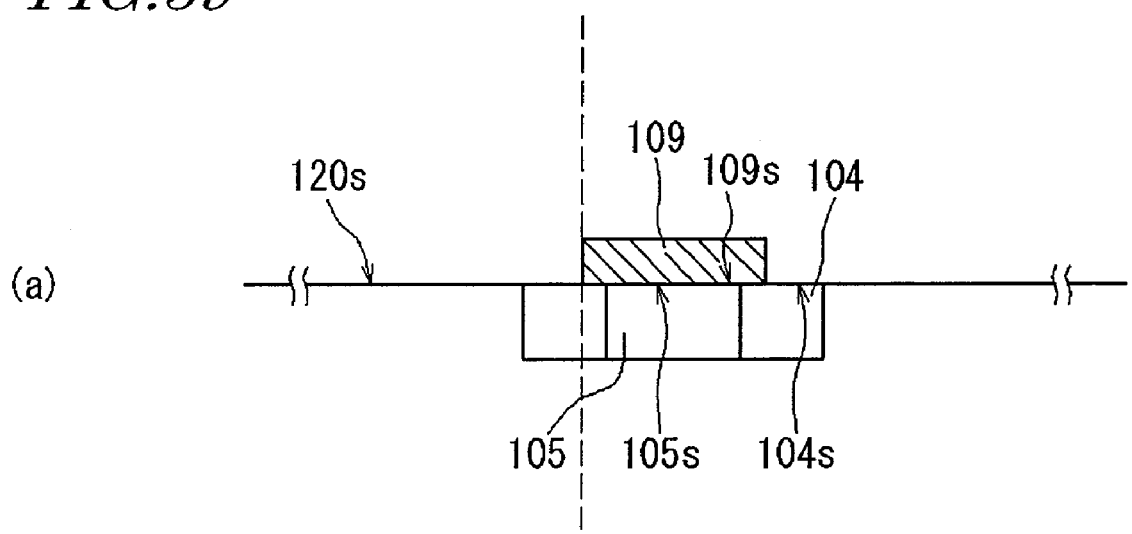
Figure 39:
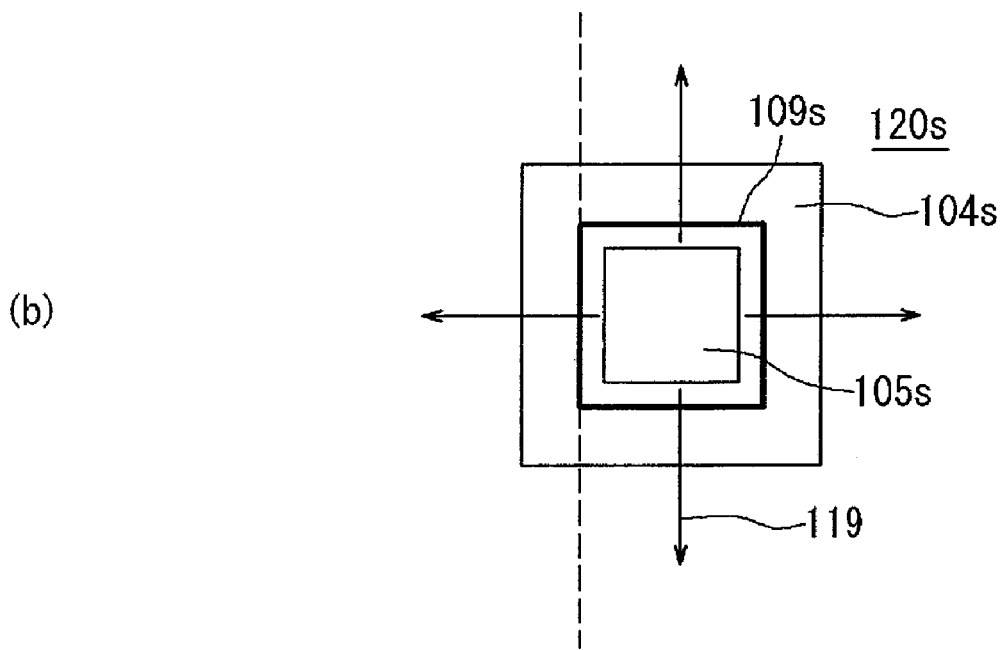

Portions (a) and (b) of FIG. 39 illustrate an arrangement for the conventional unit cell 1000, wherein portion (a) of FIG. 39 is a cross-sectional view illustrating the source electrode 109, the contact region 105 and the source region 104 thereof, and portion (b) of FIG. 39 is a plan view illustrating the surface 120s of the silicon carbide epitaxial layer thereof.

Figure 40:
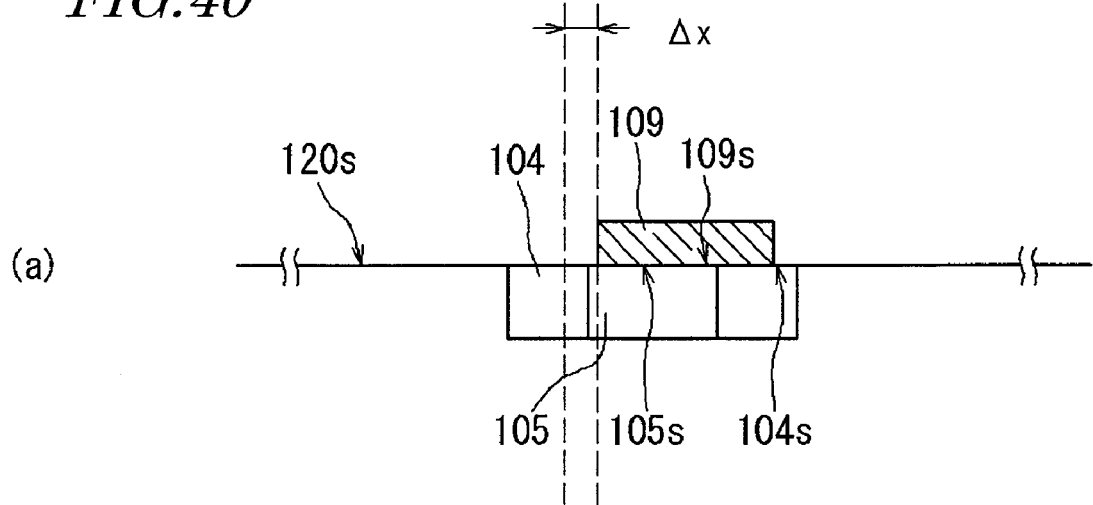
Figure 40:
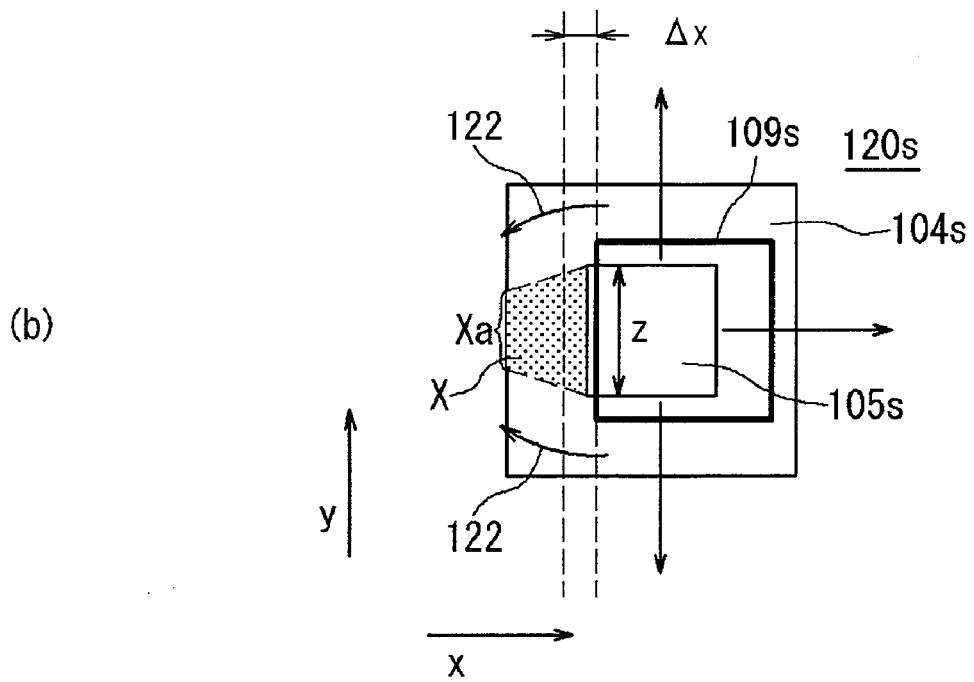

Portions (a) and (b) of FIG. 40 are respectively a cross-sectional view illustrating the arrangement of the source electrode 109, the contact region 105 and the source region 104 in a situation where the source electrode 109 has shifted and a plan view illustrating the surface 120s of the silicon carbide epitaxial layer.

Figure 41:
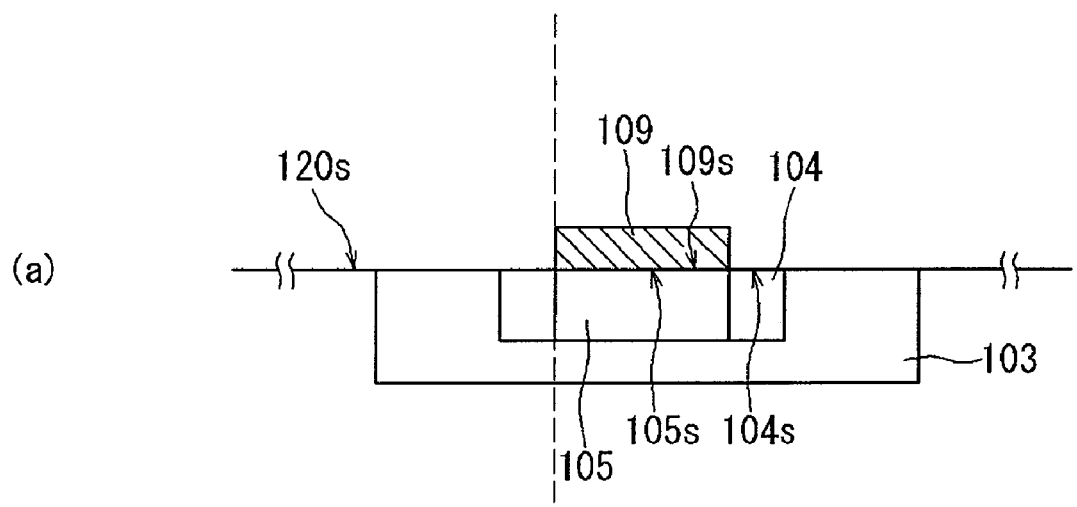
Figure 41:
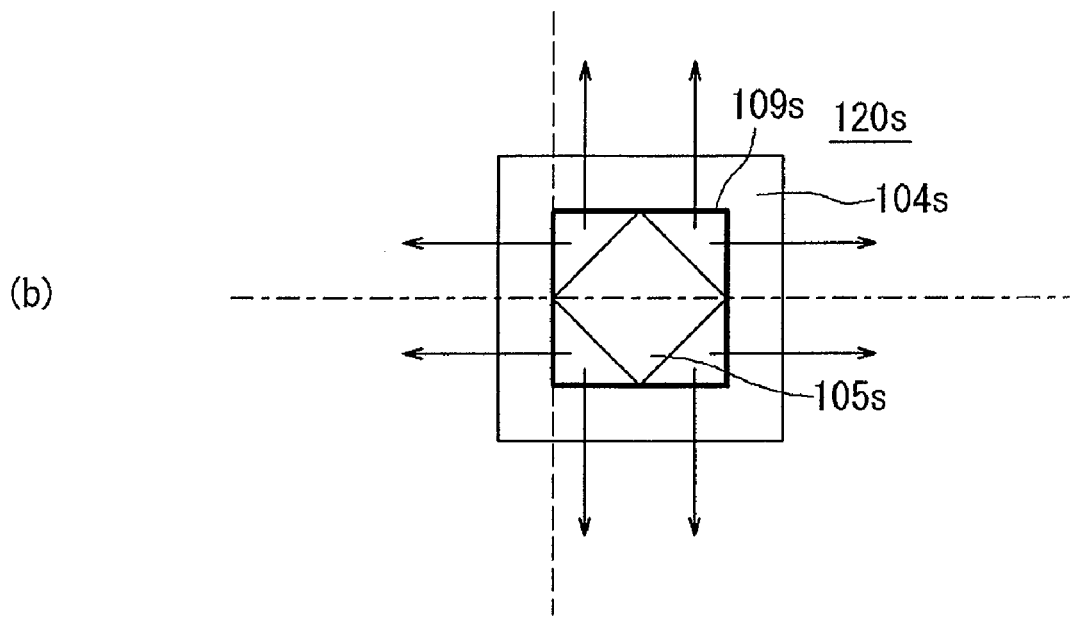

Portions (a) and (b) of FIG. 41 illustrates the arrangement of the semiconductor device disclosed in Patent Document No. 2, wherein portion (a) of FIG. 41 is a schematic cross-sectional view illustrating the source electrode 109, the contact region 105 and the source region 104 and portion (b) of FIG. 41 is a plan view illustrating the surface 120s of the silicon carbide epitaxial layer.

Figure 42:
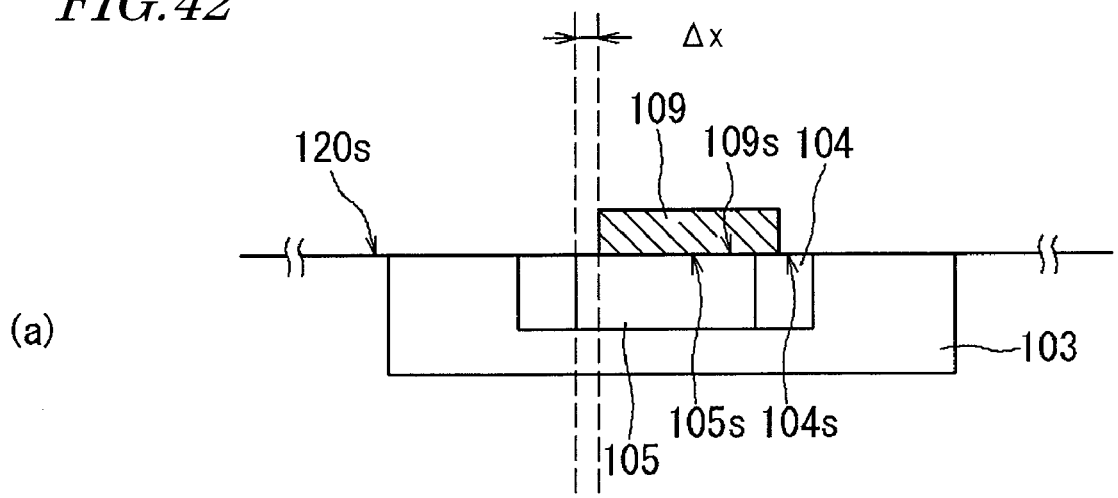
Figure 42:
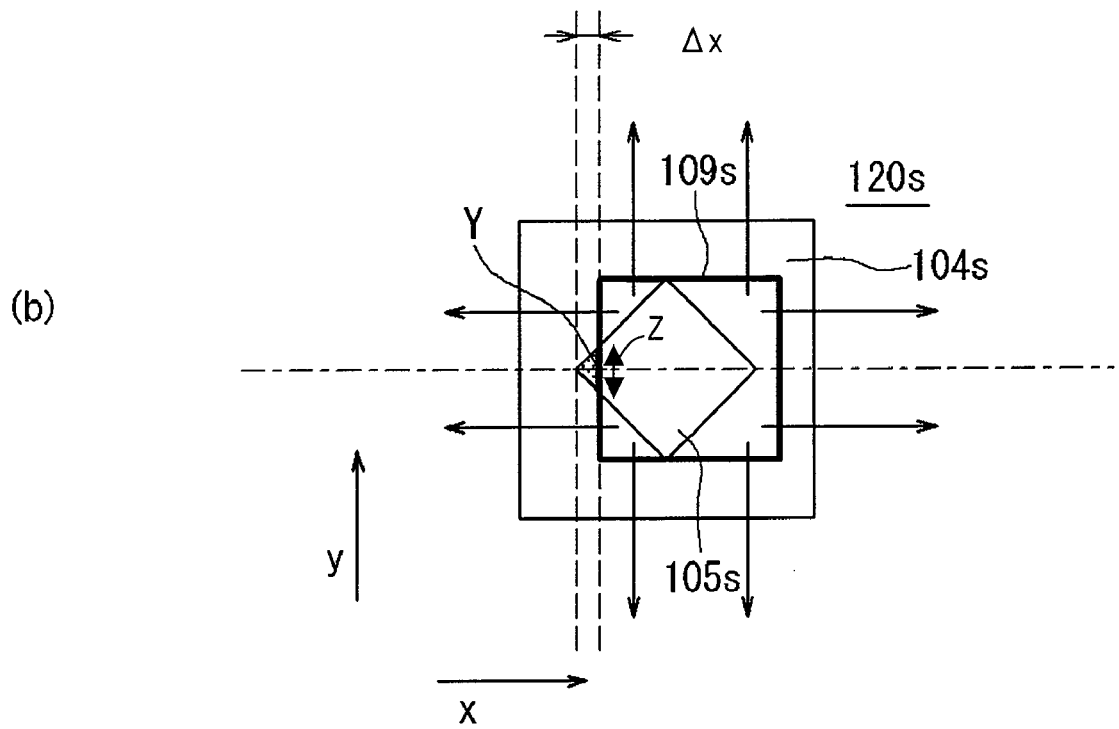

Portions (a) and (b) of FIG. 42 illustrates what if the source electrode 109 has shifted in the semiconductor device disclosed in Patent Document No. 2, wherein portion (a) of FIG. 42 is a schematic cross-sectional view illustrating the source electrode 109, the contact region 105 and the source region 104 and portion (b) of FIG. 42 is a plan view illustrating the surface 120s of the silicon carbide epitaxial layer.

Figure 43:
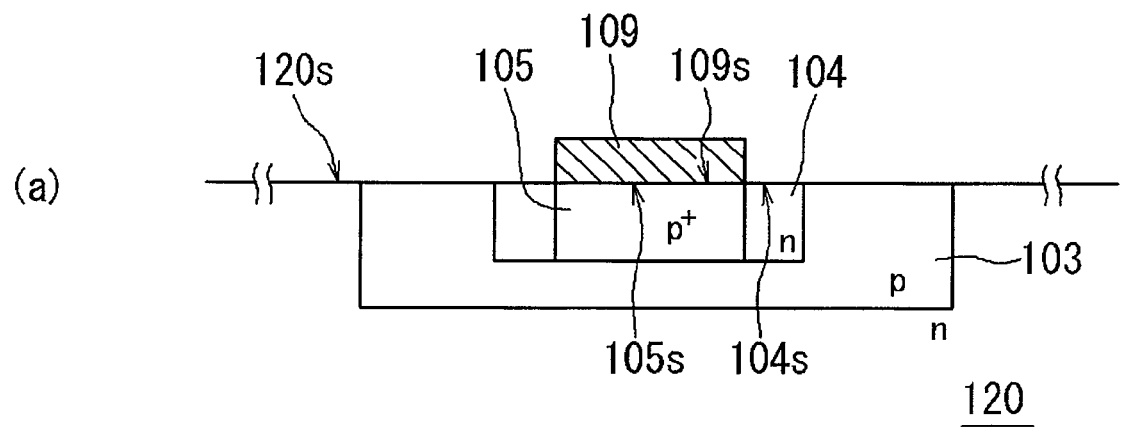
Figure 43:
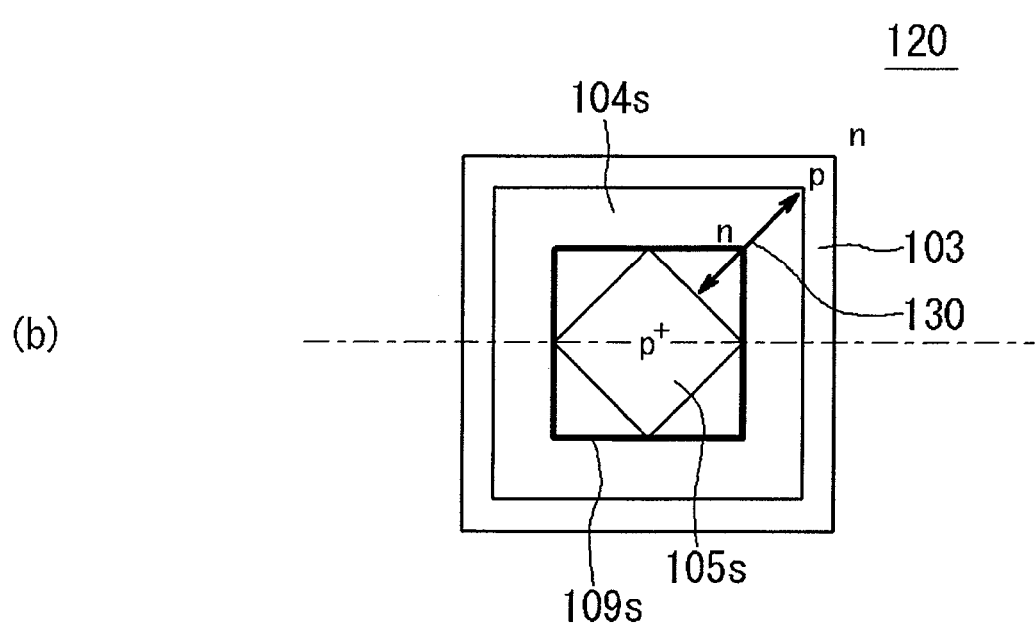

FIGS. 43(a) and 43(b) are respectively a cross-sectional view and a plan view illustrating how an npn transistor (104, 103, 120) turns ON in the semiconductor device disclosed in Patent Document No. 2.

Figure 44:
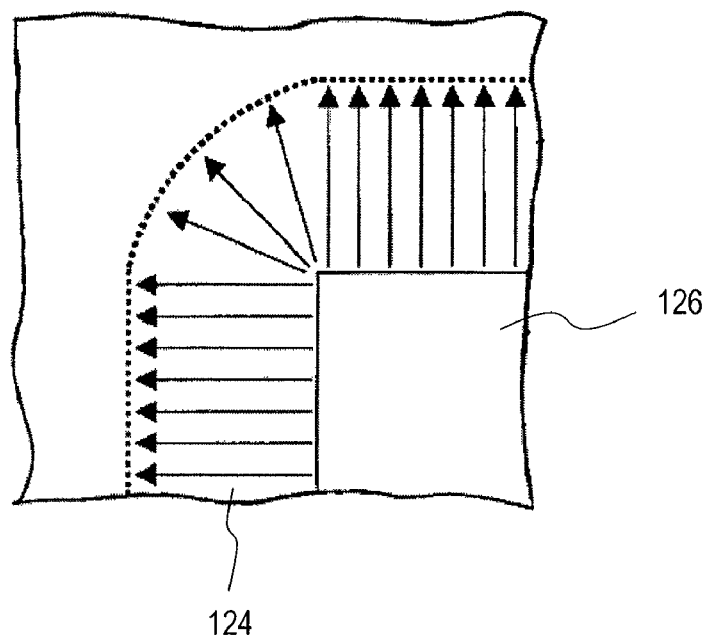
Figure 44:
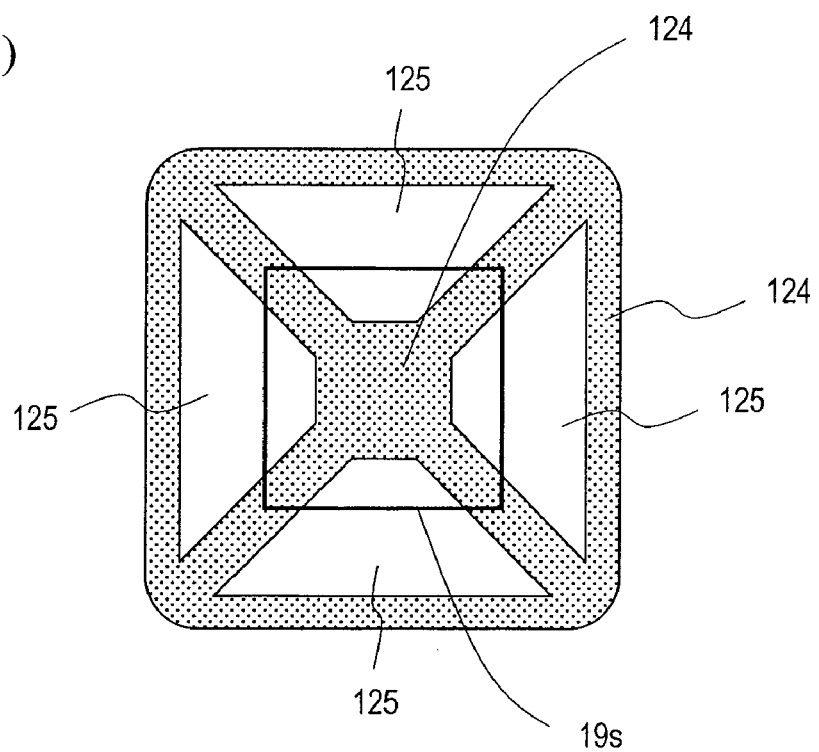

FIG. 44(a) is a plan view illustrating how to define an Si-MOSFET well region and FIG. 44(b) is a plan view illustrating exemplary shapes of the well region and source region in the Si-MOSFET.

DESCRIPTION OF EMBODIMENTS

As already described with reference to FIGS. 41 and 42, even if misalignment has occurred, the semiconductor device disclosed in Patent Document No. 2 can still prevent the effective gate width from decreasing, and therefore, can minimize the decrease in ON-state resistance. Nevertheless, the greater the degree Δx of the misalignment, the smaller the area of contact between the contact region and the source region. That is why the greater the degree of misalignment, the larger the area of contact, and the lower the contact resistance, between the source region and the source electrode. In that case, the ON-state resistance of the switching element will decrease but the contact resistance between the contact region and the source electrode will increase. Thus, there will be a concern about switching delay.

To overcome these problems, the present inventors looked for, and found, the best shapes for the contact region and the conductive surface of the source electrode that would ensure a sufficient area of contact between the contact region and the conductive surface of the source electrode and yet would minimize the variation in the length Z of the periphery of the conductive surface that crosses the contact region even if the degree of misalignment Δx increased, thereby obtaining the basic idea of the present invention.

In a preferred embodiment of the present invention, on the surface of a semiconductor layer including silicon carbide, defined are a contact region and a source region that surrounds the contact region. The contact region has at least one first-directed strip portion that runs along a first axis. The width of the contact region as measured along the first axis is greater than that of the conductive surface of the source electrode as measured along the first axis. And the periphery of the conductive surface of the source electrode is designed so as to cross the first-directed strip portion. That is why even if misalignment has occurred, the periphery of the conductive surface can still be located over the first-directed strip portion of the contact region. Consequently, it is possible to prevent such misalignment from decreasing the area of contact between the semiconductor region of the first conductivity type and the conductive surface. On top of that, since the variation in the length Z of the periphery of the conductive surface that crosses the semiconductor region of the first conductivity type can be minimized, the area of the zone of the source region where no electrons flow can be kept as small as originally designed. As a result, a sufficient effective gate width can be ensured just as designed.

On the surface of the layer including silicon carbide, the contact region preferably further has at least one second-directed strip portion that runs along a second axis that is not parallel to the first axis. Then, the effect described above can always be achieved no matter in which direction the misalignment has occurred. More preferably, the second axis intersects with the first axis at right angles. As a result, it is possible to minimize the increase in contact resistance between the contact region and the conductive surface of the source electrode and the increase in ON-state resistance, which would otherwise be caused by misalignment in two directions that intersect with each other at right angles (e.g., x and y directions). The first and second axes may or may not be parallel to the x and y directions.

Optionally, the first-directed strip portions of the contact region may include two strip portions that run in mutually opposite directions along the first axis and the second-directed strip portions thereof may include two strip portions that run in mutually opposite directions along the second axis. Then, even if the misalignment has occurred in any of x, y, −x and −y directions, the area of contact between the contact region and the conductive surface can always be substantially constant.

The width of the first-directed strip portion as measured perpendicularly to the first axis is preferably substantially constant along the first axis. Likewise, the width of the second-directed strip portion as measured perpendicularly to the second axis is substantially constant along the second axis. In that case, even if misalignment has occurred, the area of contact between the contact region and the conductive surface can be kept substantially constant.

It should be noted that the semiconductor device of the present invention does not have to be such a vertical MOSFET. Rather, the present invention is applicable to any other type of semiconductor device that includes: a semiconductor layer including silicon carbide; a semiconductor region of a first conductivity type (e.g., a contact region), which is defined on the surface of the semiconductor layer; a semiconductor region of a second conductivity type (e.g., a source region), which is also defined on the surface of the semiconductor layer so as to surround the semiconductor region of the first conductivity type; and a conductor with a conductive surface that contacts with the semiconductor regions of the first and second conductivity types. Then, the decrease in the area of contact between the semiconductor region of the first conductivity type and the conductive surface due to misalignment can be minimized.

The semiconductor device of the present invention has only to be designed such that the conductive surface of the source electrode and the surface of the contact region have such shapes. That is to say, misalignment may occur between the conductive surface and the contact region during the manufacturing process. It should be noted that the "semiconductor device" of the present invention does not have to be a vertical MOSFET but could be any other device with a semiconductor layer.

Hereinafter, preferred embodiments of the present invention will be described more specifically with reference to the accompanying drawings. In the following description, any pair of components shown in multiple drawings and having substantially the same function will be identified by the same reference numeral for the sake of simplicity. It should be noted, however, that the present invention is in no way limited to specific preferred embodiment to be described below.

Embodiment 1

Hereinafter, a first specific preferred embodiment of a semiconductor device according to the present invention will be described with reference to FIGS. 1 through 4. The semiconductor device of this preferred embodiment is a vertical MOSFET that uses silicon carbide.

The semiconductor device of this preferred embodiment includes at least one unit cell including a semiconductor layer, source and drain electrodes that are electrically connected to the semiconductor layer, and a gate electrode for use to switch the semiconductor device between ON and OFF states, and typically has a structure in which a number of such unit cells are arranged. In the following description, a semiconductor device consisting of a plurality of unit cells with a substantially quadrangular planar shape will be taken as an example.

FIGS. 1(a) and 1(b) are respectively a schematic cross-sectional view illustrating a unit cell of this preferred embodiment and a plan view illustrating an arrangement of the unit cells.

The unit cell 100 shown in FIG. 1(a) includes a substrate 11, a semiconductor layer 10 that has been formed on the surface of the substrate 11, a source electrode 19 that is electrically connected to the semiconductor layer 10, a gate electrode 18 that covers at least a portion of the semiconductor layer 10, and a drain electrode 21 that is electrically connected to the back surface of the substrate 11. A channel layer 16 and a gate insulating film 17 have been stacked in this order between the semiconductor layer 10 and the gate electrode 18.

The substrate 11 is an n-type semiconductor substrate of silicon carbide such as 4H—SiC, and may be an off-cut substrate, of which the surface has its step density increased by defining a tilt angle (i.e., an off-cut angle) of several degrees with respect to (0001) Si planes.

The semiconductor layer 10 may be a silicon carbide epitaxial layer that has been formed on the substrate 11, for example. It should be noted that the semiconductor layer 10 could be any layer including silicon carbide and does not have to be a silicon carbide epitaxial layer. The semiconductor layer 10 has a p-type well region 13, which has been defined so as to be electrically isolated from the adjacent unit cell, and an n-type drift region 12, which is the rest of the semiconductor layer 10 other than the p-type well region 13. Inside the p-type well region 13, defined are an n-type heavily doped source region 14 including an n-type dopant and a $p^+$-type contact region 15 that is electrically connected to the p-type well region 13 and that includes a p-type dopant at a higher concentration than the p-type well region 13. The channel layer 16 is an n-type epitaxial layer of 4H—SiC, for example, and is arranged so as to connect adjacent p-type well region 13 together and to be adjacent to the n-type source region 14.

The source electrode 19 has a conductive surface 19s that makes electrical contact with both the n-type source region 14 and the $p^+$-type contact region 15 and makes ohmic contact with these regions 14 and 15. The source electrodes 19 of the respective unit cells are connected in parallel to each other by an upper interconnect electrode 23. Also, the upper interconnect electrode 23 is electrically isolated from the gate electrode 18 by an interlevel dielectric film 22.

As shown in FIG. 1(b), the respective unit cells 100 are arranged two-dimensionally, and are provided with additional interconnect pads or a terminal structure, if necessary, thereby forming a vertical MOSFET.

In this preferred embodiment, the source electrode 19, the n-type source region 14 and the $p^+$-type contact region 15 are designed so as to have the shapes shown in FIGS. 2(a) to 2(c), for example.

FIG. 2(a) is a schematic cross-sectional view illustrating the arrangement of the source electrode 19, the $p^+$-type contact region 15 and the n-type source region 14 according to the first preferred embodiment. FIG. 2(b) is a plan view illustrating the conductive surface 19s of the source electrode 19, the $p^+$-type contact region's surface 15s and the n-type source region's surface 14s. And FIG. 2(c) is a plan view illustrating the $p^+$-type contact region's surface 15s and the n-type source region's surface 14s. FIG. 2(a) is a cross-sectional view as viewed on the plane II-II' shown in FIGS. 2(b) and 2(c).

Figure 2:
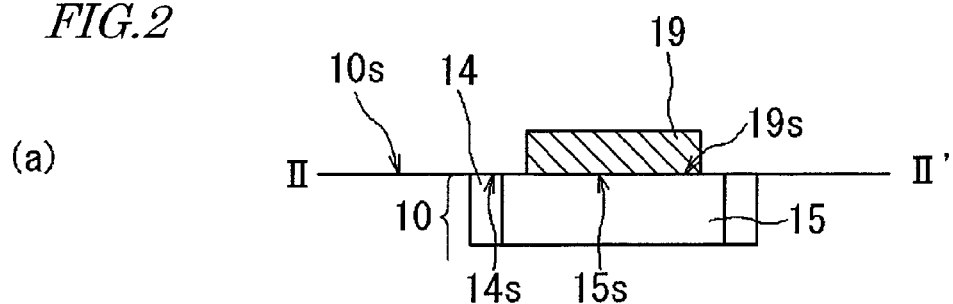
FIG. 2(a) is a schematic cross-sectional view illustrating the arrangement of a source electrode 19, a p$^+$-type contact region 15 and an n-type source region 14 according to the first preferred embodiment.
FIG. 2(b) is a plan view illustrating the conductive surface 19s of the source electrode 19, the p$^+$-type contact region's surface 15s and the n-type source region's surface 14s.
FIG. 2(c) is a plan view illustrating the p$^+$-type contact region's surface 15s and the n-type source region's surface 14s.
Figure 2:
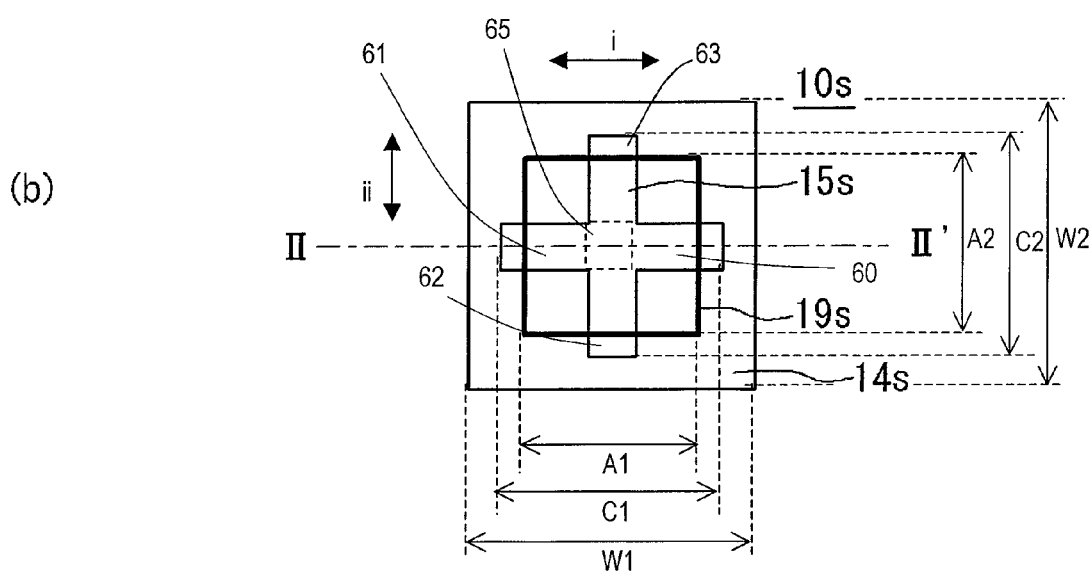
Figure 2:
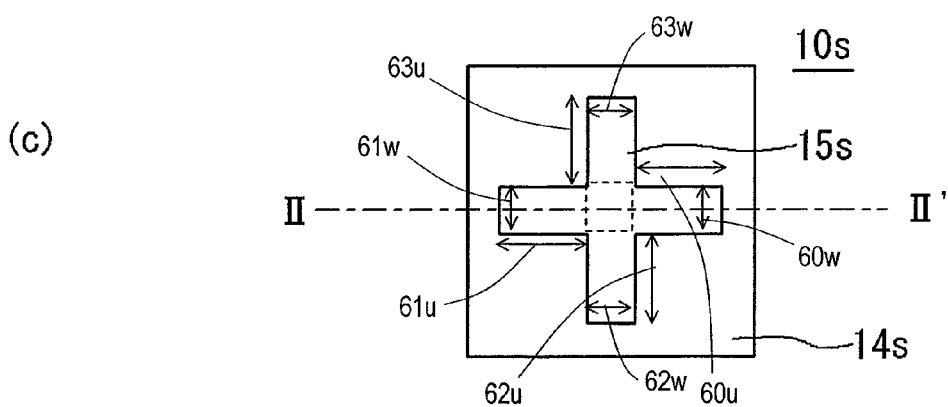

In the example illustrated in FIG. 2, on the surface 10s of the semiconductor layer, the contact region's surface 15s has a cross shape. More specifically, the contact region's surface 15s has a strip portion 60 that runs along a first axis i, another strip portion 61 that runs along the first axis i in the opposite direction to the strip portion 60, a strip portion 62 that runs along a second axis ii that intersects with the first axis i at right angles, and another strip portion 63 that runs along the second axis ii in the opposite direction to the strip portion 62. These strip portions 60 to 63 are connected to a base portion 65, which is located at the center of the contact region's surface 15s. Also, those strip portions 60 to 63 extend across their associated sides of the periphery of the conductive surface 19s toward the ends (or sides) of the source region 14.

In this preferred embodiment, the respective widths 60w and 61w of the strip portions 60 and 61 as measured perpendicularly to the first axis i are equal to the respective widths 62w and 63w of the strip portions 62 and 63 as measured perpendicularly to the second axis ii and may be 0.8 µm, for example. On the other hand, the widths C1 and C2 of the contact region's surface 15s as measured along the first and second axes i and ii are both 4.4 µm, for example. And the length 60u and 61u of the strip portions 60 and 61 as measured along the first axis i and the length 62u and 63u of the strip portions 62 and 63 as measured along the second axis ii are all 1.8 µm.

The n-type source region's surface 14s is defined so as to surround the contact region's surface 15s entirely. In this example, the source region's surface 14s has a quadrangular shape with sides running along the first and second axes i and ii. More specifically, the n-type source region's surface 14s has a square shape, each side W1, W2 of which has a length of 5.6 µm, for example. Likewise, the conductive surface 19s of the source electrode 19 also has a quadrangular shape with sides running along the first and second axes i and ii. In this example, the conductive surface 19s has a square shape, each side A1, A2 of which has a length of 3 µm, for example.

The shapes and sizes of the contact region's surface 15s, the source region's surface 14s and the conductive surface 19s are not particularly limited but are appropriately determined so that the widths C1 and C2 of the contact region's surface 15s as measured along the first and second axes i and ii are smaller than the widths W1 and W2 of the source region's surface 14s, but larger than the widths A1 and A2 of the conductive surface 19s, as measured along the first and second axes i and ii. That is why the contact region is arranged so that even if misalignment has occurred, the ends of the strip portions 60 to 63 that are located closest to the source region still protrude from the conductive surface 19s. The rest of the strip portions 60 to 63 and the base portion 65 are in contact with the conductive surface 19s.

In general, the contact region 15 is normally defined so as to be aligned with the source region 14. That is why according to the precision of equipment for use to perform a photolithographic process, a misalignment of approximately 0.2 µm could be caused between the contact region 15 and the source region 14. Thus, the contact region 15 and the source region 14 are preferably designed with such a possible misalignment taken into account so that the minimum distance between the profile (i.e., periphery) of the contact region's surface 15s and that of the source region's surface 14s becomes 0.2 µm or more. Then, even if misalignment occurred, the contact region 15 would still be surrounded with the source region 14 safely on the surface 10s of the semiconductor layer. As a result, a sufficient effective channel width would be ensured.

According to this preferred embodiment, the source electrode 19, the n-type source region 14 and the p$^+$-type contact region 15 are designed as described above, and therefore, even if misalignment occurred between the source electrode 19 and the p$^+$-type contact region 15, the device performance would still be quite acceptable. The reason will be described with reference to the accompanying drawings.

Portions (a) and (b) of FIG. 3 illustrate an ideal situation where the conductive surface 19s of the source electrode 19 has been arranged just as designed on the surface 10s of the semiconductor layer. On the other hand, portions (a) and (b) of FIG. 4 illustrate a situation where the conductive surface 19s of the source electrode 19 has shifted from its designed location by Δx in the x direction. Specifically, respective portions (a) of FIGS. 3 and 4 are schematic cross-sectional views illustrating a portion of the unit cell 100, while respective portions (b) of FIGS. 3 and 4 are plan views illustrating the surface 10s of the semiconductor layer.

It should be noted that such a misalignment could be caused mainly in two directions (x, y) that intersect with each other at right angles and their opposite directions (−x, −y) due to a positioning error of a photomask. In this example, the device is designed so that the directions in which the strip portions run (i.e., the first and second axes i and ii) are substantially parallel to the x and y directions, respectively.

In a situation where an off-cut substrate is used as the substrate 11, when an epitaxial layer is deposited on an off-cut substrate on which an alignment mark (which is either depressed or raised with respect to its surrounding portion and which is an indispensable mark to get mask alignment done during a photolithographic process) has been left in advance, the alignment mark could be deformed and therefore misalignment would occur easily substantially parallel to the off-cut direction. The off-cut substrate could be a so-called "epi-substrate" on which an epitaxial layer has already been deposited. That is why the device may be designed so that at least one of the strip portions 60 to 63 runs parallel to the off-cut direction (e.g., so that the first axis i is parallel to the off-cut direction). Then, the effects of the present invention can be achieved more securely.

As shown in portions (a) and (b) of FIG. 3, if the misalignments Δx and Δy are zero, the conductive surface 19s is arranged on the semiconductor layer so that the respective ends of the strip portions protrude by 0.7 µm each from the conductive surface 19s. In the ON state, electrons supplied from the source electrode 19 flow through the interface between the n-type source region 14 and the conductive surface 19s and its entire periphery toward a channel layer (not shown). In this case, as indicated by the arrows in shown in portion (b) of FIG. 3, the electrons flow over the entire n-type source region's surface 14s, and therefore, the gate width does not decrease effectively.

On the other hand, in a situation where the conductive surface 19s has shifted by Δx from its designed location in the x direction, if the absolute value of Δx is a half or less of the difference between the respective widths C1 and A1 of the contact region's surface 15s and the conductive surface 19s as measured in the x direction (i.e., if $0<|\Delta x|\leq(C1-A1)/2$), then the conductive surface 19s will be arranged so that its periphery crosses the strip portions 60 to 63 as shown in portions (a) and (b) of FIG. 4. That is why the area $S_1$ of a portion of the contact region's surface 15s that contacts with the conductive surface 19s (which will be simply referred to herein as an "area of contact $S_1$") becomes substantially equal to the area of contact S0 in a situation where the misalignments are zero (see portion (b) of FIG. 3). If the absolute value of the misalignment Δx further increases (i.e., if $|\Delta x|>(C1-A1)/2$), then the area of contact $S_1$ becomes smaller than $S_0$. Even so, the magnitude of the decrease is represented by the following equation:

Decrease in area of contact=width of strip portion×
($|\Delta x|-(C1-A1)/2$)

which is much smaller than the magnitude of decrease of the conventional device (see FIGS. 40 and 42, for example).

Consequently, according to this preferred embodiment, even if misalignment has occurred, the area of contact between the contact region's surface 15s and the conductive surface 19s can be kept substantially constant, thus avoiding an unwanted situation where the contact resistance increases due to a decrease in the area of contact. To achieve this effect securely, the differences (C1−A1) and (C2−A2) between the widths C1 and C2 of the contact region's surface 15s and the widths A1 and A2 of the conductive surface 19s as measured in the x and y directions preferably fall within the range of 1.0 µm to 2.0 µm (e.g., 1.4 µm in this example), although it depends on the ranges of the degrees of misalignment $\Delta x$ and $\Delta y$.

Also, as shown in portion (b) of FIG. 4, once misalignment has occurred, a zone Y1 where the electrons supplied from the source electrode 19 flow just barely (which will be simply referred to herein as an "electron barely flowable zone") is produced in a portion of the n-type source region's surface 14s that is located on the left-hand side of the $p^+$-type contact region's surface 15s, although its area depends on the degree of the misalignment $\Delta x$. Also, if the $p^+$-type contact region's surface 15s protrudes from the n-type source region's surface 14s in four directions, then four electron barely flowable zones Y0, Y1, Y2 and Y3 will be produced. However, as some electrons will bypass the n-type source region's surface 14s, those electron barely flowable zones Y0 to Y3 can be much smaller than the electron non-flowable zone X in the conventional semiconductor device that has already been describe with reference to portions (a) and (b) of FIG. 40. Supposing a portion of the electron barely flowable zone Yn (where n=0, 1, 2 or 3) that crosses the periphery of the n-type source region's surface 14s has a length Ym (where m=a, b, c or d) as shown in portion (c) of FIG. 4, the condition Ya+Yb+Yc+Yd<Xa can be set by appropriately determining the respective widths 60w, 61w, 62w and 63w of the $p^-$-type contact region's surface 15s to be 0.8 µm, for example. This is because the length Z of a portion of the conductive surface 19s that crosses the contact region's surface 15s can be shorter than the length Z shown in portion (b) of FIG. 40. As a result, the effective gate width can be greater than that of the conventional device. It should be noted that if the degree of misalignment $\Delta x$ is approximately 0.5 µm, for example, then the electron barely flowable zone Y2 would not reach the left end of the source region's surface 14s or Yb would be very small even if the zone Y2 reached the left end. As a result, electrons would flow through approximately the entire left end portion of the source region's surface 14s. Consequently, the effective gate width becomes approximately equal to the one in the ideal situation shown in portions (a) and (b) of FIG. 3.

As can be seen, according to this preferred embodiment, even if misalignment has occurred, a sufficient effective gate width can be ensured with the increase in contact resistance between the contact region's surface 15s and the conductive surface 19s minimized, thereby realizing device performance comparable to a situation where there is no misalignment at all. In the example described above, the conductive surface 19s is supposed to shift in the x direction. However, the same statement would apply even if the conductive surface 19s shifted in the −x direction or in the y or −y direction that intersects with the x direction at right angles.

Hereinafter, it will be described in further detail why the length Z can be so small according to this preferred embodiment even if misalignment has occurred.

Portions (a) to (c) of FIG. 5 are plan views illustrating how the relative arrangement of the conductive surface 19s with respect to the $p^+$-type contact region's surface 15s changes according to the degree of misalignment $\Delta x$ in the semiconductor device of this preferred embodiment. On the other hand, portions (a) to (c) of FIG. 6 are plan views illustrating how the relative arrangement of the conductive surface 109s with respect to the contact region's surface 105s changes according to the degree of misalignment $\Delta x$ in the conventional semiconductor device that has already been described with reference to FIGS. 38 to 40.

It should be noted that in the conventional semiconductor device shown in portions (a) to (c) of FIG. 6, the shape of the conductive surface 109s is supposed to be the same as that of the conductive surface 19s of this preferred embodiment. That is to say, in this example, the conductive surface 109s is supposed to have a length of 3 µm each side. Meanwhile, FIGS. 7(a) and 7(b) are graphs showing how the length Z of a portion of the periphery of the conductive surface 19s or 109s that crosses the $p^+$-type contact region's surface 15s or 105s changes with the degrees of misalignment $\Delta x$ and $\Delta y$ in the semiconductor device of this preferred embodiment and in the conventional semiconductor device, respectively.

As shown in portions (a) to (c) of FIG. 5, according to this preferred embodiment, even if the degree of misalignment $\Delta x$ between the conductive surface 19s and the $p^+$-type contact region's surface 15s increases from zero, the length Z of that portion of the periphery of the conductive surface 19s that crosses the $p^+$-type contact region's surface 15s remains the same.

The relation between $\Delta x$ and the length Z can be represented by the line 72 shown in FIG. 7(a). It can be seen that the length Z is constant and does not change at all with the degree of misalignment $\Delta x$. More specifically, the length Z does not change with the degree of misalignment $\Delta x$ as long as the degree of misalignment $\Delta x$ falls within a tolerance range (e.g., until the degree of misalignment $\Delta x$ exceeds 1.1 in this example). However, as shown in portion (c) of FIG. 5, when $\Delta x=0.7$, for example, the periphery of the conductive surface 19s no longer crosses the $p^+$-type contact region's surface 15s on the right-hand side of the $p^+$-type contact region's surface 15s. And once $\Delta x$ exceeds 0.7, the area of contact between the $p^-$-type contact region's surface 15s and the conductive surface 19s starts to decrease. For that reason, in this example, $0 \leq |\Delta x| < 0.7$ is preferably satisfied. In the example described above, the conductive surface 19s is supposed to shift in the x direction with respect to the $p^+$-type contact region's surface 15s. However, even if the conductive surface 19s shifts in the y direction that intersects with the x direction at right angles, the relation between the degree of misalignment $\Delta y$ and the length Z will also be represented by a similar one to the line 72.

On the other hand, in the conventional semiconductor device, as the degree of misalignment $\Delta x$ between the conductive surface 109s and the contact region's region 105s is increased from zero, the periphery of the conductive surface 109s does not overlap with the contact region's surface 105s and the length Z of a portion of the conductive surface 109s that crosses the contact region's surface 105s is zero until $\Delta x$ reaches 0.45 µm as shown in portions (a) through (c) of FIG. 6. Once $\Delta x$ reaches 0.45 µm, however, the length Z starts to change discontinuously and becomes equal to the length of each side of the contact region's surface 105s (Z may be 2.1 μm, for example, in that case). After that, even if the degree of misalignment Δx is increased to 1.5 μm (which is a half as long as the width Δx of the conductive surface 19s), the length Z remains 2.1 μm. Thus, the relation between the degree of misalignment Δx and the length Z is represented by the line 76 shown in FIG. 7(b). Even if the conductive surface 109s shifts in the y direction with respect to the p+-type contact region's surface 105s, the relation between the degree of misalignment Δy and the length Z will also be represented by a similar one to the line 76.

As can be seen from FIGS. 7(a) and 7(b), while the degree of misalignment Δx, Δy is less than 0.45 μm, the length Z in the conventional semiconductor device is zero, which is smaller then the length Z in the semiconductor device of this preferred embodiment. However, even in the semiconductor device of this preferred embodiment, the length Z (which may be 0.8 μm) is far smaller than the width of the conductive surface 19s, and therefore, a good number of electrons will bypass a portion of the n-type source region 14 that is located on the left-hand side of the conductive surface 19s. That is why the electron barely flowable zone Y will not reach the left end of the source region's surface 14s, and therefore, the effective gate width will never decreases. Consequently, as long as the degrees of misalignment Δx and Δy are less than 0.45 μm, both the semiconductor device of this preferred embodiment and the conventional semiconductor device can achieve as good MOSFET performance as in an ideal situation where there is no misalignment at all.

However, if the degree of misalignment Δx, Δy falls within the range of 0.45 μm to less than 0.7 μm, the conventional semiconductor device has as large a length Z as 2.1 μm and comes to have a decreased effective gate width (see FIG. 40). In the semiconductor device of this preferred embodiment, on the other hand, the length Z is much shorter than the length Z in the conventional semiconductor device, and therefore, the influence of the electron barely flowable zone Y on the effective gate width can be reduced compared to the conventional device.

The degree of misalignment to be caused in an actual photolithographic process is normally 1.0 μm or less, preferably 0.5 μm or less. However, the degree of misalignment Δx or Δy to be caused in an actual photolithographic process is determined by not just the precision of an exposure system for use in the photolithographic process but also other factors as well. Examples of those other factors include the warp of the semiconductor substrate, patterning errors that could occur in an etching or epitaxy process, and expansion, shrinkage or size shift of the substrate, film, mask and so on. If multiple factors were involved at the same time, the degree of misalignment could be greater than the expected one (e.g., could be 0.5 μm or more). Even so, according to the arrangement of this preferred embodiment, even if the degree of misalignment increased, the length Z could still be kept short and therefore the ON-state resistance should be reduced compared to the conventional device.

It has been proposed that in a vertical MOSFET that uses an Si layer as its semiconductor layer, the surface of a well region to contact with a source electrode have either a cross shape or an X-shape (see Japanese Patent Application Laid-Open Publications Nos. 5-335584, 11-330469, 7-66392 and 2004-104003, for example). In these Si-MOSFETs, there is no need to provide a contact region to reduce the contact resistance between the source electrode and the well region unlike the SiC-MOSFET, and therefore, the well region, the source region and the conductive surface of the source electrode are all in contact with each other.

In the Si-MOSFETs proposed in those prior documents, a cross- or X-shaped well region is defined, thereby dividing the source region into four. The reason will be described below.

In an Si-MOSFET, a well region 124 is defined by thermally diffusing a dopant that has been implanted through an opening 126 into an Si layer as shown in FIG. 44(a). For that reason, the well region 124 has a lower dopant concentration at its corners than the rest. That is why if a channel were formed at such corners of the well region 124, the threshold voltage in such a corner channel would be lower than the one in a channel formed elsewhere, and therefore, the channel surface would invert more easily. As a result, leakage current would be produced more easily when the Si-MOSFET is in OFF-state.

Thus, to overcome such a problem, Japanese Patent Application Laid-Open Publication No. 2004-104003 proposes an arrangement in which on the surface of an Si layer, the source region 125 is divided by an X-shaped well region 124 so as not to be arranged at the corners of the well region 124 as shown in FIG. 44(b). In that case, since no channels are formed at any corner of the well region 124, the leakage current described above can be reduced. On the other hand, Japanese Patent Application Laid-Open Publication No. 7-66392 proposes an arrangement in which the source region is divided by a cross-shaped well region in order to substantially decrease the contact resistance in a portion of the base region with a low dopant concentration. In this manner, it is possible to prevent a parasitic transistor from being turned ON when no gate voltage is applied. Likewise, Japanese Patent Application Laid-Open Publication No. 11-330469 also discloses an arrangement in which the source region is divided by a cross-shaped base region. Furthermore, Japanese Patent Application Laid-Open Publication No. 5-335584 also discloses that an X-shaped well region is defined in order to keep a parasitic transistor from operating easily.

As can be seen, according to the prior documents cited above, a cross-shaped well region, for example, is defined on the surface of an Si layer for a quite different purpose from the present invention's. Also, the well region is defined so as to divide the source region into four and is not surrounded with the source region. This is because if the well region were surrounded with the source region, a channel would be formed at the corners of the well region.

On the other hand, in a MOSFET that uses an SiC layer as its semiconductor layer, the dopant that has been implanted into the SiC layer hardly diffuses even when annealed. As a result, the dopant concentration at the corners of the well region will be almost as high as anywhere else. That is why even if a channel were formed at any corner of the well region, the leakage current problem described above would not arise easily. To the contrary, to further increase the effective gate width, the channel would rather be formed over the entire periphery of the well region's surface. For that reason, the arrangement disclosed in those prior documents should not be applied to the SiC-MOSFET.

According to the present invention, to overcome the SiC's particular problem that the device performance would deteriorate due to misalignment, a p+-type contact region 15 with strip portions is formed on the SiC layer's surface 10s, and is entirely surrounded with an n+-type source region 14. As a result, the problem described above can be overcome with a sufficient gate width ensured by forming a channel over the entire periphery of the well region 13.

According to this preferred embodiment, the conductive surface 19s and the p+-type contact region's surface 15s may have any shapes as long as the length Z can be kept short enough even if the degree of misalignment Δx, Δy increases and as long as the ratio of the area of contact of the p$^+$-type contact region's surface 15s with the conductive surface 19s to that of the source region's surface 14s with the conductive surface 19s is substantially constant.

According to this preferred embodiment, the p$^+$-type contact region's surface 15s just needs to have at least one first-directed strip portion that runs along the first axis i and does not have to have the shape that has already been described with reference to FIGS. 1 through 4. The size of the contact region's surface 15s is not particularly limited, either, as long as the width C1 of the contact region's surface 15s as measured along the first axis i is greater than the width A1 of the conductive surface 19s as measured along the first axis i and as long as the periphery of the conductive surface 19s crosses the at least one first-directed strip portion 60, 61. That is why although not shown, the contact region's surface 105s may consist of only strip portions that run parallel to the first axis i. Even when such an arrangement is adopted, a sufficient area of contact can be ensured between the conductive surface 19s and the contact region's surface 15s and the increase in ON-state resistance can be minimized effectively enough.

As in the preferred embodiment described above, the contact region's surface 15s preferably further has at least one second-directed strip portion 62, 63 that runs along a second axis ii that is not parallel to the first axis i. Then, the effect described above can always be achieved no matter in which direction misalignment occurs. The first and second axes i and ii in the preferred embodiment described above are supposed to be, but do not have to be, parallel to the x and y directions, respectively.

Also, in the preferred embodiment described above, the first-directed strip portions of the contact region 15 include two strip portions 60 and 61 that run in mutually opposite directions along the first axis i and the second-directed strip portions thereof include two strip portions 62 and 63 that run in mutually opposite directions along the second axis ii. That is why even if misalignment occurred in any of x, y, −x and −y directions, the variation in the area of contact can always be substantially uniform. Furthermore, the widths 60w and 61w of the strip portions 60 and 61 as measured perpendicularly to the first axis are substantially constant along the first axis i. Likewise, the widths 62w and 63w of the strip portions 62 and 63 as measured perpendicularly to the second axis ii are substantially constant along the second axis ii. In that case, even if misalignment has occurred, the area of contact between the semiconductor region 15 of the first conductivity type and the conductive surface 19s can be kept substantially constant. To ensure a sufficient area of contact between the semiconductor region 15 of the first conductivity type and the conductive surface 19s, the widths 60w to 63w are preferably 0.4 μm or more, for example. On the other hand, to check the increase in ON-state resistance with the electron non-flow-able zone Y of the source region 14 minimized, the widths 60w to 63w are preferably one third or less of the length of each side of the conductive surface 19s. In this preferred embodiment, the conductive surface 19s has a length of 3 μm each side, and therefore, the widths 60w to 63w are preferably 1 μm or less. Naturally, if the size of the conductive surface 19s increases, then the widths 60w to 63w can also be increased accordingly.

The lengths 60u and 61u of the strip portions 60 and 61 that form the first pair as measured along the first axis i are preferably 1.0 μm or more. Then, even if misalignment of 0.5 μm occurred in any of the x and −x directions, the effect described above should be achieved safely. Likewise, the lengths 62u and 63u of the strip portions 62 and 63 that form the second pair as measured along the second axis ii are also preferably 1.0 μm or more. However, the upper limits of these lengths are not particularly limited but could be any values as long as those lengths are less than a half of the lengths C1 and C2 of the source region's surface 14s as measured along the first and second axes i and ii.

Furthermore, the contact region's surface 15s preferably has a symmetrical shape with respect to a point. Then, no matter in which direction misalignment has occurred, the deterioration in device performance due to that misalignment can be reduced more effectively.

The size and shape of the base portion 65 of the semiconductor region 15 of the first conductivity type are not particularly limited, either. The width of the base portion 65 as measured along the first axis i may be greater than the widths 62w and 63w of the strip portions 62 and 63 that form the second pair and the width of the base portion 65 as measured along the second axis ii may be greater than the widths 60w and 61w of the strip portions 60 and 61 that form the first pair. An arrangement with such a base portion 65 is illustrated in FIG. 8 as an example.

In the example illustrated in FIG. 8, a p$^+$-type contact region's surface 15s in a cross shape is arranged on the source region's surface 14s, and a base portion 65 that has a bigger size than the intersection of the cross is arranged at the intersection (i.e., the center) of the cross. With such an arrangement, the area of contact between the p$^+$-type contact region's surface 15s and the conductive surface 19s can be further increased around the center region. In this example, the p$^+$-type contact region's surface 15s has a shape in which two rectangles, each having a width of 0.8 μm and a length of 4.4 μm, cross each other at right angles with their barycenters aligned with each other and in which a square pattern having a size of 1.6 μm each side is superposed on their intersection. In this case, the square portion with a size of 1.6 μm each side serves as a base portion and the other portions of those rectangles that do not overlap with the base portion serve as the strip portions 60 to 63.

According to such an example, even if the degree of misalignment Δx, Δy increased, the ratio of the area of contact of the p$^+$-type contact region's surface 15s with the conductive surface 19s to that of the source region's surface 14s with the conductive surface 19s could still be kept substantially constant. Optionally, the lengths and widths of the strip portions 60 to 63 and the shape and size of the base portion could be changed. In the example described above, the conductive surface 19s is supposed to have a square shape. However, the conductive surface 19s may also have a rectangular shape or any other shape as long as the relation described above is satisfied.

If such a base portion 65 that has a greater width than the strip portions 60 to 63 is provided as in the example illustrated in FIG. 8, then the width of the conductive surface 19s is preferably determined to be greater than that of the base portion 65 but smaller than that of the contact region's surface 15s. Then, even if misalignment has occurred, the entire base portion 65 can be brought into contact with the conductive surface 19s easily. As a result, a sufficient area of contact can be ensured more securely between the contact region's surface 15s and the conductive surface 19s. On top of that, since the periphery of the conductive surface 19s can be arranged over the strip portions 60 to 63 more easily, the decrease in the area of contact due to misalignment can be minimized.

In this preferred embodiment, the conductive surface 19s of the source electrode and the source region's surface 14s do not have to have the quadrangular shapes illustrated in the drawings. Rather, the conductive surface 19s of this preferred embodiment may have any other polygonal shape (which may be a quadrangular, pentagonal, hexagonal, heptagonal or octagonal shape), of which some sides are parallel to the first axis i and other sides are parallel to the second axis ii. Then, a portion of the periphery of the conductive surface 19s that crosses the contact region's surface 15s can have a substantially constant length Z. Specifically, the length Z becomes equal to the widths 60w to 63w of the strip portions. That is why by controlling the widths 60w to 63w of the strip portions, the ON-state resistance can be reduced with the electron non-flowable zone Y minimized. Furthermore, even if the degree of misalignment increased, the area of contact between the contact region's surface 15s and the conductive surface 19s could still be substantially constant, thus substantially preventing the parasitic transistor from being turned ON unintentionally. Optionally, the conductive surface 19s could have a polygonal shape, of which some diagonals are parallel to the first axis i and other diagonals are parallel to the second axis ii, as in the preferred embodiment to be described later.

In this preferred embodiment, the surface 10s of the semiconductor layer is supposed to be flat for the sake of simplicity. Actually, however, a portion of the semiconductor layer's surface 10s that is in contact with the source electrode 19 could be lower in level than the rest of the semiconductor layer's surface 10s that is not in contact with the source electrode 19. As described above, the source electrode 19 is formed by depositing a conductive material on the semiconductor layer 10 and then subjecting the material to a high-temperature annealing process.

The source electrode 19 obtained by such a method includes a reaction layer that has been formed through a reaction between silicon carbide included in the semiconductor layer 10 and the conductive material that makes the source electrode 19. And the lower surface of that reaction layer, i.e., the conductive surface 19s of the source electrode 19, should be located at a lower level than the semiconductor layer's surface 10s before the reaction layer is formed.

Also, due to a size shift that has been caused by some system jam or the deviation of a patterning condition, the conductive surface 19s or 109s may have a smaller size than the designed one. In that case, the ratio in the area of the contact region's surface 15s or 105s to the conductive surface 19s or 109s will increase. And even if the degree of misalignment $\Delta x$ or $\Delta y$ is small, the conductive surface 109s is likely to overlap with the contact region's surface 105s. Then, significant effects can be achieved by applying the present invention.

If the $p^+$-type contact region 15 and the source electrode 19 are formed by a photolithographic process, for example, the $p^+$-type contact region's surface 15s and the conductive surface 19s of the source electrode 19 may have shapes that are not just as designed as being affected by the resolution of the photolithographic process. More specifically, even if those shapes are designed to be polygonal, the actual shapes could have rounded corners. Even so, as long as the $p^+$-type contact region's surface 15s and the conductive surface 19s are designed so as to satisfy the relation between the degree of misalignment $\Delta x$, $\Delta y$ and the length Z according to the present invention, the deterioration in device performance due to the misalignment can also be minimized. Thus, such a situation also falls within the scope of the present invention.

Manufacturing Process

The semiconductor device of this preferred embodiment may be fabricated by the following method, for example.

Figure 9:
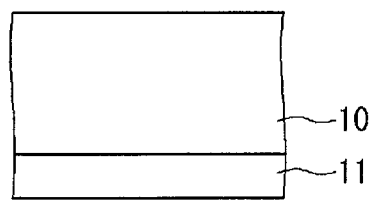
Figure 9:
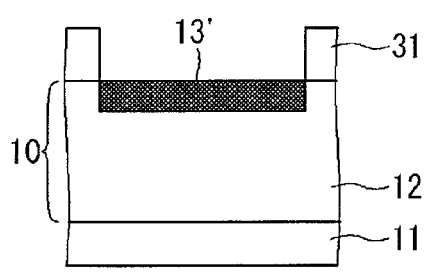
Figure 9:
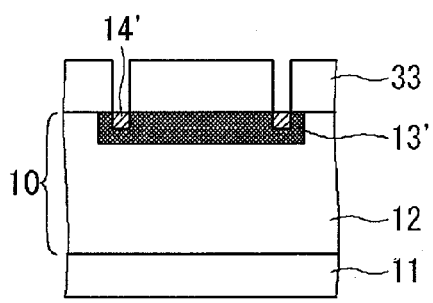
Figure 9:
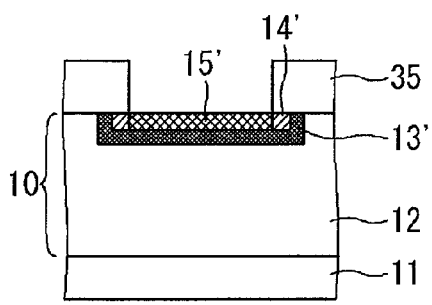
Figure 9:
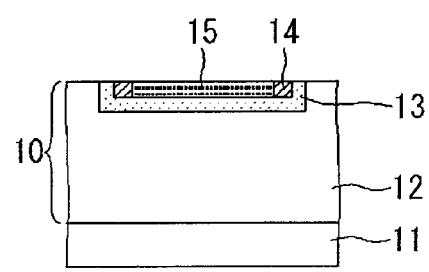
Figure 9:
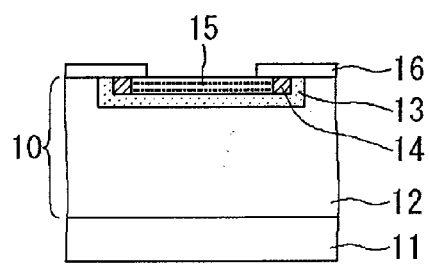
Figure 9:
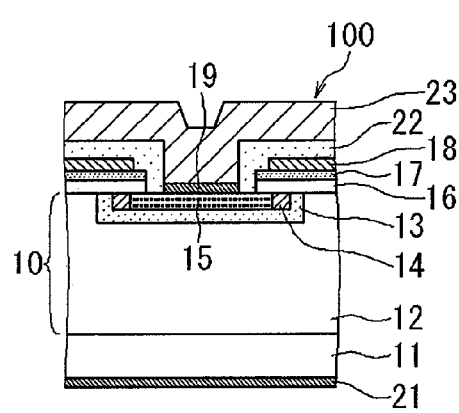

First, as shown in FIG. 9(a), a silicon carbide layer is formed as a semiconductor layer 10 on a substrate 11 of silicon carbide. As the substrate 11, a 4H—SiC substrate with a diameter of 3 inches, of which the principal surface defines an off-cut angle of eight degrees in [11-20] (one, one, two bar, one) directions from (0001) planes, may be used, for example.

The conductivity type of the substrate 11 is n-type and the carrier density thereof is $1 \times 10^{19}$ cm$^{-3}$. The semiconductor layer may be formed by a CVD process using an annealing furnace. In this preferred embodiment, a silicon carbide layer doped with an n-type dopant is grown epitaxially on the principal surface of the substrate 11. The thickness of the semiconductor layer 10 changes with the specification the semiconductor device should satisfy but is typically adjusted within the range of 5 μm to 100 μm. Also, the dopant concentration of the semiconductor layer 10 is appropriately controlled within the range of $1 \times 10^{14}$ cm$^{-3}$ to $1 \times 10^{17}$ cm$^{-3}$. Optionally, a buffer layer made of n-type silicon carbide may be inserted between the substrate 11 and the semiconductor layer 10. The buffer layer may have a dopant concentration of $1 \times 10^{18}$ cm$^{-3}$ and a thickness of 1 μm.

Next, as shown in FIG. 9(b), a first dopant ion implanted layer 13' (with a thickness of 1 μm, for example) is formed in a selected portion of the semiconductor layer 10.

Specifically, first, a mask layer 31 of silicon dioxide (SiO$_2$), for example, is formed on the surface of the semiconductor layer 10. The mask layer 31 has an opening that defines the portion of the semiconductor layer 10 that will be the first dopant ion implanted layer 13'. The mask layer 31 may be formed in an arbitrary pattern by photolithographic and etching processes. In this example, the shape of the opening of the mask layer 31 is designed such that the first dopant ion implanted layer 13' will have a square surface shape (with a length of 6.6 μm each side). The thickness of the mask layer 31 is determined by its material and the implantation condition but is preferably much greater than the implantation range.

Next, p-type dopant ions (such as Al ions) are implanted into the semiconductor layer 10 from over the mask layer 31. During the ion implantation, the temperature of the substrate may be adjusted within the range of 200° C. to 1,000° C. or may even be room temperature. When the ion implantation process is over, the mask layer 31 is removed. In this manner, the first dopant ion implanted layer 13' is formed in that portion of the semiconductor layer 10 into which the dopant ions have been implanted. Meanwhile, the rest of the semiconductor layer 10 into which no dopant ions have been implanted becomes an n-type drift region 12.

Subsequently, as shown in FIG. 9(c), a second dopant ion implanted layer 14' (with a thickness of 0.2 μm, for example) is formed in the semiconductor layer 10. Specifically, first, a mask layer 33 with an opening that exposes a portion of the surface of the first dopant ion implanted layer 13' is formed on the semiconductor layer 10.

In this example, the shape of the opening of the mask layer 33 is designed such that the second dopant ion implanted layer 14' will have a square surface shape (with a length of 5.6 μm each side, for example). The mask layer 33 may be made of the same material, and formed by the same process, as the mask layer 31. Next, n-type dopant ions (such as nitrogen ions or phosphorus ions) are implanted into the semiconductor layer 10 from over the mask layer 33. When the ion implantation process is over, the mask layer 33 is removed. In this manner, the second dopant ion implanted layer 14' is formed in the first dopant ion implanted layer 13'.

Furthermore, as shown in FIG. 9(d), a third dopant ion implanted layer 15' is formed in the semiconductor layer 10. Specifically, the third dopant ion implanted layer 15' is formed by defining a mask layer 35 with an opening that exposes a portion of the first dopant ion implanted layer 13' on the semiconductor layer 10 and then implanting p-type dopant ions (such as aluminum ions) into the semiconductor layer 10 from over the mask layer 35. The shape of the opening of the mask layer 35 is designed such that the surface of the third dopant ion implanted layer 15' will have a cross shape such as the one shown in FIG. 2(c). When the ion implantation process is over, the mask layer 35 is removed.

Subsequently, as shown in FIG. 9(e), the first, second and third dopant ion implanted layers 13', 14' and 15' are annealed at an elevated temperature of about 1,700° C. and have their dopants activated, thereby defining a p-type well region 13, an n-type source region 14 and a p$^+$-type contact region 15, respectively.

The carrier densities of the p-type well region 13 and the n-type source region 14 thus defined are determined by the conditions of the ion implantation process steps described above, and are controlled so as to fall within the range of $1 \times 10^{17}$ cm$^{-3}$ to $1 \times 10^{19}$ cm$^{-3}$ and the range of $1 \times 10^{18}$ cm$^{-3}$ to $1 \times 10^{21}$ cm$^{-3}$, respectively. On the other hand, the carrier density of the p$^+$-type contact region 15 is controlled so as to be higher than that of the p-type well region 13.

Next, as shown in FIG. 9(f), a channel layer 16 of n-type silicon carbide is epitaxially grown on the semiconductor layer 10 and an opening is cut through the channel layer 16 to expose the n-type source region 14. The average dopant concentration in the channel layer 16 is controlled so as to fall within the range of $1 \times 10^{15}$ cm$^{-3}$ to $1 \times 10^{18}$ cm$^{-3}$. The channel layer 16 may have either a single layer structure or a multilayer structure.

Thereafter, as shown in FIG. 9(g), a gate insulating film 17, a source electrode 19, a drain electrode 21, a gate electrode 18, an interlevel dielectric film 22 and an upper interconnect electrode 23 are formed, thereby completing a semiconductor device 100 as a vertical MOSFET.

The gate insulating film 17 may be formed by thermally oxidizing the surface of the channel layer 16 of silicon carbide at a temperature of 1,100° C. to 1,200° C. Alternatively, the gate insulating film 17 may also be formed by depositing a single-layer or multilayer insulating film on the channel layer 16. The thickness of the gate insulating film 17 is controlled within the range of 20 nm to 200 nm. Meanwhile, the gate electrode 18 may be formed by depositing a polysilicon film or a metal film with low resistivity on the gate insulating film 17 and then patterning it.

The source electrode 19 may be formed in the following manner. Specifically, after the gate insulating film 17 and the gate electrode 18 have been formed, an interlevel dielectric film 22 is deposited so as to cover the gate electrode 18. Then, an opening is cut through that interlevel dielectric film 22 to expose a portion of the surface of the semiconductor layer 10.

Thereafter, a conductive material such as Ni is deposited at the bottom of the opening and then annealed at a high temperature as described above, thereby forming a source electrode 19. As a result of the annealing process, the conductive material reacts with silicon carbide in the semiconductor layer 10, thereby forming a reaction layer.

That is why at least a portion of the source electrode 19 thus obtained is such a reaction layer. And due to the presence of that reaction layer, the source electrode 19 thus obtained can make good ohmic contact with the p$^+$-type contact region 15 and the n-type source region 14 in the semiconductor layer 10.

If the source electrode 19 is formed by such a method, the shape of the conductive surface of the source electrode 19 can be adjusted by that of the opening to cut through the interlevel dielectric film 22.

Alternatively, a metal (such as Ni) may be deposited over the entire surface of the interlevel dielectric film with an opening and then annealed at a high temperature to form a reaction layer on the semiconductor layer 10. After that, the excessive metal on the interlevel dielectric film 22 that has not contributed to forming the reaction layer may be removed.

The drain electrode 21 may be formed by depositing a metallic material (such as Ni or Ti) on the back surface of the substrate 11 and then annealing it. The upper interconnect electrode 23 is formed so as to fill the opening of the interlevel dielectric film 22 and is electrically connected to the source electrode 19. As the material of the upper interconnect electrode 23, aluminum may be used, for example.

The source electrode 19 does not have to be formed by the method described above. For example, the source electrode 19 may be formed before the interlevel dielectric film 22 is deposited. Specifically, in that case, the source electrode 19 may be formed by depositing a conductor film over the entire semiconductor layer 10, patterning the conductor film into a predetermined shape and then annealing the remaining portion of the conductor film at an elevated temperature of approximately 1,000° C. According to this method, the shape of the conductive surface of the source electrode 19 can be controlled by patterning the conductor film, and therefore, a conductive surface of a very small size or a polygonal (such as quadrangular) conductive surface can be formed with higher precision. Furthermore, if the source electrode 19 is formed by such a method, an interlevel dielectric film 22 is deposited over the entire surface of the substrate after the source electrode 19 has been formed. Then, an opening may be cut through the interlevel dielectric film 22 by a technique such as dry etching so as to expose a portion of the source electrode 19. And the upper interconnect electrode 23 may be formed so as to fill that opening.

Furthermore, according to the method described above, after the first dopant ion implanted layer 13' to be the well region 13 has been formed using the mask layer 31, the second dopant ion implanted layer 14' to be the source region 14 is formed using the mask layer 33 and then the third dopant ion implanted layer 15' to be the p$^-$-type contact region 15 is formed using the mask layer 35. However, the order in which these dopant ion implanted layers 13', 14' and 15' are formed is not particularly limited. For example, after the third dopant ion implanted layer 15' to be the p$^+$-type contact region 15 has been formed, the second dopant ion implanted layer 14' to be the source region 14 may be formed.

Figure 1:
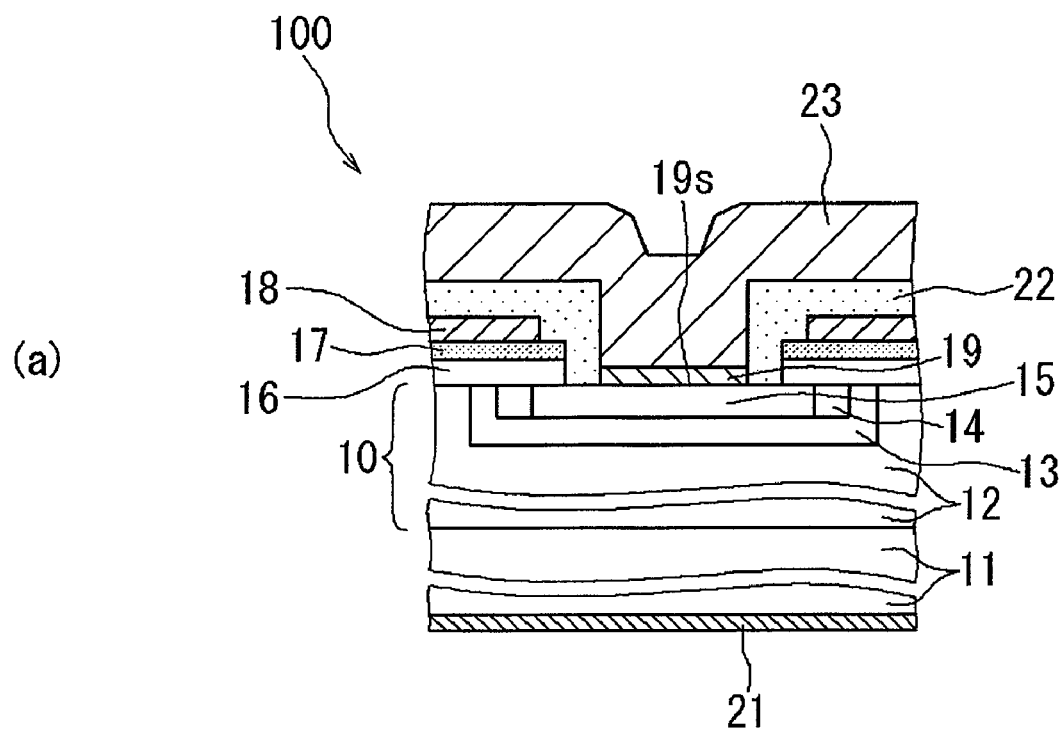
FIGS. 1(a) and 1(b) are respectively a schematic cross-sectional view illustrating a unit cell as a first specific preferred embodiment of the present invention and a plan view illustrating an arrangement of the unit cells.
Figure 1:
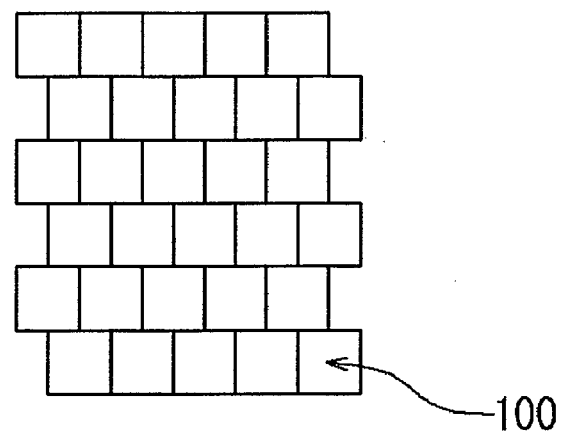

It should be noted that the semiconductor device of this preferred embodiment does not have to have the configuration shown in FIG. 1. For example, although the channel layer 16 of silicon carbide is arranged on the semiconductor layer 10 in the configuration shown in FIG. 1, the channel layer 16 may be omitted as in the semiconductor device shown in FIG. 10. In such a structure with no channel layer 16, a channel can be produced by inverting the conductivity type of the drift region under the gate electrode with a voltage applied to the gate electrode 18.

Embodiment 2

Hereinafter, a second preferred embodiment of a semiconductor device according to the present invention will be described with reference to the accompanying drawings. The semiconductor device of this preferred embodiment is also a vertical MOSFET but is different from its counterpart of any of the preferred embodiments described above in that the source region has a polygonal surface shape on the surface of the semiconductor layer and that the respective strip portions of the contact region extend toward the vertices of the polygonal source region.

The present inventors also discovered via experiments that in the conventional semiconductor device shown in FIG. 41, as the degree of misalignment increased, not just the area of contact between the contact region and the conductive surface of the source electrode decreased but also an another problem would arise as will be described below. Such an additional problem will be described with reference to FIGS. 43(a) and 43(b).

In a semiconductor device such as a vertical MOSFET, current flows instantaneously when the device in ON state is turned OFF. If the p-type well region 103 had high resistance at that moment, the parasitic transistor (i.e., an npn transistor (104, 103, 120)) shown in FIG. 43(b) would be turned ON, thus possibly causing a switching delay or breaking down the device. That is why to prevent such an npn transistor from being turned ON, the resistance in the p-type well region 103 should be reduced. For that purpose, a p+-type contact region 105 with high concentration (i.e., with low resistance) is arranged on the p-type well region 103 so as to have as large an area as possible and an increase in potential at the ends of the p-type well region 103 is minimized, thereby preventing the npn transistor (104, 103, 120) from being turned ON.

On the other hand, as for a p+-type contact region 105 in a diamond shape such as the one shown in FIG. 43(b), there is a longer distance between the p-type well region 103 and the p+-type contact region 105 (as indicated by the arrow 130) than in the arrangement shown in FIG. 39. As a result, the potential in the p-type well region 103 is more likely to rise, thus making it more difficult to prevent the npn transistor (104, 103, 120) from being turned ON.

In view of these considerations, the present inventors carried out extensive research to find an arrangement that could not only ensure a sufficient area of contact between the conductive surface and the source electrode or the contact region but also prevent more effectively the npn transistor from being turned ON unintentionally. As a result, the present inventors discovered that such a problem should be overcome if the strip portions of the contact region run toward the respective vertices of the source region on the surface of the semiconductor layer.

The semiconductor device of this preferred embodiment is a vertical MOSFET that uses silicon carbide. The vertical MOSFET includes at least one unit cell including a semiconductor layer, source and drain electrodes that are electrically connected to the semiconductor layer, and a gate electrode for use to switch the semiconductor device between ON and OFF states, and typically has a structure in which a number of such unit cells are arranged. In the following description, a semiconductor device consisting of a plurality of unit cells with a substantially quadrangular planar shape will be taken as an example.

The semiconductor device of this preferred embodiment has only to be designed such that the conductive surface of the source electrode and the surface of the contact region have the shapes to be described below. That is to say, misalignment may occur between the conductive surface and the contact region during the manufacturing process. It should be noted that the "semiconductor device" of the present invention does not have to be a vertical MOSFET but could be any other device with a semiconductor layer.

FIGS. 11(a) and 11(b) are respectively a schematic cross-sectional view illustrating a unit cell 200 of this preferred embodiment and a plan view illustrating an arrangement of the unit cells 200. FIGS. 12(a) to 12(c) illustrate an arrangement of the source electrode 19, the p+-type contact region 15 and n-type source region 14. Specifically, FIG. 12(a) is a schematic cross-sectional view as viewed on the plane XII-XII' shown in FIGS. 12(b) and 12(c). FIG. 12(b) is a plan view illustrating the source region's surface 14s, the contact region's surface 15s and the conductive surface 19s of the source electrode 19 to be arranged on the surface 10s of the semiconductor layer. And FIG. 12(c) is a plan view illustrating the source region's surface 14s and the contact region's surface 15s. In FIG. 12(a), the line running along a diagonal of the quadrangular conductive surface 19s is identified by XII-XII' to make the arrangement of the conductive surface 19s of the source electrode 19 with respect to the contact region's surface 15s easily understandable. In FIG. 12, any component having substantially the same function as its counterpart of the unit cell 100 shown in FIG. 1 will be identified by the same reference numeral for the sake of simplicity, and the description thereof will be omitted herein.

In this preferred embodiment, on the surface 10s of the semiconductor layer, the contact region's surface 15s has an X-shape and is shaped to include some portions that are not in contact with the conductive surface 19s (i.e., protrude from the conductive surface 19s). That is why even if the degree of misalignment Δx between the conductive surface 19s and the contact region's surface 15s increases, a sufficient area of contact can still be ensured between the contact region's surface 15s and the conductive surface 19s.

More specifically, the contact region's surface 15s has a strip portion 70 that runs along a first axis i, another strip portion 71 that runs along the first axis i in the opposite direction to the strip portion 70, a strip portion 72 that runs along a second axis ii that intersects with the first axis i at right angles, and another strip portion 73 that runs along the second axis ii in the opposite direction to the strip portion 72. These strip portions 70 to 73 are connected to a base portion 79, which is located at the center of the contact region's surface 15s. In this preferred embodiment, the respective widths 70w and 71w of the strip portions 70 and 71 as measured perpendicularly to the first axis i are equal to the respective widths 72w and 73w of the strip portions 72 and 73 as measured perpendicularly to the second axis ii and may be 0.7 μm, for example. On the other hand, the widths C1 and C2 of the contact region's surface 15s as measured along the first and second axes i and ii are both 5 μm, for example. And the length 70u and 71u of the strip portions 70 and 71 as measured along the first axis i and the length 72u and 73u of the strip portions 72 and 73 as measured along the second axis ii are all 2.15 μm.

In this preferred embodiment, both of the first and second axes i and ii define an angle of 45 degrees with respect to the x and y directions, respectively. However, the angle defined by these axes i and ii with respect to the x and y directions are not particularly limited.

The n-type source region's surface 14s is defined so as to surround the contact region's surface 15s entirely. In this example, the source region's surface 14s has a quadrangular shape with sides that are parallel to the x and y directions in which misalignment could occur. More specifically, the source region's surface 14s has a square shape, each side Wx, Wy of which has a length of 5.6 μm, for example. Each of the strip portions 70 to 73 of the contact region's surface 15s runs from the base portion 79 that is located at the center of the contact region's surface 15s toward the n-type source region's surface 14s. The direction in which each of the strip portions 70 to 73 runs is parallel to at least one of the lines that connect together the barycenter and vertices of the polygonal n-type source region's surface 14s.

Meanwhile, the conductive surface 19s of the source electrode 19 also has a quadrangular shape with sides that are parallel to the x and y directions. In this example, the conductive surface 19s has a square shape, each side Δx, Δy of which has a length of 3 μm, for example. That is why in the example illustrated in FIG. 12, the conductive surface 19s has two diagonals that are parallel to the first and second axes i and ii, respectively.

The shapes and sizes of the source region's surface 14s and the conductive surface 19s are not particularly limited but are appropriately determined so that the widths C1 and C2 of the contact region's surface 15s as measured along the first and second axes i and ii are larger than the widths of the conductive surface 19s, but smaller than the widths of the source region's surface 14s, as measured along the first and second axes i and ii. That is why unless misalignment occurs, the strip portions 70 to 73 run from the base portion 79 toward the vertices of the source region 14a beyond their associated vertices of the profile of the conductive surface 19s as shown in FIG. 12. The ends of the strip portions 70 to that are located closest to the source region still protrude from the conductive surface 19s. However, the rest of the strip portions 70 to 73 and the base portion 65 of the contact region's surface 15s are in contact with the conductive surface 19s.

In this preferred embodiment, the source region's surface 14s preferably has a polygonal shape that is selected from the group consisting of quadrangular, pentagonal, hexagonal, heptagonal, and octagonal shapes. Among other things, quadrangular, hexagonal and octagonal shapes are particularly preferred because the contact region's surface can have strip portions that are parallel to the lines that connect together the barycenter and the respective vertices and can also have a shape that is symmetrical with respect to a point.

According to this preferred embodiment, the source electrode 19, the n-type source region 14 and the p$^+$-type contact region 15 are designed as described above, and therefore, even if misalignment occurred between the source electrode 19 and the p$^+$-type contact region 15, the device performance would still be quite acceptable. The reason will be described with reference to the accompanying drawings.

Portions (a) and (b) of FIG. 13 illustrate an ideal situation where the conductive surface 19s of the source electrode 19 has been arranged just as designed on the surface 10s of the semiconductor layer. On the other hand, portions (a) and (b) of FIG. 14 illustrate a situation where the conductive surface 19s of the source electrode 19 has shifted from its designed location by Δx in the x direction. Specifically, respective portions (a) of FIGS. 13 and 14 are schematic cross-sectional views illustrating a portion of the unit cell 100, while respective portions (b) of FIGS. 13 and 14 are plan views illustrating the surface 10s of the semiconductor layer.

In the ideal situation illustrated in portions (a) and (b) of FIG. 13, the respective ends of the four strip portions protrude from the conductive surface 19s. In the ON state, electrons supplied from the source electrode 19 flow through the interface between the n-type source region 14 and the conductive surface 19s and its entire periphery toward a channel layer (not shown). In this case, the electrons flow over the entire n-type source region's surface 14s, and therefore, the gate width does not decrease effectively.

On the other hand, even if the conductive surface 19s has shifted by Δx from its designed location to the right (i.e., in the x direction), there will be substantially no zone in which the electrons supplied from the source electrode 19 do not flow as shown in portions (a) and (b) of FIG. 14. This is quite different from the electron non-flowable zone X in the conventional semiconductor device that has already been described with reference to portions (a) and (b) of FIG. 40. For example, if the degree of misalignment is approximately as large as what is illustrated (i.e., Δx=0.5 μm), then electrons will flow through the entire left end portion of the source region's surface 14s and the gate width does not decrease substantially. Consequently, the MOSFET performance achieved would be almost as high as in the ideal situation shown in portions (a) and (b) of FIG. 13.

Also, since the conductive surface 19s is arranged so that its periphery crosses the four strip portions, the area of contact $S_1$ between the contact region's surface 15s and the conductive surface 19s is almost equal to the area of contact $S_0$ in the situation where the degree of misalignment is zero (shown in portion (b) of FIG. 13).

The semiconductor device of this preferred embodiment will be further described with reference to portions (a) to (c) of FIG. 15, which are plan views illustrating how the arrangements of the conductive surface 19s with respect to the p$^+$-type contact region's surface 15s changes in the semiconductor device of this preferred embodiment according to the degree of misalignment Δx.

Specifically, portion (a) of FIG. 15 illustrates a situation where the degree of misalignment Δx is zero, while portions (b) and (c) of FIG. 15 illustrate a situation where the degree of misalignment Δx is 0.2 μm and a situation where the degree of misalignment Δx is 0.5 μm, respectively. As can be seen from these examples, electrons flow through the entire left end portion of the source region's surface 14s in any situation, and therefore, the gate width does not decrease substantially.

In the example described above, the conductive surface 19s is supposed to shift in the x direction. However, the same statement applies to even a situation where the conductive surface 19s shifts in the −x direction or in the y or −y direction that intersects with the x direction at right angles.

Next, it will be described with reference to FIGS. 16(a) and 16(b) how effectively this preferred embodiment can prevent an npn transistor from being turned ON unintentionally. Specifically, FIG. 16(a) is a plan view illustrating the arrangement of a conventional semiconductor device that has already been described with reference to FIG. 41, while FIG. 16(b) is a plan view illustrating the arrangement of a semiconductor device according to this preferred embodiment.

As described above, in the conventional arrangement shown in FIG. 16(a), the p$^+$-type contact region's surface 105s, the source region's surface 104s and the well region's surface 103s all have square shapes and are arranged so that the respective sides of the p$^+$-type contact region's surface 105s define an angle of 45 degrees with respect to the respective sides of the source region's surface 104s and those of the well region's surface 103s. In such an arrangement, at the corners of the p-type well region 103, the distance 130 between the p-type well region 103 and the p$^+$-type contact region 105 increases, thus raising the potential at the p-type well region 103 more easily and eventually lessening the effect of preventing the npn transistor (104, 103 and 120) from being turned ON unintentionally.

On the other hand, according to the arrangement of this preferred embodiment shown in FIG. 16(b), the well region's surface 13s and the source region's surface 14s have square shapes, but the p$^+$-type contact region's surface 15s has an X-shape including four strip portions that run from the center of the well region's surface 13s toward the respective vertices of the well region's surface 13s and the source region's surface 14s. In this case, the distance 136 between the corners of the p-type well region 13 and the contact region's surface 15s decreases. Also, according to this preferred embodiment, there is the longest distance 135 from the base portion of the p⁺-type contact region 105 (i.e., the center of the X-shape) to the middle of each side of the p-type well region 13. However, this distance 135 is shorter than the distance 130 shown in FIG. 16(b). Furthermore, according to this preferred embodiment, the distance 137 from the middle of each side of the p-type well region 13 to the contact region's surface 15s is even shorter than the distance 135. And the distance 137 can be further reduced by increasing the widths of the strip portions of the p⁺-type contact region 15 as measured perpendicularly to their length directions (i, ii). As a result, this preferred embodiment can prevent the npn transistor (14, 13, 10) from being unintentionally turned ON more effectively than the conventional arrangement shown in FIG. 16(a).

On top of that, even if the degrees of misalignment Δx and Δy increased, the area of contact between the contact region's surface 15s and the conductive surface 19s of the source electrode would hardly change as described above, as long as the periphery of the conductive surface 19s of the source electrode is located over the four strip portions 70 to 73.

As can be seen, according to this preferred embodiment, even if the degree of misalignment Δx, Δy increased, the decrease in effective gate width, which would otherwise be caused due to the presence of an electron non-flowable zone, could still be minimized with a sufficient area of contact ensured between the contact region's surface 15s and the conductive surface 19s of the source electrode. On top of that, since the distance between the well region's surface 13s and the contact region's surface 15s can be shortened, the arrangement of this preferred embodiment can prevent more effectively the npn transistor (14, 13, 10) from being turned ON unintentionally.

To achieve the effect described above, the conductive surface 19s and the p⁺-type contact region's surface 15s do not have to have the shapes shown in FIG. 12. For example, the source region's surface 14s does not have to have a square shape but may also have a polygonal shape selected from the group consisting of quadrangular, pentagonal, hexagonal, heptagonal and octagonal shapes. In that case, the contact region's surface 15s has only to have a number of strip portions that run toward their associated vertices of the polygonal source region's surface 14s. In addition, the width of the contact region's surface 15s needs to be greater than that of the conductive surface 19s in the direction in which at least one of the strip portions runs (e.g., along the first axis).

FIGS. 17 through 33 are plan views illustrating various alternative shapes for the p⁺-type contact region's surface 15s, the source region's surface 14s and the conductive surface 19s according to this preferred embodiment.

The source region's surface 14s shown in FIG. 17 has a square shape, of which the four sides are parallel to the x and y directions. On the other hand, the p⁺-type contact region's surface 15s has a shape consisting of an X-pattern in which two rectangles, each having a width of 0.7 μm and a length of 5 μm, cross each other at right angles with their barycenters aligned with each other, and a square pattern, which is arranged at the center of the X-pattern and which has a greater width than each strip portion (and a length of 1.6 μm each side). This square pattern serves as the base portion 79 and the rest of the X-pattern that does not overlap with the base portion 79 becomes the four strip portions 70 to 73 that run from the center of the p⁺-type contact region's surface 15s toward the respective vertices of the source region's surface 14s. The conductive surface 19s of the source electrode has a square shape, of which the four sides are parallel to the x and y directions and of which each side has its length determined to be greater than the width of the base portion 79 but smaller than the widths of the p⁺-type contact region's surface 15s as measured in the x and y directions.

If the base portion 79 has a width 79w that is greater than the widths 70w, 71w, 72w and 73w of the strip portions 70 through 73 as in the example illustrated in FIG. 17, the area of contact between the p⁺-type contact region's surface 15s and the conductive surface 19s can be increased around the center of the p⁺-type contact region's surface 15s. Also, if the source region's surface 14s has a polygonal shape with n vertices (where n is an even number selected from the group consisting of four, six and eight) as in this example, the respective strip portions 70 to 73 that run toward the respective vertices preferably have the same width and the same length because the p⁺-type contact region's surface 15s can be symmetrical with respect to a point in that case. It should be noted that if the source region's surface 14s has a polygonal shape with n vertices (where n is four, six or eight), then the directions in which the respective strip portions 70 to 73 run become substantially parallel to the diagonals of the p⁺-type contact region's surface 15s and those of the conductive surface 19s.

The example illustrated in FIG. 18 is different from the arrangement shown in FIG. 12(b) in that the end 15e of each strip portion of the p⁺-type contact region's surface 15s is pointed (i.e., has an acute angle). However, the ends 15e of the p⁺-type contact region's surface 15s may have any other shape and could have a round shape (e.g., a semicircular shape). In the example illustrated in FIG. 18, each strip portion has a greater width than its counterpart shown in FIG. 12(b) and may have a width of approximately 0.5 to 1.0 μm, for example. In this manner, the width of the strip portions of the p⁺-type contact region's surface 15s can be determined appropriately with the area of contact with the conductive surface 19s taken into account.

In this preferred embodiment, the p⁺-type contact region's surface 15s is preferably designed so as not to overlap with the gate electrode 18 (see FIG. 11(a)). In the example illustrated in FIG. 18, the respective ends 15e of the strip portions of the p⁺-type contact region's surface 15s preferably do not reach the end face 18e of the gate electrode 18. This is because as the p⁺-type contact region's surface 15s has been roughened and has a lot of defects, the gate electrode 18, when formed over such a surface 15s with the channel epi-layer 16 and the gate oxide film 17 interposed, might have a decreased degree of reliability. The same statement applies to not just the arrangement shown in FIG. 18 but also any other arrangement according to the present invention as well. That is to say, the p⁺-type contact region's surface 15s preferably does not overlap with the gate electrode 18.

The example illustrated in FIG. 19 is similar to, but is different from, the example illustrated in FIG. 17 in that the respective ends 15e of the strip portions of the p⁺-type contact region's surface 15s are pointed. In addition, the area of the quadrangular portion (i.e., the base portion 79) arranged at the intersection (i.e., the center) of the X-shaped p⁺-type contact region's surface 15s in the example shown in FIG. 19 is smaller than that of the base portion 79 shown in FIG. 17. The area of the base portion 79 can also be determined appropriately with the area of contact with the conductive surface 19s taken into account, just like the width of the strip portions 70 to 73 of the p⁺-type contact region's surface 15s.

The example illustrated in FIG. 20 is different from the example illustrated in FIG. 19 in that the base portion 79 of the p⁺-type contact region's surface 15s has a diamond (e.g., square in this example) shape with sides that are parallel to the directions in which the strip portions 70 to 73 run. On the other hand, in the example illustrated in FIG. 21, the base portion 79 has a circular shape. In this manner, the shape of the base portion 79 is not particularly limited.

Optionally, as in the example illustrated in FIG. 22, the contact region's surface 15s may have not only the strip portions 70 to 73 that run toward the vertices of the source region's surface 14s but also additional strip portions to 83 that run from the center of the contact region's surface 15s toward the source region's surface 14s. In the example illustrated in FIG. 22, the contact region's surface 15s further has four more strip portions 80 to 83 that run toward the respective sides of the source region's surface 14s (i.e., in the x and y directions). These strip portions 80 to 83 may form the cross pattern that has already been described for the first preferred embodiment. The widths of the strip portions 70 to 73 and 80 to 83 are determined appropriately. For example, all of these strip portions may have the same width as shown in FIG. 23. On top of that, the shape of the base portion 79 is not limited, either. For instance, the base portion 79 may have a diamond shape (see FIG. 20) as shown in FIG. 24 or a round shape (see FIG. 21) as shown in FIG. 25.

In each of the various examples described above, the source region's surface 14s has a quadrangular shape. However, the source region's surface 14s may have any other shape, which may be a polygonal shape, for example. In the example illustrated in FIG. 26, the source region's surface 14s has a hexagonal shape (more preferably, a regular hexagonal shape). On the other hand, the contact region's surface 15s has six strip portions 70 to 75 that run from the center of the contact region's surface 15s toward the respective vertices of the hexagonal source region's surface 14s. In this example, the conductive surface 19s also has a hexagonal shape, and the width of the conductive surface 19s is defined to be smaller than that of the contact region's surface 15s. Optionally, the respective ends 15e of the strip portions may be pointed as shown in FIG. 27. Also, the width of the contact region's surface 15s could be increased. Furthermore, as shown in FIGS. 28 and 29, the contact region's surface 15s may have a base portion 79 that has a broader width than the strip portions. The base portion 79 may have either a hexagonal shape as shown in FIG. 28 or a circular shape as shown in FIG. 29.

If the base portion 79 has a broader width than the strip portions, the width of the conductive surface 19s is preferably defined to be greater than that of the base portion 79 but smaller than that of the contact region's surface 15s. Then, even if misalignment occurred, the entire base portion 79 could be brought into contact with the conductive surface 19s more easily, and therefore, a sufficient area of contact would be ensured between the contact region's surface 15s and the conductive surface 19s more securely. In addition, as the periphery of the conductive surface 19s can be arranged over the strip portions more easily, the decrease in the area of contact to be caused due to misalignment can be minimized.

In the example illustrated in FIG. 30, the source region's surface 14s has an octagonal shape (more preferably, a regular octagonal shape). On the other hand, the contact region's surface 15s has eight strip portions 70 to 77 that run from the center of the contact region's surface 15s toward the respective vertices of the octagonal source region's surface 14s. In this example, the conductive surface 19s also has an octagonal shape, and the width of the conductive surface 19s is defined to be smaller than that of the contact region's surface 15s. Optionally, the respective ends 15e of the strip portions may be pointed as shown in FIG. 31. Also, the width of the contact region's surface 15s could be increased.

Furthermore, as shown in FIGS. 32 and 33, the contact region's surface 15s may have a base portion 79 that has a broader width than the strip portions. The base portion 79 may have either an octagonal shape as shown in FIG. 32 or a circular shape as shown in FIG. 33. Even so, the width of the conductive surface 19s is preferably defined to be greater than that of the base portion 79 but smaller than that of the contact region's surface 15s.

According to any of the arrangements shown in FIGS. 17 through 33, even if the degree of misalignment $\Delta x$, $\Delta y$ between the conductive surface 19s and the $p^+$-type contact region 15 increased, the decrease in effective gate width due to the presence of an electron non-flowable zone would be minimized as in the arrangement that has already been described with reference to FIGS. 11 through 14. In addition, as long as the degree of misalignment $\Delta x$, $\Delta y$ falls within a predetermined range, the conductive surface 19s will be arranged so that its periphery crosses the strip portions. That is why the area of contact between the conductive surface 19s of the source electrode 19 and the $p^+$-type contact region's surface 15s never change significantly according to the degree of misalignment. On top of that, since the distance between the source region's surface 14s and the $p^+$-type contact region's surface 15s can be reduced compared to the prior art, the device of this preferred embodiment can prevent more effectively the npn transistor from being turned ON unintentionally.

Furthermore, in any of the various arrangements shown in FIGS. 17 through 33, on the surface 10s of the semiconductor layer, the contact region's surface 15s has a symmetrical shape with respect to a point. The contact region's surface 15s preferably has such a shape because no matter in which direction (x, −x, y or −y) misalignment has occurred, the deterioration in device performance due to that misalignment can be reduced more effectively in that case.

Also, if an off-cut substrate is used as the substrate 11, at least one of the strip portions is preferably arranged parallel to the off-cut direction to minimize the deterioration in device performance due to the misalignment in the off-cut direction as effectively as possible. Optionally, the profile of the conductive surface 19s may have a polygonal shape with some sides that intersect with the off-cut direction at right angles.

As described above, the degree of misalignment to be caused in an actual photolithographic process is normally 1.0 μm or less, preferably 0.5 μm or less. The degree of misalignment could be greater than the expected one (e.g., could be 0.5 μm or more). Even so, according to the arrangement of this preferred embodiment, even if the degree of misalignment increased, the decrease in effective gate width due to the presence of the electron non-flowable zone could still be minimized, and therefore, the ON-state resistance should be reduced.

If the degree of misalignment is 0.5 μm or less, for example, each of the strip portions 70u to 73u (see FIG. 12) preferably has a length of 1.0 μm or more as measured in the x or y direction in which the misalignment could occur.

For example, due to a size shift that has been caused by some system jam or the deviation of a patterning condition, the conductive surface 19s may have a smaller size than the designed one. In that case, the ratio in the area of the contact region's surface 15s to the conductive surface 19s will increase. And even if the degree of misalignment $\Delta x$ or $\Delta y$ is small, the conductive surface 19s is likely to overlap with the contact region's surface 15s. As a result, significant effects can be achieved by applying the present invention. If the $p^+$-type contact region 15 and the source electrode 19 are formed by a photolithographic process, for example, the p+-type contact region's surface 15s and the conductive surface 19s of the source electrode 19 may have shapes that are not just as designed as being affected by the resolution of the photolithographic process. More specifically, even if those shapes are designed to be polygonal, the actual shapes could have rounded corners. Even so, as long as the p+-type contact region's surface 15s and the conductive surface 19s are designed to have the shapes described above, the deterioration in device performance due to the misalignment can also be minimized. Thus, such a situation also falls within the scope of the present invention.

In the examples illustrated in FIGS. 11 through 33, the surface 10s of the semiconductor layer is supposed to be flat for the sake of simplicity. Actually, however, a portion of the semiconductor layer's surface 10s that is in contact with the source electrode 19 could be lower in level than the rest of the semiconductor layer's surface 10s that is not in contact with the source electrode 19. As described above, the source electrode 19 is formed by depositing a conductive material on the semiconductor layer 10 and then subjecting the material to a high-temperature annealing process.

The source electrode 19 obtained by such a method includes a reaction layer that has been formed through a reaction between silicon carbide included in the semiconductor layer 10 and the conductive material that makes the source electrode 19. And the lower surface of that reaction layer, i.e., the conductive surface 19s of the source electrode 19, should be located at a lower level than the semiconductor layer's surface 10s before the reaction layer is formed.

Manufacturing Process

The semiconductor device of this preferred embodiment may be fabricated by the following method, for example. Hereinafter, the manufacturing process of this preferred embodiment will be described with reference to FIG. 34.

First, as shown in FIG. 34(a), a silicon carbide layer is formed as a semiconductor layer 10 on a substrate 11 of silicon carbide. As the substrate 11, a 4H—SiC substrate with a diameter of 3 inches, of which the principal surface defines an off-cut angle of eight degrees in [11-20] (one, one, two bar, one) directions from (0001) planes, may be used, for example.

The conductivity type of the substrate 11 is n-type and the dopant concentration thereof is $1 \times 10^{19}$ cm$^{-3}$. The semiconductor layer 10 may be formed by CVD process using an annealing furnace. In this preferred embodiment, a silicon carbide layer doped with an n-type dopant is grown epitaxially on the principal surface of the substrate 11. The thickness of the semiconductor layer 10 changes with the specification the semiconductor device should satisfy but is typically adjusted within the range of 5 μm to 100 μm. Also, the dopant concentration of the semiconductor layer 10 is appropriately controlled within the range of $1 \times 10^{11}$ cm$^{-3}$ to $1 \times 10^{17}$ cm$^{3}$. As the dopant, nitrogen or phosphorus may be used, for example. Optionally, a buffer layer made of n-type silicon carbide may be inserted between the substrate 11 and the semiconductor layer 10. The buffer layer may have a dopant concentration of $1 \times 10^{18}$ cm$^{-3}$ and a thickness of 1 μm.

Next, as shown in FIG. 34(b), a first dopant ion implanted layer 13' (with a thickness of 1 μm, for example) is formed in a selected portion of the semiconductor layer 10.

Specifically, first, a mask layer 31 of silicon dioxide (SiO$_2$), for example, is formed on the surface of the semiconductor layer 10. The mask layer 31 has an opening that defines the portion of the semiconductor layer 10 that will be the first dopant ion implanted layer 13'. The mask layer 31 may be formed in an arbitrary pattern by photolithographic and etching processes. In this example, the shape of the opening of the mask layer 31 is designed such that the first dopant ion implanted layer 13' will have a square surface shape (with a length of 6.6 μm each side). The thickness of the mask layer 31 is determined by its material and the implantation condition but is preferably much greater than the implantation range.

Next, p-type dopant ions (such as aluminum ions) are implanted into the semiconductor layer 10 from over the mask layer 31. During the ion implantation, the temperature of the substrate may be adjusted within the range of 200° C. to 1,000° C. or may even be room temperature. When the ion implantation process is over, the mask layer 31 is removed. In this manner, the first dopant ion implanted layer 13' is formed in that portion of the semiconductor layer 10 into which the dopant ions have been implanted. Meanwhile, the rest of the semiconductor layer 10 into which no dopant ions have been implanted becomes an n-type drift region 12.

Subsequently, as shown in FIG. 34(c), a second dopant ion implanted layer 14' (with a thickness of 0.2 μm, for example) is formed in the semiconductor layer 10. Specifically, first, a mask layer 33 with an opening that exposes a portion of the surface of the first dopant ion implanted layer 13' is formed on the semiconductor layer 10.

In this example, the shape of the opening of the mask layer 33 is designed so that the second dopant ion implanted layer 14' will have a square surface shape (with a length of 5.6 μm each side, for example) and so that a mask 33' that will cover a region to be a dopant ion implanted layer 15' in a subsequent process step is formed at the same time. The mask layer 33 may be made of the same material, and formed by the same process, as the mask layer 31. Next, n-type dopant ions (such as nitrogen ions or phosphorus ions) are implanted into the semiconductor layer 10 from over the mask layer 33. When the ion implantation process is over, the mask layer 33 is removed. In this manner, the second dopant ion implanted layer 14' is formed in the first dopant ion implanted layer 13'.

Furthermore, as shown in FIG. 34(d), a third dopant ion implanted layer 15' is formed in the semiconductor layer 10. Specifically, the third dopant ion implanted layer 15' is formed by defining a mask layer 35 with an opening that exposes a portion of the first dopant ion implanted layer 13' on the semiconductor layer 10 and then implanting p-type dopant ions (such as aluminum ions) into the semiconductor layer 10 from over the mask layer 35. The shape of the opening of the mask layer 35 is designed such that the surface of the third dopant ion implanted layer 15' will have an X-shape such as the one shown in FIG. 12(c). When the ion implantation process is over, the mask layer 35 is removed.

Subsequently, as shown in FIG. 34(e), the first, second and third dopant ion implanted layers 13', 14' and 15' are annealed at an elevated temperature of about 1,700° C. and have their dopants activated, thereby defining a p-type well region 13, an n-type source region 14 and a p+-type contact region 15, respectively.

The dopant concentrations of the p-type well region 13 and the n-type source region 14 thus defined are determined by the conditions of the ion implantation process steps described above, and are controlled so as to fall within the range of $1 \times 10^{19}$ cm$^{-3}$ to $1 \times 10^{19}$ cm$^{-3}$ and the range of $1 \times 10^{19}$ cm$^{-3}$ to $1 \times 10^{21}$ cm$^{-3}$, respectively. On the other hand, the dopant concentration of the p+-type contact region 15 is controlled so as to be higher than that of the p-type well region 13 and to be high enough to make ohmic contact with the conductive layer 19 to be formed later (e.g., within the range of $1 \times 10^{19}$ cm$^{-3}$ to $1 \times 10^{21}$ cm$^{-3}$).

Next, as shown in FIG. 34(f), a channel layer 16 of n-type silicon carbide is epitaxially grown on the semiconductor layer 10 and an opening is cut through the channel layer 16 to expose the n-type source region 14. The average dopant concentration in the channel layer 16 is controlled so as to fall within the range of $1 \times 10^{15}$ cm$^{-3}$ to $1 \times 10^{18}$ cm$^{-3}$. The channel layer 16 may have either a single layer structure or a multilayer structure.

Thereafter, as shown in FIG. 34(g), a gate insulating film 17, a source electrode 19, a drain electrode 21, a gate electrode 18, an interlevel dielectric film 22 and an upper interconnect electrode 23 are formed, thereby completing a semiconductor device 100 as a vertical MOSFET. Optionally, if the patterns of the mask layers 31, 33 and so on are changed, a semiconductor device with a different configuration from that of this preferred embodiment shown in FIG. 12 can be fabricated as well.

The gate insulating film 17 may be formed by thermally oxidizing the surface of the channel layer 16 of silicon carbide at a temperature of 1,100° C. to 1,200° C. Alternatively, the gate insulating film 17 may also be formed by depositing a single-layer or multilayer insulating film on the channel layer 16. The thickness of the gate insulating film 17 is controlled within the range of 20 nm to 200 nm. Meanwhile, the gate electrode 18 may be formed by depositing a polysilicon film or a metal film with low resistivity on the gate insulating film 17 and then patterning it.

The source electrode 19 may be formed in the following manner. Specifically, after the gate insulating film 17 and the gate electrode 18 have been formed, an interlevel dielectric film 22 is deposited so as to cover the gate electrode 18. Then, an opening is cut through that interlevel dielectric film 22 to expose a portion of the surface of the semiconductor layer 10.

Thereafter, a conductive material such as Ni is deposited at the bottom of the opening and then annealed at a high temperature as described above, thereby forming a source electrode 19. As a result of the annealing process, the conductive material reacts with silicon carbide in the semiconductor layer 10, thereby forming a reaction layer such as a silicide layer, a carbide layer or a mixture thereof. That is why at least a portion of the source electrode 19 thus obtained is such a reaction layer. And due to the presence of that reaction layer, the source electrode 19 thus obtained can make good ohmic contact with the p$^+$-type contact region 15 and the n-type source region 14 in the semiconductor layer 10.

If the source electrode 19 is formed by such a method, the shape of the conductive surface of the source electrode 19 can be adjusted by that of the opening to cut through the interlevel dielectric film 22.

Alternatively, a metal (such as Ni) may be deposited over the entire surface of the interlevel dielectric film 22 with an opening and then annealed at a high temperature to form a reaction layer on the semiconductor layer 10. After that, the excessive metal on the interlevel dielectric film 22 that has not contributed to forming the reaction layer may be removed.

The drain electrode 21 may be formed by depositing a metallic material (such as Ni or Ti) on the back surface of the substrate 11 and then annealing it. The upper interconnect electrode 23 is formed so as to fill the opening of the interlevel dielectric film 22 and is electrically connected to the source electrode 19. As the material of the upper interconnect electrode 23, aluminum may be used, for example.

The source electrode 19 does not have to be formed by the method described above. For example, the source electrode 19 may be formed before the interlevel dielectric film 22 is deposited. Specifically, in that case, the source electrode 19 may be formed by depositing a conductor film over the entire semiconductor layer 10, patterning the conductor film into a predetermined shape and then annealing the remaining portion of the conductor film at an elevated temperature of approximately 1,000° C. According to this method, the shape of the conductive surface of the source electrode 19 can be controlled by patterning the conductor film, and therefore, a conductive surface of a very small size or a polygonal (such as quadrangular) conductive surface can be formed with higher precision. Furthermore, if the source electrode 19 is formed by such a method, an interlevel dielectric film 22 is deposited over the entire surface of the substrate after the source electrode 19 has been formed. Then, an opening may be cut through the interlevel dielectric film 22 by a technique such as dry etching so as to expose a portion of the source electrode 19. And the upper interconnect electrode 23 may be formed so as to fill that opening.

Furthermore, according to the method described above, after the first dopant ion implanted layer 13' to be the well region 13 has been formed using the mask layer 31, the second dopant ion implanted layer 14' to be the source region 14 is formed using the mask layer 33 and then the third dopant ion implanted layer 15' to be the p$^-$-type contact region 15 is formed using the mask layer 35. However, the order in which these dopant ion implanted layers 13', 14' and 15' are formed is not particularly limited. For example, after the third dopant ion implanted layer 15' to be the p$^+$-type contact region 15 has been formed, the second dopant ion implanted layer 14' to be the source region 14 may be formed.

Figure 11:
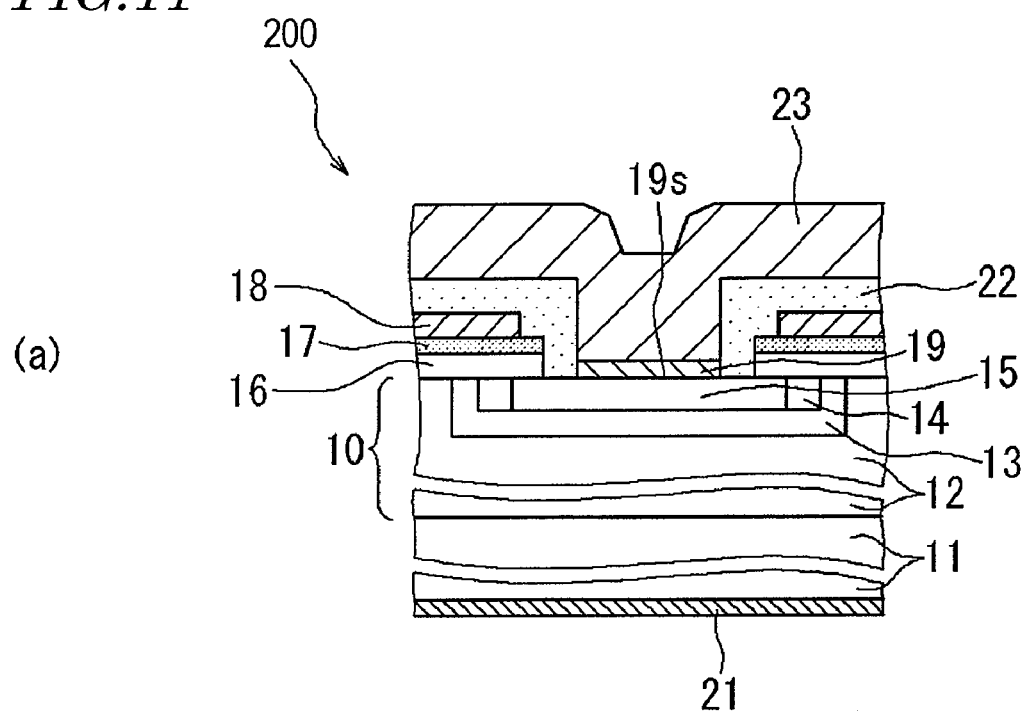
Figure 11:
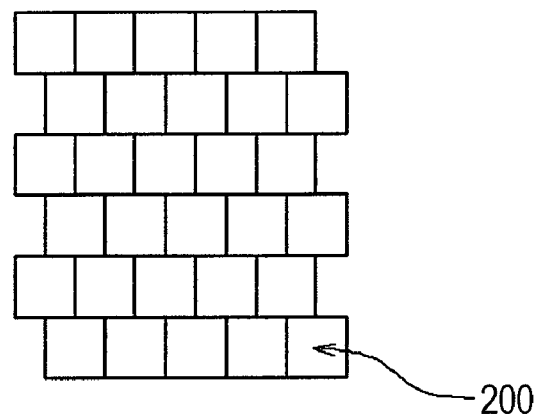
Figure 12:
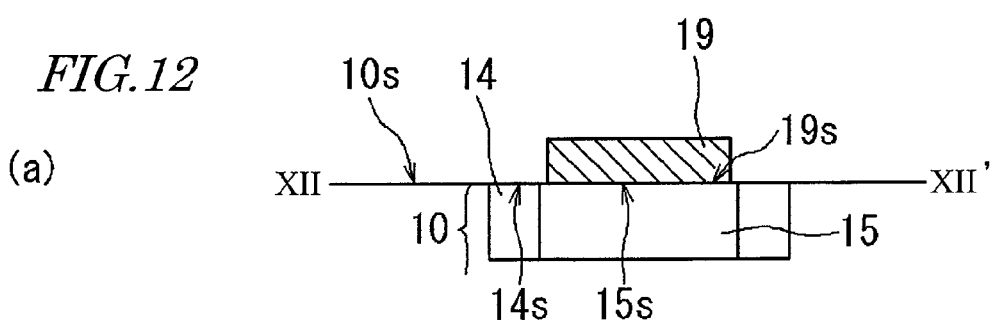
Figure 12:
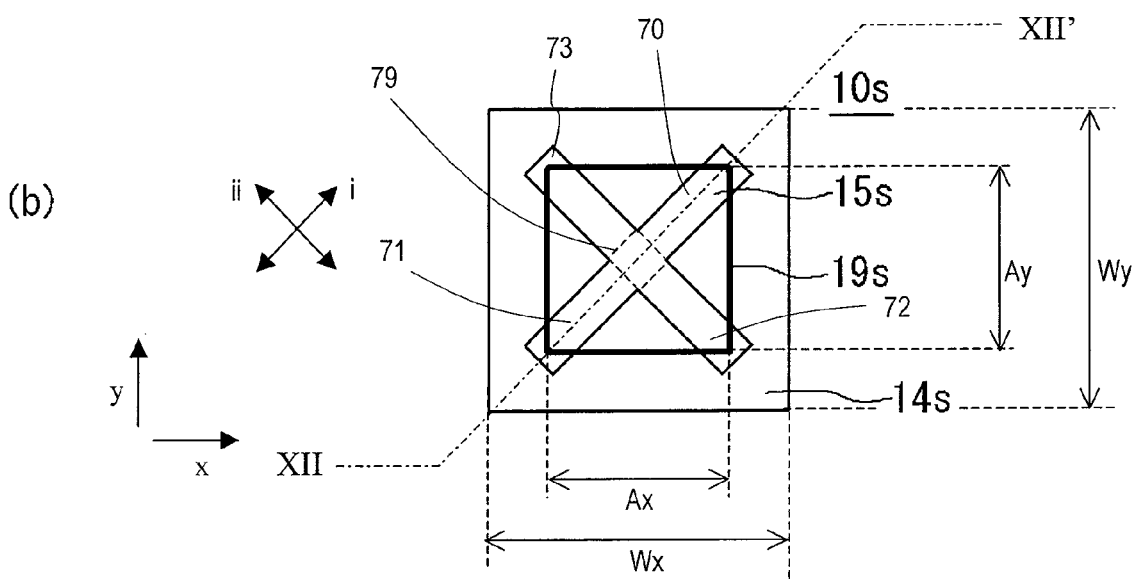
Figure 12:
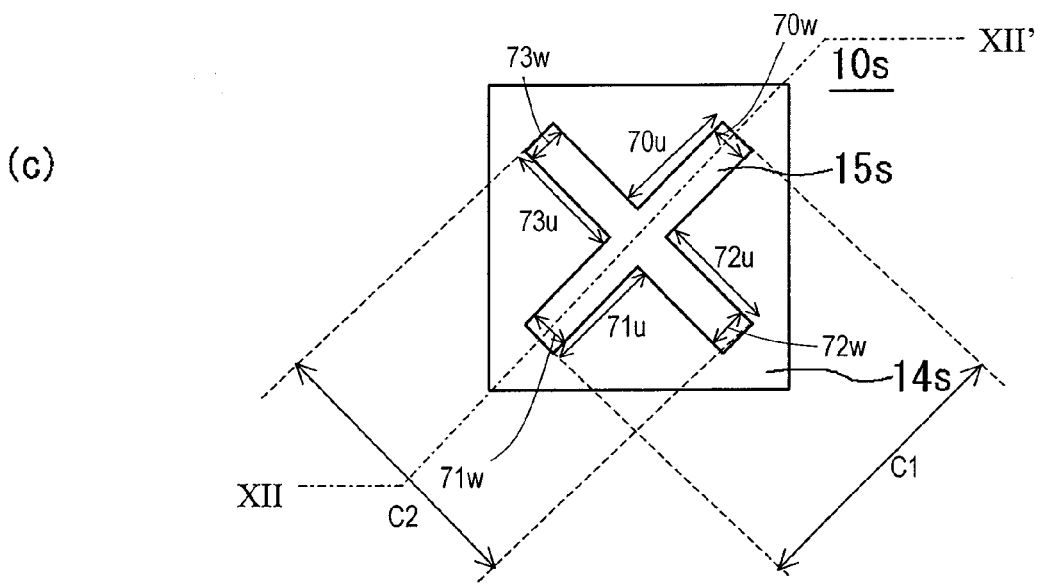

It should be noted that the semiconductor device of this preferred embodiment does not have to have the configuration shown in FIG. 11. For example, although the channel layer 16 of silicon carbide is arranged on the semiconductor layer 10 in the configuration shown in FIG. 11(a), the channel layer 16 may be omitted as in the semiconductor device shown in FIG. 35. In such a structure with no channel layer 16, a channel can be produced by inverting the conductivity type of the well region under the gate electrode with a voltage applied to the gate electrode 18.

Embodiment 3

Hereinafter, a third preferred embodiment of a semiconductor device according to the present invention will be described with reference to the accompanying drawings. The semiconductor device of this preferred embodiment is a vertical MOSFET that uses silicon carbide but consists of striped unit cells unlike the counterparts of the preferred embodiments described above. In the following description, a comb shaped MOSFET, unit cells of which have stripes that run perpendicularly to the direction in which electrons flow through the channel, will be described as an example.

FIG. 36(a) is a schematic cross-sectional view illustrating an exemplary unit cell as a third preferred embodiment of the present invention. FIG. 36(b) is a top view illustrating the arrangement of the unit cells in the semiconductor device of this preferred embodiment. For the sake of simplicity, any pair of components shown in both FIGS. 1(a) and 1(b) and FIGS. 36(a) and 36(b) and having substantially the same function is identified by the same reference numeral.

The unit cell 300 has substantially the same configuration, and operates in almost the same way, as the unit cell 100 shown in FIG. 1(a), and the description thereof will be omitted herein. However, the unit cell 300 has stripes that run perpendicularly to the direction in which electrons flow through the channel. The p$^+$-type contact region 15, n-type source region 14, source electrode 19 and other components of the unit cell 300 also have similar striped shapes. Also, such unit cells 300 are arranged as shown in FIG. 36(b) and are provided with additional wiring pads or terminal structures, if necessary, thereby forming an MOSFET.

FIG. 37(a) is a schematic cross-sectional view of the semiconductor device as viewed on the plane XIV-XIV' shown in FIGS. 37(b) and 37(c) to illustrate the source electrode 19, the p+-type contact region 15 and the n-type source region 14. FIG. 37(b) is a plan view illustrating the conductive surface 19s of the source electrode 19, the p+-type contact region's surface 15s and the n-type source region's surface 14s on the surface 10s of the semiconductor layer.

In this preferred embodiment, the conductive surface 19s of the source electrode 19 has a stripe shape (with a width of 3 µm, for example) that runs perpendicularly to the direction in which electrons flow through the channel as shown in FIG. 37(b). In the following description, the axis that is defined parallel to the direction in which electrons flow through the channel on the semiconductor layer's surface 10s will be referred to herein as a "p-axis", and the axis that intersects with the p-axis at right angles will be referred to herein as a "q-axis".

The p+-type contact region's surface 15s has a base portion 99 that runs along the centerline of the source region's surface 14s and along the q-axis and multiple pairs of strip portions 90, 91, 92, 93 and so on that run in two opposite directions along the p-axis from the base portion 99. The width Cp of the p+-type contact region's surface 15s as measured along the p-axis is greater than the width Ap of the conductive surface 19s as measured along the p-axis but smaller than the width Wp of the source region's surface 14s as measured along the p-axis. Also, the width Ap of the conductive surface 19s as measured along the p-axis is greater than that of the base portion 99 as measured along the p-axis.

In the plan views shown in FIGS. 37(b) and 37(c), the shapes of the source region's surface 14s and the p+-type contact region's surface 15s at the ends of the unit cell are not shown. However, the p+-type contact region's surface 15s may be either surrounded with the source region's surface 14s or just interposed between two striped portions of the source region's surface 14s. In other words, on the surface 10s of the semiconductor layer, the source region 14 just needs to be located between the p+-type contact region 15 and the well region 13. As used herein, if "the p+-type contact region's surface 15s is surrounded with the source region's surface 14s", the p+-type contact region's surface 15s may be not just surrounded with the source region's surface 14s but also sandwiched between two striped portions of the source region's surface 14s in a striped MOSFET.

According to this preferred embodiment, even if the degree of misalignment Δp between the conductive surface 19s and the p+-type contact region's surface 15s (as measured in the channel direction, for example) increased, the area of contact between the conductive surface 19s of the source electrode 19 and the p+-type contact region's surface 15s can be kept substantially constant. As a result, it is possible to prevent induced current from breaking down the device. On top of that, even if the degree of misalignment Δp increased, the periphery of the conductive surface 19s would still cross the strip portions of the p+-type contact region 15. That is why as the length Z of those crossed portions can be reduced, the electron non-flowable zone is not produced easily at the ends of the source region's surface 14s. Consequently, no matter whether misalignment has occurred or not, a sufficient effective gate width and ample ON-state current are ensured. In addition, the variation in ON-state resistance due to the misalignment can be reduced and the yield can be increased eventually.

INDUSTRIAL APPLICABILITY

In a semiconductor device according to the present invention, including p- and n-type semiconductor regions on the surface of a semiconductor layer and a conductor that contacts with those semiconductor regions, even if misalignment has occurred between the semiconductor regions and the conductor, the decrease in ON-state resistance due to such a misalignment can be minimized. In addition, since the variation in ON-state resistance can be reduced, the yield of the semiconductor device can be increased. On top of that, the switching delay due to induced current can be minimized, too.

The present invention is broadly applicable to any power semiconductor device of silicon carbide for use in applications that require a high breakdown voltage and a large amount of current. Among other things, the present invention is applicable particularly effectively to a fine-line semiconductor device that would be affected significantly by a misalignment that could occur during a photolithographic process. For example, it is beneficial if the present invention is applied to a semiconductor device consisting of unit cells, each having a source electrode width of 5 µm or less, more preferably 3 µm or less.

REFERENCE SIGNS LIST 10 semiconductor layer
11 substrate
12 n-type drift region
13 p-type well region
14 n-type source region
14s source region's surface
15 p+-type contact region
15s contact region's surface
16 channel layer
17 gate insulating film
18 gate electrode
19 source electrode (conductor)
19s conductive surface
21 drain electrode
22 interlevel dielectric film
23 upper interconnect electrode
31 mask layer
33 mask layer
35 mask layer
60 to 63, 70 to 77 and 91 to 93 strip portion
65, 79, 99 base portion
100, 200, 300, 1000 unit cell

The invention claimed is:
1. A semiconductor device comprising:
a substrate;
a semiconductor layer, which has been formed on the substrate;
a semiconductor region of a first conductivity type, which is defined on the surface of the semiconductor layer;
a semiconductor region of a second conductivity type, which is defined on the surface of the semiconductor layer so as to surround the semiconductor region of the first conductivity type; and
a conductor with a conductive surface that contacts with the semiconductor regions of the first and second conductivity types, wherein the semiconductor layer includes silicon carbide, and
wherein on the surface of the semiconductor layer,
the semiconductor region of the first conductivity type has at least one first-directed strip portion that runs along a first axis and also has at least one second-directed strip portion that runs along a second axis that is not parallel to the first axis, and
the width of the semiconductor region of the first conductivity type as measured along the first axis is greater than that of the conductive surface as measured along the first axis, and
the width of the semiconductor region of the first conductivity type as measured along the second axis is greater than that of the conductive surface as measured along the second axis, and
wherein the periphery of the conductive surface crosses not only the at least one first-directed strip portion but also the at least one second-directed strip portion.

2. The semiconductor device of claim 1, wherein on the surface of the semiconductor layer, the semiconductor region of the first conductivity type further has a base portion that is connected to the at least one first-directed and the at least one second-directed strip portions.

3. The semiconductor device of claim 1, wherein on the surface of the semiconductor layer, the semiconductor region of the first conductivity type has a shape that is symmetrical with respect to a point.

4. The semiconductor device of claim 1, wherein the width of the at least one first-directed strip portion as measured perpendicularly to the first axis is substantially constant along the first axis.

5. The semiconductor device of claim 1, wherein the at least one first-directed strip portion has a length of 1 μm or more as measured along the first axis.

6. The semiconductor device of claim 1, wherein the substrate is an off-cut substrate and wherein the first axis is parallel to the off-cut direction of the substrate.

7. The semiconductor device of claim 1, further comprising:
a well region of the first conductivity type, which is electrically connected to the semiconductor region of the first conductivity type and which surrounds the semiconductor region of the second conductivity type on the surface of the semiconductor layer;
a gate insulating film, which partially covers the semiconductor layer;
a gate electrode, which is insulated from the semiconductor layer by the gate insulating film; and
a drain electrode, which has been formed on the back surface of the substrate.

8. The semiconductor device of claim 1, wherein on the surface of the semiconductor layer, the at least one first-directed strip portion of the semiconductor region of the first conductivity type includes a pair of strip portions running in mutually opposite directions along the first axis and the at least one second-directed strip portion thereof includes another pair of strip portions running in mutually opposite directions along the second axis.

9. The semiconductor device of claim 8, wherein the conductive surface has a polygonal shape, of which one diagonal is parallel to the first axis and another diagonal is parallel to the second axis.

10. The semiconductor device of claim 8, wherein on the surface of the semiconductor layer, the semiconductor region of the second conductivity type has a polygonal shape and each of the first and second axes is parallel to at least one of the lines that connect together the barycenter and at least one vertex of the polygonal semiconductor region of the second conductivity type.

11. The semiconductor device of claim 8, wherein the conductive surface has a polygonal shape, of which some sides are parallel to the first axis and other sides are parallel to the second axis.

12. The semiconductor device of claim 11, wherein the polygonal shape is a square shape.

13. A method for fabricating a semiconductor device, the method comprising the steps of:
(a) introducing a dopant of a first conductivity type into a semiconductor layer including silicon carbide using a first implant mask, thereby defining a semiconductor region of the first conductivity type on the surface of the semiconductor layer;
(b) introducing a dopant of a second conductivity type into the semiconductor layer using a second implant mask, thereby defining a semiconductor region of the second conductivity type on the surface of the semiconductor layer; and
(c) providing a conductor that has a conductive surface,
wherein in the steps (a) and (b), the semiconductor region of the second conductivity type is defined so as to surround the semiconductor region of the first conductivity type on the surface of the semiconductor layer, and
wherein the step (c) includes the step of aligning the conductive surface with respect to the semiconductor region of the first conductivity type so that the conductive surface contacts with the semiconductor regions of the first and second conductivity types, and
wherein on the surface of the semiconductor layer,
the semiconductor region of the first conductivity type has at least one first-directed strip portion that runs along a first axis and also has at least one second-directed strip portion that runs along a second axis that is not parallel to the first axis, and
the width of the semiconductor region of the first conductivity type as measured along the first axis is greater than that of the conductive surface as measured along the first axis, and
the width of the semiconductor region of the first conductivity type as measured along the second axis is greater than that of the conductive surface as measured along the second axis, and
wherein the periphery of the conductive surface crosses not only the at least one first-directed strip portion but also the at least one second-directed strip portion.

* * * * *